US011895789B2

(12) United States Patent
Cho et al.

(10) Patent No.: US 11,895,789 B2
(45) Date of Patent: Feb. 6, 2024

(54) ELECTRONIC DEVICE INCLUDING FLEXIBLE DISPLAY

(71) Applicant: Samsung Electronics Co., Ltd., Suwon-si (KR)

(72) Inventors: Joongyeon Cho, Suwon-si (KR); Youngmin Kang, Suwon-si (KR); Moonchul Shin, Suwon-si (KR); Yeonggyu Yoon, Suwon-si (KR); Seungjoon Lee, Suwon-si (KR); Junyoung Choi, Suwon-si (KR); Byounguk Yoon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 198 days.

(21) Appl. No.: 17/527,554

(22) Filed: Nov. 16, 2021

(65) Prior Publication Data

US 2022/0151092 A1  May 12, 2022

Related U.S. Application Data

(63) Continuation of application No. PCT/KR2021/016034, filed on Nov. 5, 2021.

(30) Foreign Application Priority Data

Nov. 6, 2020  (KR) .................. 10-2020-0147658
Dec. 23, 2020  (KR) .................. 10-2020-0181730

(51) Int. Cl.
*H05K 5/00*  (2006.01)
*H05K 5/02*  (2006.01)

(52) U.S. Cl.
CPC ......... *H05K 5/0217* (2013.01); *H05K 5/0017* (2013.01)

(58) Field of Classification Search
CPC ..................... H05K 5/0217; H05K 5/0017
(Continued)

(56) References Cited

U.S. PATENT DOCUMENTS 9,870,029 B2   1/2018  Kim et al.
10,126,778 B2  11/2018  Yang
(Continued)

FOREIGN PATENT DOCUMENTS

KR  10-1570869 B1  11/2015
KR  10-1649097 B1   8/2016
(Continued)

OTHER PUBLICATIONS

International Search Report and Written Opinion dated Feb. 10, 2022, issued in International Patent Application No. PCT/KR2021/016034.
(Continued)

*Primary Examiner* — Hung S. Bui
(74) *Attorney, Agent, or Firm* — Jefferson IP Law, LLP

(57) ABSTRACT

An electronic device is provided. The electronic device includes a housing, a flexible display configured to be at least partially drawn out of an internal space of the housing, and a rotation module configured to move the flexible display, wherein the rotation module may include a shaft including one end and another end each coupled to a support member included in the electronic device, a cylindrical housing drivingly connected to the flexible display and configured to be capable of performing a rotational motion about the shaft, a pair of cylindrical cams penetrated by the shaft and accommodated in the cylindrical housing, wherein the pair of cylindrical cams are configured to be capable of performing a linear motion on the shaft and positioned to be (Continued)

symmetrical to each other with respect to a center of the shaft, and a pair of guide pins coupled to the cylindrical housing.

23 Claims, 28 Drawing Sheets

(58) Field of Classification Search
USPC .......................................................... 361/807
See application file for complete search history.

(56) References Cited

U.S. PATENT DOCUMENTS

| | | | |
|---|---|---|---|
| 10,420,227 B2* | 9/2019 | Lee | H05K 5/0221 |
| 10,748,456 B2 | 8/2020 | Pyo et al. | |
| 11,116,085 B2* | 9/2021 | Gao | H05K 5/0017 |
| 2009/0237872 A1 | 9/2009 | Bemelmans | |
| 2016/0187929 A1 | 6/2016 | Kim et al. | |
| 2016/0205791 A1* | 7/2016 | Kim | H05K 5/02 361/679.01 |
| 2019/0198783 A1* | 6/2019 | Kim | H10K 59/12 |
| 2020/0029451 A1 | 1/2020 | Ran | |

FOREIGN PATENT DOCUMENTS

| | | |
|---|---|---|
| KR | 10-2016-0141255 A | 12/2016 |
| KR | 10-2017-0080017 A | 7/2017 |
| KR | 10-2017-0136951 A | 12/2017 |
| KR | 10-1888800 B1 | 8/2018 |
| KR | 10-2020-0013549 A | 2/2020 |
| KR | 10-2020-0047363 A | 5/2020 |
| KR | 10-2021-0062336 A | 5/2021 |

OTHER PUBLICATIONS

European Search Report dated Dec. 20, 2023, issued in European Application No. 21889615.7.

* cited by examiner

ELECTRONIC DEVICE INCLUDING FLEXIBLE DISPLAY

CROSS-REFERENCE TO RELATED APPLICATION(S)

This application is a continuation application, claiming priority under § 365(c), of an International application No. PCT/KR2021/016034, filed on Nov. 5, 2021, which is based on and claims the benefit of a Korean patent application number 10-2020-0147658, filed on Nov. 6, 2020, in the Korean Intellectual Property Office, and of a Korean patent application number 10-2020-0181730, filed on Dec. 23, 2020, in the Korean Intellectual Property Office, the disclosure of each of which is incorporated by reference herein in its entirety.

TECHNICAL FIELD

The disclosure relates to an electronic device including a flexible display.

BACKGROUND ART

An electronic device including a flexible display may be implemented to be able to expand a screen while having portability.

The above information is presented as background information only to assist with an understanding of the disclosure. No determination has been made, and no assertion is made, as to whether any of the above might be applicable as prior art with regard to the disclosure.

DISCLOSURE OF INVENTION

Technical Problem

At least a portion of a flexible display may be disposed in an internal space of an electronic device in a bent or rolled state. When at least a portion of the flexible display is drawn out of the internal space of the electronic device, a screen may be expanded. A driving device for smoothly drawing at least a portion of the flexible display, which is disposed in the internal space of the electronic device in a bent or rolled state, out of the electronic device may be required.

Aspects of the disclosure are to address at least the above-mentioned problems and/or disadvantages and to provide at least the advantages described below. Accordingly, an aspect of the disclosure is to provide an electronic device including a flexible display and a driving device that supports the movement of the flexible display.

The technical problems to be addressed by this disclosure are not limited to those described above, and other technical problems, which are not described above, may be clearly understood by a person ordinarily skilled in the related art to which this disclosure belongs.

Additional aspects will be set forth in part in the description which follows and, in part, will be apparent from the description, or may be learned by practice of the presented embodiments.

Solution to Problem

In accordance with an aspect of the disclosure, an electronic device is provided. The electronic device includes a housing, a flexible display configured to be at least partially drawn out of an internal space of the housing, and a rotation module configured to move the flexible display, wherein the rotation module may include a shaft including one end and another end each coupled to a support member included in the electronic device, a cylindrical housing drivingly connected to the flexible display and configured to be capable of performing a rotational motion about the shaft, a pair of cylindrical cams penetrated by the shaft and accommodated in the cylindrical housing, wherein the pair of cylindrical cams are configured to be capable of performing a linear motion on the shaft and positioned to be symmetrical to each other with respect to a center of the shaft, a pair of guide pins coupled to the cylindrical housing and configured to correspond to a pair of guide grooves, respectively, which are provided in cylindrical surfaces of the pair of cylindrical cams, respectively, wherein the pair of guide grooves are symmetrical to each other with respect to the center of the shaft, and a pair of springs accommodated in the cylindrical housing and configured to elastically support the pair of cylindrical cams, respectively, wherein the pair of springs are symmetrical to each other with respect to the center of the shaft.

Advantageous Effects of Invention

In accordance with another aspect of the disclosure, an electronic device including a flexible display is provided. The electronic device includes a rotation module that supports the movement of the flexible display without an electric driving device such as a motor so that it is possible to improve space efficiency and to contribute to the simplification of a screen expansion structure. The rotation module is not limited to moving the flexible display and is capable of controlling the moving speed of the same so that reliability or competitiveness of an electronic device including an expandable screen can be secured.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

MODE FOR THE INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
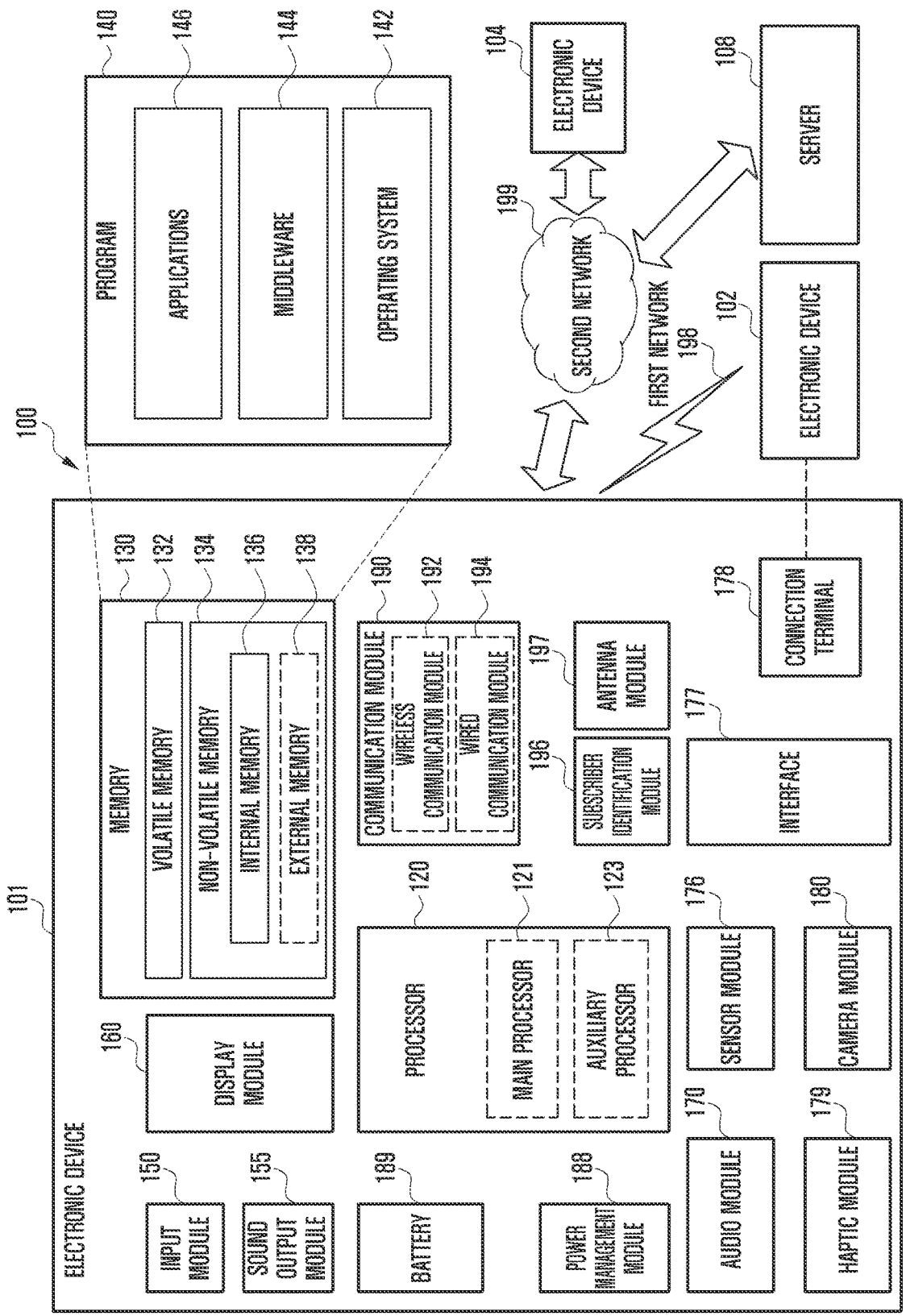
FIG. 1 is a block diagram of an electronic device in a network environment according to an embodiment of the disclosure.

FIG. 1 is a block diagram of an electronic device in a network environment according to an embodiment of the disclosure.

Referring to FIG. 1, an electronic device 101 in a network environment 100 may communicate with an electronic device 102 via a first network 198 (e.g., a short-range wireless communication network), or at least one of an electronic device 104 or a server 108 via a second network 199 (e.g., a long-range wireless communication network). The electronic device 101 may communicate with the electronic device 104 via the server 108. The electronic device 101 includes a processor 120, memory 130, an input module 150, a sound output module 155, a display module 160, an audio module 170, a sensor module 176, an interface 177, a connection terminal 178, a haptic module 179, a camera module 180, a power management module 188, a battery 189, a communication module 190, a subscriber identity module (SIM) 196, and/or an antenna module 197. In some embodiments of the disclosure, at least one (e.g., the connection terminal 178) of the components may be omitted from the electronic device 101, or one or more other components may be added in the electronic device 101. In some embodiments of the disclosure, some of the components may be implemented as single integrated circuitry. For example, the sensor module 176 (e.g., the sensor module 176, the camera module 180, or the antenna module 197) may be implemented as embedded in single component (e.g., the display module 160).

The processor 120 may execute, for example, software (e.g., a program 140) to control at least one other component (e.g., a hardware or software component) of the electronic device 101 coupled with the processor 120, and may perform various data processing or computation. As at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. The processor 120 may include a main processor 121 (e.g., a central processing unit (CPU) or an application processor (AP)), and an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). The auxiliary processor 123 (e.g., an ISP or a CP) may be implemented as part of another component (e.g., the camera module 180 or the communication module 190) functionally related to the auxiliary processor 123. According to an embodiment of the disclosure, an auxiliary processor 123 (e.g., a neural network processing device) may include a hardware structure specialized for processing an artificial intelligence model. The artificial intelligence model may be created through machine learning. Such learning may be performed, for example, in the electronic device 101 itself on which artificial intelligence model is executed, or may be performed through a separate server (e.g., the server 108). The learning algorithm may include, for example, supervised learning, unsupervised learning, semi-supervised learning, or reinforcement learning, but is not limited thereto. The artificial intelligence model may include a plurality of artificial neural network layers. An artificial neural network may be any of a deep neural network (DNN), a convolutional neural network (CNN), a recurrent neural network (RNN), a restricted Boltzmann machine (RBM), a deep belief network (DBN), a bidirectional recurrent deep neural network (BRDNN), a deep Q-networks, or a combination of two or more of the above-mentioned networks, but is not limited to the above-mentioned examples. In addition to the hardware structure, the artificial intelligence model may additionally or alternatively include a software structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, and/or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record, and the receiver may be used for incoming calls. The receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. The display module 160 may include touch circuitry (e.g., a touch sensor) adapted to detect a touch, or sensor circuitry (e.g., a pressure sensor) adapted to measure the intensity of force incurred by the touch.

The audio module 170 may convert a sound into an electrical signal and vice versa. The audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. The interface 177 may include, for example, a high-definition multimedia interface (HDMI), a universal serial bus (USB) interface, a secure digital (SD) card interface, and/or an audio interface.

The connection terminal 178 may include a connector via which the electronic device 101 may be physically connected with the external electronic device (e.g., the electronic device 102). The connection terminal 178 may include, for example, an HDMI connector, a USB connector, an SD card connector, and/or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. The haptic module 179 may include, for example, a motor, a piezoelectric element, or an electric stimulator.

The camera module 180 may capture an image or moving images. The camera module 180 may include one or more lenses, image sensors, image signal processors, or flashes.

The power management module 188 may manage power supplied to or consumed by the electronic device 101. The power management module 188 may be implemented as at least part of, for example, a power management integrated circuit (PMIC).

The battery 189 may supply power to at least one component of the electronic device 101. The battery 189 may include, for example, a primary cell which is not rechargeable, a secondary cell which is rechargeable, and/or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the AP) and supports a direct (e.g., wired) communication or a wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as BLUETOOTH, wireless-fidelity (Wi-Fi) direct, or a standard of the Infrared Data Association (IrDA)) or the second network 199 (e.g., a long-range communication network, such as a legacy cellular network, 5th generation network, a next generation network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a 4G network and a next-generation communication technology, such as a new radio access technology. An NR access technology may support high-speed transmission of high-capacity data (i.e., an enhanced mobile broadband (eMBB)), minimization of terminal power and connection of multiple terminals (massive machine type communications (mMTC)), or high reliability and low latency (ultra-reliable and low-latency communications (URLLC)). The wireless communication module 192 may support a high-frequency band (e.g., a mmWave band) in order to achieve, for example, a high data transmission rate. The wireless communication module 192 may support various technologies for securing performance in a high-frequency band, such as beamforming, massive multiple-input and multiple-output (MIMO), and full-dimensional multiple-input and multiple-output (FD-MIMO), an array antenna, analog beam-forming, or a large-scale antenna. The wireless communication module 192 may support various requirements specified in the electronic device 101, an external electronic device (e.g., the electronic device 104), or a network system (e.g., the second network 199). According to an embodiment of the disclosure, the wireless communication module 192 may support a peak data rate for realizing eMBB (e.g., 20 Gbps or more), loss coverage for realizing mMTC (e.g., 164 dB or less), or U-plane latency for realizing URLLC (e.g., 0.5 ms or less for each of downlink (DL) and uplink (UL) or 1 ms or less for round trip).

The antenna module 197 may transmit or receive a signal or power to or from the outside (e.g., the external electronic device) of the electronic device 101. The antenna module 197 may include an antenna including a radiating element including a conductive material or a conductive pattern formed in or on a substrate (e.g., a PCB). The antenna module 197 may include a plurality of antennas (e.g., an antenna array). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. Another component (e.g., a radio frequency integrated circuit (RFIC)) other than the radiating element may be additionally formed as part of the antenna module 197.

According to various embodiments of the disclosure, the antenna module 197 may form a mmWave antenna module. According to an embodiment of the disclosure, the mmWave antenna module may include a printed circuit board, an RFIC that is disposed on or adjacent to a first surface (e.g., the bottom surface) of the printed circuit board and is capable of supporting a predetermined high-frequency band (e.g., a mmWave band), and a plurality of antennas (e.g., array antennas) that is disposed on or adjacent to a second surface (e.g., the top surface or the side surface) of the printed circuit board and is capable of transmitting or receiving a signal of the predetermined high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

Commands or data may be transmitted or received between the electronic device 101 and the external electronic device 104 via the server 108 coupled with the second network 199. Each of the electronic devices 102 and 104 may be a device of a same type as, or a different type, from the electronic device 101. All or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, a mobile edge computing (MEC), or client-server computing technology may be used, for example. The electronic device 101 may provide an ultra-low delay service using, for example, distributed computing or mobile edge computing. In another embodiment of the disclosure, the external electronic device 104 may include an Internet of things (IoT) device. The server 108 may be an intelligent server using machine learning and/or neural networks. According to an embodiment of the disclosure, the external electronic device 104 or the server 108 may be included in the second network 199. The electronic device 101 may be applied to an intelligent service (e.g., smart home, smart city, smart car, or healthcare) based on a 5G communication technology and an IoT-related technology.

An electronic device according to an embodiment of the disclosure may be one of various types of electronic devices. The electronic device may include a portable communication device (e.g., a smart phone), a computer device, a portable multimedia device, a portable medical device, a camera, a wearable device, or a home appliance. However, the electronic device is not limited to any of those described above.

Various embodiments of the disclosure and the terms used herein are not intended to limit the technological features set forth herein to particular embodiments and include various changes, equivalents, or replacements for a corresponding embodiment.

With regard to the description of the drawings, similar reference numerals may be used to refer to similar or related elements.

As used herein, each of such phrases as "A or B," "at least one of A and B," "at least one of A or B," "A, B, or C," "at least one of A, B, and C," and "at least one of A, B, or C,"

may include any one of, or all possible combinations of the items enumerated together in a corresponding one of the phrases.

As used herein, such terms as "1st" and "2nd," or "first" and "second" may be used to simply distinguish a corresponding component from another, and does not limit the components in other aspect (e.g., importance or order). If an element (e.g., a first element) is referred to, with or without the term "operatively" or "communicatively," as "coupled with," "coupled to," "connected with," or "connected to" another element (e.g., a second element), it means that the element may be coupled with the other element directly (e.g., wiredly), wirelessly, or via a third element.

The term "module" may include a unit implemented in hardware, software, or firmware, and may interchangeably be used with other terms, for example, "logic," "logic block," "part," or "circuitry." A module may be a single integral component, or a minimum unit or part thereof, adapted to perform one or more functions. For example, according to an embodiment of the disclosure, the module may be implemented in a form of an application-specific integrated circuit (ASIC).

Various embodiments as set forth herein may be implemented as software (e.g., the program 140) including one or more instructions that are stored in a storage medium (e.g., an internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to an embodiment of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PLAYSTORE™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In such a case, the integrated component may perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Figure 2:
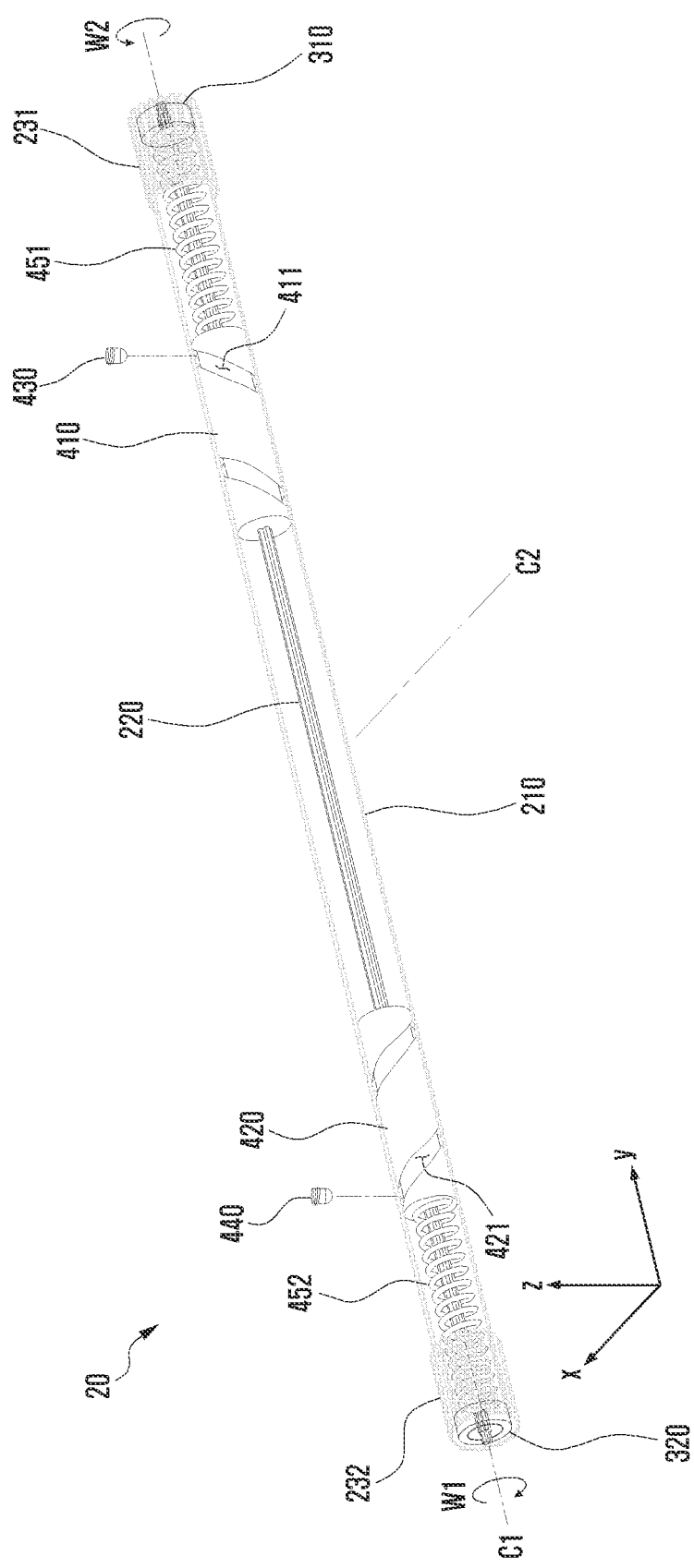
FIG. 2 is view illustrating a rotation module according to an embodiment of the disclosure.

FIG. 2 illustrates a rotation module according to an embodiment of the disclosure.

Figure 3:
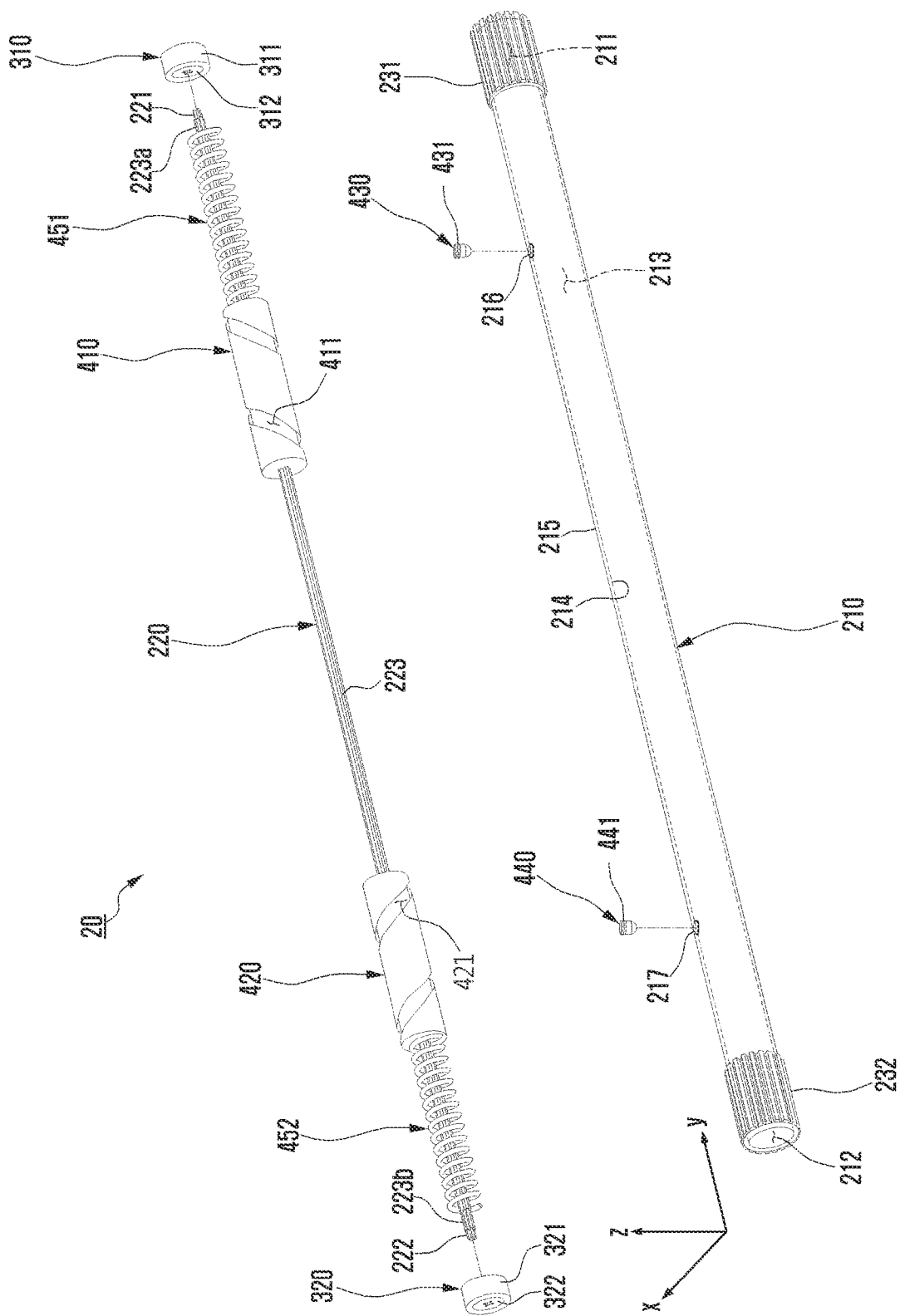
FIGS. 3 and 4 are exploded views of a rotation module according to various embodiments of the disclosure.
Figure 4:
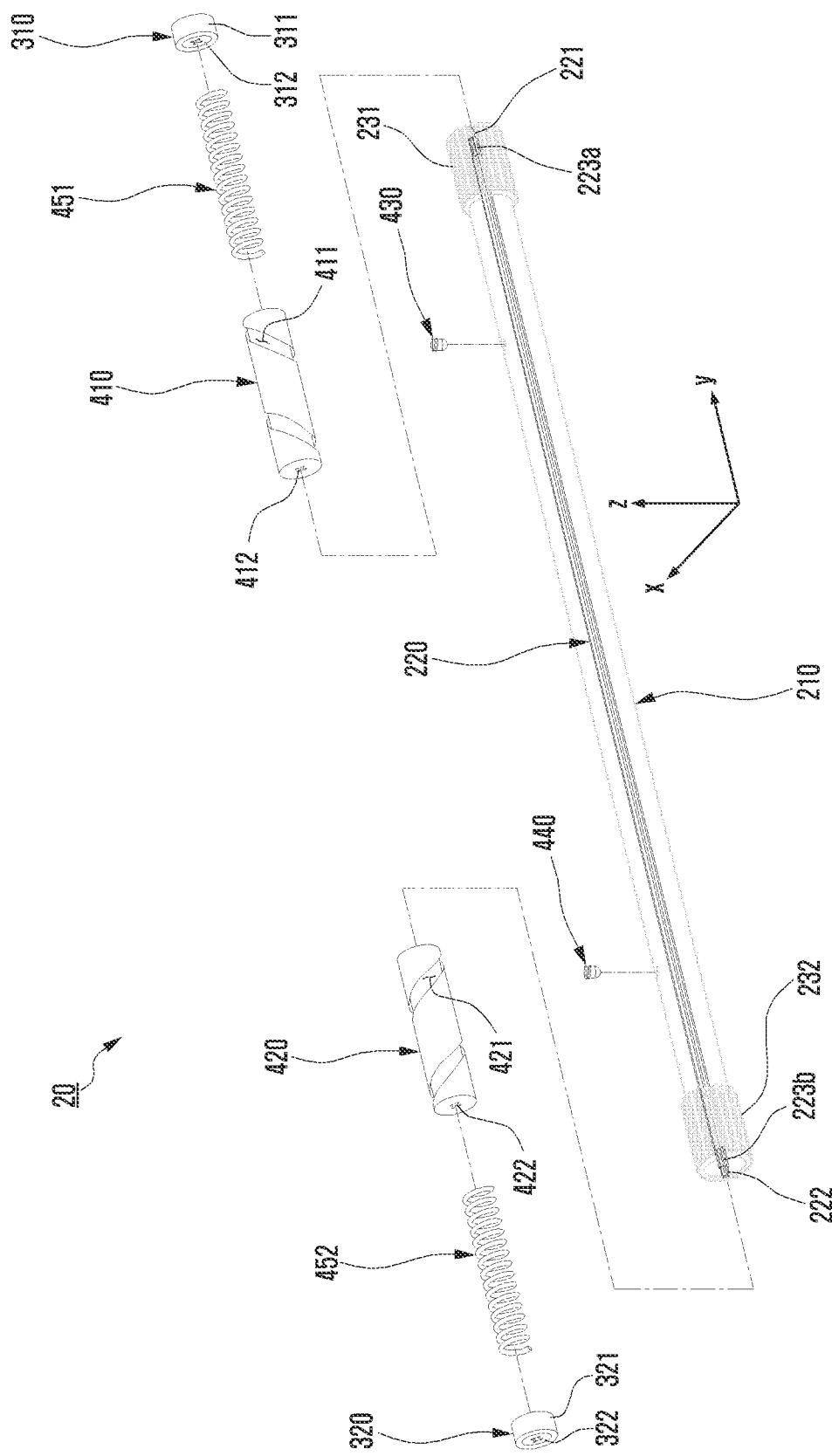

FIGS. 3 and 4 are exploded perspective views of a rotation module according to various embodiments of the disclosure.

Referring to FIGS. 2, 3, and 4, in an embodiment, a rotation module 20 may include a cylindrical housing 210, a shaft 220, a first bearing 310, a second bearing 320, a first cylindrical cam 410, a second cylindrical cam 420, a first guide pin 430, a second guide pin 440, a first spring 451, and/or a second spring 452. According to an embodiment, an electronic device (e.g., the electronic device 101 in FIG. 1) including a flexible display (e.g., the flexible display 1130 in FIG. 11 or the flexible display 2130 in FIG. 21A) may include a rotation module 20, and the rotation module 20 may support the movement of the flexible display.

According to an embodiment, the cylindrical housing 210 is a housing structure including a cylindrical inner surface 214 and a cylindrical outer surface 215, and may include, for example, a hollow 213 extending from a first opening 211 on one side to a second opening 212 on the other side. In various embodiments, the cylindrical housing 210 may be referred to by various other terms, such as a hollow cylinder or a cylindrical shell.

According to an embodiment, the shaft 220 may be positioned along a first center line C1 of the cylindrical housing 210 through the hollow 213 of the cylindrical housing 210. The shaft 220 may be a rotational axis for the rotational motion (or rolling motion) of the cylindrical housing 210. One end 221 and the other end 222 of the shaft 220 may protrude out of the hollow 213 of the cylindrical housing 210. For example, the one end 221 may protrude through the first opening 211, and the other end 222 may protrude through the second opening 212. The one end 221 and the other end 222 of the shaft 220 may be coupled to supports (e.g., the support structures 500 in FIG. 5) of the electronic device 101 when the rotation module 20 is disposed in the electronic device (e.g., the electronic device 101 in FIG. 1).

According to an embodiment, the first bearing 310 and the second bearing 320 may be positioned between the cylindrical housing 210 and the shaft 220. The first bearing 310 and the second bearing 320 may be disposed to be substantially symmetrical to each other with respect to a second center line C2. The second center line C2 may pass through the center of the shaft 220 in a direction perpendicular to the first center line C1, and may be a line serving as a reference line for symmetry of the rotation module 20. The first bearing 310 may be positioned proximate to the first opening 211 in the hollow 213 of the cylindrical housing 210. The second bearing 320 may be positioned proximate to the second opening 212 in the hollow 213 of the cylindrical housing 210. The first bearing 310 and the second bearing 320 may be, for example, rolling bearings. The first bearing 310 may include an outer ring 311, an inner ring 312, rolling members (e.g., rolling elements) such as balls or rollers positioned between the outer ring 311 and the inner ring 312, and a retainer configured to hold the rolling members at regular intervals. The second bearing 320 may be substantially the same as the first bearing 310. The shaft 220 may include a sliding support 223 between the one end 221 and the other end 222. A portion 223a of the sliding support 223 adjacent to the one end 221 may be fitted into the inner ring 312 of the first bearing 310. A portion 223b of the sliding support 223 adjacent to the other end 222 may be fitted into the inner ring 322 of the second bearing 320. The outer ring 311 of the first bearing 310 may be fitted into the first opening 211 in the cylindrical housing 210. The outer ring 321 of the second bearing 320 may be fitted into the second opening 212 in the cylindrical housing 210. The first bearing 310 and the second bearing 320 are able to contribute to smooth rotation of the cylindrical housing 210 while fixing the shaft 220, which is a rotation axis for the rotational motion of the cylindrical housing 210, at a fixed position, and supporting the cylindrical housing 210 with respect to the shaft 220. According to various embodiments, the first bearing 201 and/or the second bearing 202 may be implemented as a sliding bearing. The first bearing 201 and/or the second bearing 202 may be implemented as various other types of radial bearings.

According to an embodiment, the first cylindrical cam 410 and the second cylindrical cam 420 may be penetrated by the sliding support 223 and positioned in the hollow 213 of the cylindrical housing 210. The first cylindrical cam 410 and the second cylindrical cam 420 may be capable of performing linear motion with respect to the sliding support 223 of the shaft 220. The first cylindrical cam 410 and the second cylindrical cam 420 may be disposed to be substantially symmetrical to each other with respect to the second center line C2. The first cylindrical cam 410 may include a first guide groove (e.g., a first cam groove) 411 provided on a cylindrical surface facing the cylindrical inner surface 214 of the cylindrical housing 210. The first guide groove 411 may helically extend along the cylindrical surface of the first cylindrical cam 410. The first cylindrical cam 410 may include a first shaft hole 412 penetrated by the sliding support 223 of the shaft 220. The second cylindrical cam 420 may include a second guide groove (e.g., a second cam groove) 421 provided on a cylindrical surface facing the cylindrical inner surface 214 of the cylindrical housing 210. The second guide groove 421 may helically extend along the cylindrical surface of the second cylindrical cam 420. The second cylindrical cam 420 may include a second shaft hole 422 penetrated by the sliding support 223 of the shaft 220.

According to an embodiment, the first guide pin 430 may be coupled to the cylindrical housing 210 to correspond to the first guide groove 411 in the first cylindrical cam 410. The first guide pin 430 may, for example, protrude from the cylindrical inner surface 214 of the cylindrical housing 210 and be inserted into the first guide groove 411. The first guide pin 430 may be disposed in the cylindrical housing 210 in a bolted manner. The first guide pin 430 may include, for example, a fastening portion 431 including a screw capable of being coupled to the first fastening hole 216 provided in the cylindrical housing 210.

According to an embodiment, the second guide pin 440 may be coupled to the cylindrical housing 210 to correspond to the second guide groove 421 in the second cylindrical cam 420. The second guide pin 440 may, for example, protrude from the cylindrical inner surface 214 of the cylindrical housing 210 and be inserted into the second guide groove 421. The second guide pin 440 may be disposed in the cylindrical housing 210 in a bolted manner. The second guide pin 440 may include, for example, a fastening portion 441 including a screw capable of being coupled to the second fastening hole 217 provided in the cylindrical housing 210. The first guide pin 430 and the second guide pin 440 may be disposed to be substantially symmetrical to each other with respect to the second center line C2.

Due to the interaction between the first guide pin 430 and the first guide groove 411 and the interaction between the second guide pin 440 and the second guide groove 421, the rotational motion about the first center line C1 of the cylindrical housing 210 may be converted into the linear motion of the first cylindrical cam 410 and the linear motion of the second cylindrical cam 420, or the linear motion of the first cylindrical cam 410 and the linear motion of the second cylindrical cam 420 may be converted into the rotational motion of the cylindrical housing 210.

According to various embodiments, the first guide pin 430 and/or the second guide pin 440 may be coupled to the cylindrical housing 210 in various other ways, such as welding, without being limited to the bolted manner.

According to an embodiment, the first spring 451 may be located between the first bearing 310 and the first cylindrical cam 410 in the hollow 213 of the cylindrical housing 210. The first spring 451 may elastically support the first cylindrical cam 410 between the first bearing 310 and the first cylindrical cam 410. The second spring 452 may be located between the second bearing 320 and the second cylindrical cam 420 in the hollow 213 of the cylindrical housing 210. The second spring 452 may elastically support the second cylindrical cam 420 between the second bearing 320 and the second cylindrical cam 420. According to various embodiments (not illustrated), between the first spring 451 and the first bearing 310 and between the second spring 452 and the second bearing 320, support plates made of a non-metal material (e.g., a polymer) or a metal may be positioned.

Figure 5:
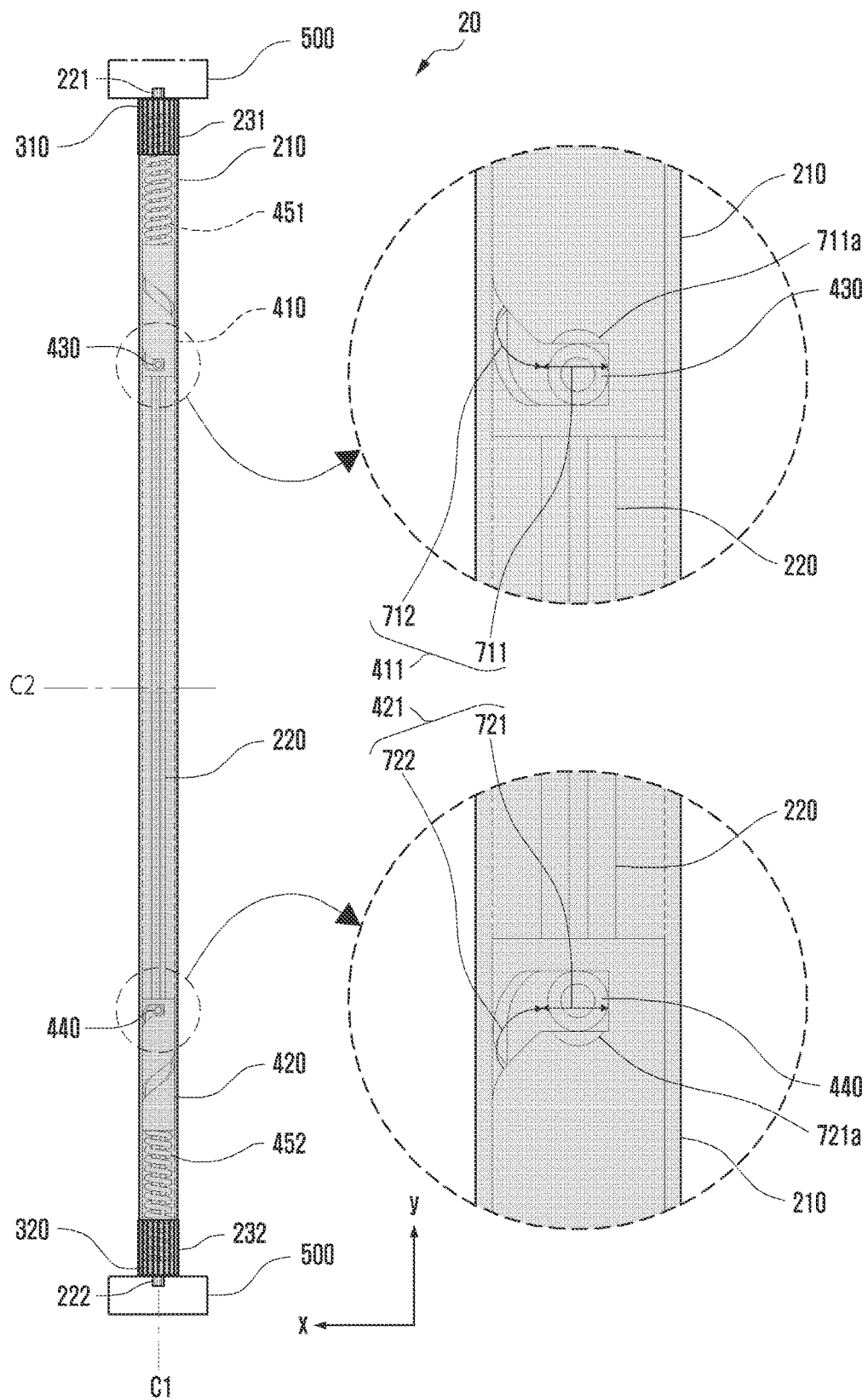
FIG. 5 is view illustrating a first state of a rotation module according to an embodiment of the disclosure.

FIG. 5 illustrates a first state of a rotation module according to an embodiment of the disclosure.

Referring to FIGS. 2 and 5, a first state of a rotation module 20 may refer to, for example, a state in which a distance between a first bearing 310 and a first cylindrical cam 410 and a distance between a second bearing 320 and a second cylindrical cam 420 are maximally narrowed so as not be further narrowed. The first state of the rotation module 20 may refer to, for example, the state in which the first spring 451 and the second spring 452 are maximally compressed and are not further compressed.

According to an embodiment, the one end 221 and the other end 222 of the shaft 220 may be immovably fixed to the support structure 500 positioned in the electronic device (e.g., the electronic device of FIG. 1) including a flexible display. The cylindrical housing 210 may be drivingly connected to the flexible display. When the flexible display is moved by an external force, the cylindrical housing 210, which is drivingly connected with the flexible display, may perform a rotational motion in the first circumferential direction indicated by reference numeral "W1" (see FIG. 2) about the shaft 220. The first guide pin 430 and the second guide pin 440 coupled to the cylindrical housing 210 may move in the first circumferential direction W1. Due to the interaction between the first guide pin 430 and the first guide groove 411 and the interaction between the second guide pin 440 and the second guide groove 421, the first cylindrical cam 410 may perform a linear motion toward the first bearing 310 (e.g., in the +y-axis direction), and the second cylindrical cam 420 may perform a linear motion toward the second bearing 320 (e.g., in the −y-axis direction). Since the distance between the first cylindrical cam 410 and the first bearing 310 is reduced, the first spring 451 may be maximally compressed so as not be further compressed. Since the distance between the second cylindrical cam 420 and the second bearing 320 is reduced, the second spring 452 may be maximally compressed so as not be further compressed.

Figure 6:
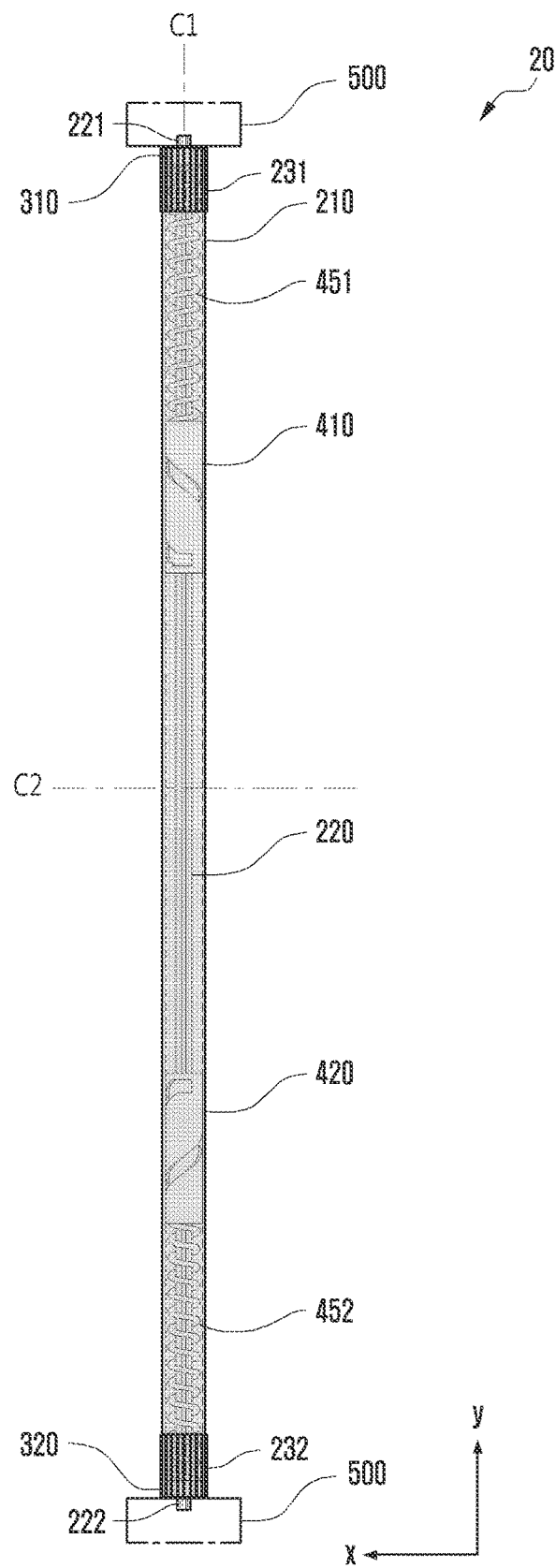
FIG. 6 is view illustrating a second state of a rotation module according to an embodiment of the disclosure.

FIG. 6 illustrates a second state of a rotation module according to an embodiment of the disclosure.

Referring to FIGS. 2 and 6, a first state of the rotation module 20 may refer to, for example, a state in which a distance between a first bearing 310 and a first cylindrical cam 410 and a distance between a second bearing 320 and a second cylindrical cam 420 are maximized not to be further increased. In the second state of the rotation module 20, the first spring 451 and the second spring 452 may be in a less compressed state than in the first state of FIG. 5 or in a substantially uncompressed state. According to an embodiment, due to a first restoring force of the first spring 451 to restore from the compressed state to the non-compressed state and a second restoring force of the second spring 452 to restore from the compressed state to the non-compressed state, the rotation module 20 may be switched from the first state to the second state. The first cylindrical cam 410 may perform a linear motion toward the second bearing 320 (e.g., in the −y-axis direction) by the first restoring force by the first spring 451. The second cylindrical cam 420 may perform a linear motion toward the first bearing 310 (e.g., in the +y-axis direction) by the second restoring force by the second spring 452. The linear motion of the first cylindrical cam 410 may be converted into the rotational motion of the cylindrical housing 210 due to the interaction between the first guide pin 430 and the first guide groove 411. The linear motion of the second cylindrical cam 420 may be converted into the rotational motion of the cylindrical housing 210 due to the interaction between the second guide pin 440 and the second guide groove 421. When the rotation module 20 is switched from the first state of FIG. 5 to the second state of FIG. 6, the cylindrical housing 210 may perform a rotational motion in a second circumferential direction W2 (FIG. 2) opposite to the first circumferential direction W1.

According to an embodiment, the first state of FIG. 5 may correspond to a maximum draw-in state in which the flexible display drivingly connected to the rotation module 20 is not further drawn into the internal space of the electronic device (e.g., the electronic device 101 in FIG. 1). The second state of FIG. 6 may correspond to a maximum draw-out state in which the flexible display drivingly connected to the rotation module 20 is not further drawn out of the electronic device.

According to some embodiments, the first state of FIG. 5 may correspond to a maximum draw-out state in which the flexible display drivingly connected to the rotation module 20 is not further drawn out of the electronic device (e.g., the electronic device 101 in FIG. 1). The second state may correspond to a maximum draw-in state in which the flexible display drivingly connected to the rotation module 20 is not further drawn into the internal space of the electronic device.

According to an embodiment, when viewed in a direction in which the first center line C1 (see FIG. 2) extends (e.g., the y-axis direction), the first shaft hole 412 and the second shaft hole 422 may have a polygonal or oval shape are 1 It may be formed in a shape such as a polygonal shape or an oval shape, rather than a circle having a predetermined radius with reference to the first center line C1. The sliding support 223 may have a cross-sectional shape that can be fitted into the first shaft hole 412 and the second shaft hole 422. Due to this, when the rotation module 20 is switched between the first state of FIG. 5 and the second state of FIG. 6, the first cylindrical cam 410 and the second cylindrical cam 420 may perform a linear motion on the shaft 220 and may not perform a rotational motion about the shaft 220. In the case in which the first shaft hole 412 and the second shaft hole 422 have a circular shape having a predetermined radius with reference to the first center line C1 when viewed in the direction in which the first center line C1 extends, the first cylindrical cam 410 and the second cylindrical cam 420 are rotatable about the sliding support 223, and may thus difficult to linearly move to a position corresponding to the first state of FIG. 5 or the second state of FIG. 6.

According to an embodiment, the first guide pin 430 may include a curved surface (e.g., a hemispherical surface) for smooth friction with the first guide groove 411 in the first cylindrical cam 410. The second guide pin 440 may include a curved surface (e.g., a hemispherical surface) for smooth friction with the second guide groove 421 in the second cylindrical cam 420.

According to an embodiment, the rotation module 20 may include a first circular gear or round gear 231 and a second circular gear 232 positioned on the cylindrical outer surface 215 of the cylindrical housing 210. The first circular gear 231 and the second circular gear 232 may include gear teeth disposed along the circumference of the cylindrical outer surface 215. The first circular gear 231 and the second circular gear 232 may be integrated with the cylindrical housing 210 and may include the same material as the cylindrical housing 210. As another example, the first circular gear 231 and the second circular gear 232 may be provided separately from the cylindrical housing 210 to be coupled to the cylindrical housing 210. The first circular gear 231 and the second circular gear 232 may be disposed to be substantially symmetrical to each other with respect to the second center line C2. According to an embodiment, the first circular gear 231 may be positioned on the cylindrical outer surface 215 to correspond to the first opening 211 of the cylindrical housing 210 or the first bearing 310, and the second circular gear 232 may be positioned on the cylindrical outer surface 215 to correspond to the second opening 212 of the cylindrical housing 210 or the second bearing 320. The first circular gear 231 and the second circular gear 232 may contribute to a driving connection with the flexible display included in the electronic device (e.g., the electronic device 101 in FIG. 1). For example, the electronic device may include a gear structure for the flexible display, and the gear structure may be in the state of being engaged state with the first circular gear 231 and the second circular gear 232. The state in which the first circular gear 231 and the second circular gear 232 are engaged with the gear structure may reduce transmission loss between the movement of the flexible display and the rotational motion of the cylindrical housing 210. In various embodiments, the circular gears of the rotation module 20 are not limited to the illustrated embodiment, and may be implemented in various other forms depending on the gear structure that is in the state of drivingly connected with the cylindrical housing 210 of the rotation module 20. According to some embodiments, the cylindrical housing 210 may be drivingly connected to the flexible display without the first circular gear 231 and the second circular gear 232.

According to an embodiment, the cylindrical housing 210, the shaft 220, the first bearing 310, the second bearing 320, the first cylindrical cam 410, the second cylindrical cam 420, the first guide pin 430, the second guide pin 440, the first circular gear 231, and the second circular gear 232 may be made of a rigid or durable material (e.g., a metal or an engineering plastic) that is not substantially deformed against a force acting during the switching between the first state of FIG. 5 and the second state of FIG. 6. Due to this, when a motion or force is transmitted between the components of the rotation module 20 during the switching between the first state of FIG. 5 and the second state of FIG. 6, the loss of motion or force transmission can be reduced.

According to an embodiment, a lubricant (e.g., grease) may be disposed in the rotation module 20 in order to reduce the loss of motion transmission or loss of force transmission. For example, the lubricant is able to contribute to smooth movement and durability by being interposed in the rubbing portions of two elements that move while rubbing against each other, such as the shaft 220 and the first cylindrical cam 410, the shaft 220 and the second cylindrical cam 420, the first guide pin 430 and the first cylindrical cam 410, the second guide pin 440 and the second cylindrical cam 420, the elements included in the first bearing 310, and/or the elements included in the second bearing 320. According to some embodiments, two elements that move while rubbing against each other may be coated with a lubricant so as to reduce friction.

Figure 7:
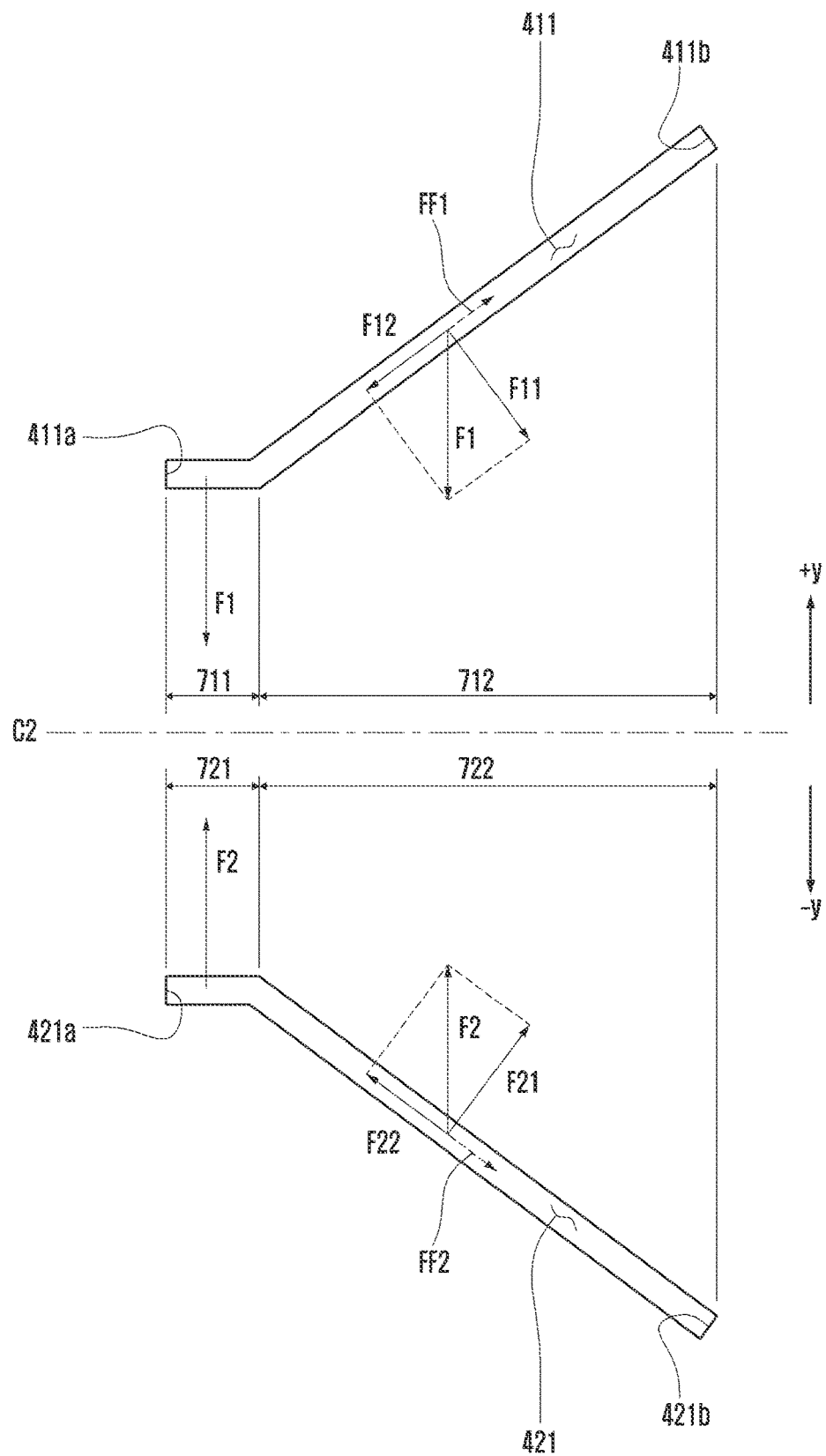
FIG. 7 is a development view in which a first guide groove and a second guide groove are spread out and illustrated in a plane according to an embodiment of the disclosure.

FIG. 7 is a development view in which a first guide groove and a second guide groove are spread out and illustrated in a plane according to an embodiment of the disclosure.

Referring to FIGS. 5 and 7, a first guide groove 411 may extend from a first groove end 411a to a second groove end 411b along the cylindrical surface of the first cylindrical cam 410. The second groove end 411b may be positioned closer to the first bearing 310 than the first groove end 411a. In an embodiment, the first guide groove 411 may include a first section 711 and a second section 712. The first section 711 may extend from the first groove end 411a in the circumferential direction. The second section 712 may spirally extend from the first section 711 to the second groove end 411b. The second section 712 may form an obtuse angle with the first section 711 when viewed in the development view of FIG. 7. The second cylindrical cam 420 including the second guide groove 421 may be substantially symmetrical with the first cylindrical cam 410 including the first guide groove 411 with respect to the second center line C2. The second guide groove 421 may extend from the first groove end 421a to the second groove end 421b along the cylindrical surface of the second cylindrical cam 420, and may include a first section 721 and a second section 722. When the first guide pin 430 is positioned in the first section 711 of the first guide groove 411 and the second guide pin 440 is positioned in the first section 721 of the second guide groove 421, the first state of FIG. 5 may be maintained. Although the first restoring force F1 of the first spring 451 to restore to the non-compressed state compresses the first cylindrical cam 410 in the −y-axis direction, the first restoring force F1 may substantially act as a supporting force (or a vertical drag) between the first guide pin 430 and the first section 711 of the first guide groove 411. Although the second restoring force F2 of the second spring 452 to restore to the non-compressed state compresses the second cylindrical cam 420 in the +y-axis direction, the second restoring force F2 may substantially act as a supporting force (or a vertical drag) between the second guide pin 440 and the first section 721 of the second guide groove 421. According to various embodiments, the first section 711 of the first guide groove 411 may include a first recess 711a corresponding to the first guide pin 430, and the first section 721 of the second guide groove 421 may include the second recess 721a corresponding to the second guide pin 440, thereby contributing to maintaining the first state of FIG. 5.

According to an embodiment, when the cylindrical housing 210 is rotated about the shaft 220 by an external force, the first guide pin 430 may leave the first section 711 and enter the second section 712, and the second guide pin 440 may leave the first section 721 and enter the second section 722. In this case, the rotation module 20 may be switched from the first state in FIG. 5 to the second state in FIG. 6 due to the first restoring force F1 by the first spring 451 and the second restoring force F2 by the second spring 452. The first restoring force F1 by the first spring 451 may act as, for example, a supporting force F11 between the first guide pin 430 and the second section 712 and a force for sliding (hereinafter, a sliding force) F12 between the first guide pin 430 and the second section 712. The second restoring force F2 by the second spring 452 may act as, for example, a supporting force F21 between the second guide pin 440 and the second section 722 and a sliding force F22 between the second guide pin 440 and the second section 722. The sliding force F12 between the first guide pin 430 and the second section 712 is directed opposite to a frictional force FF1, in which the supporting force F11 between the first guide pin 430 and the second section 712 and the frictional coefficient between the first guide pin 430 and the second section 712 are considered, and may be greater than the frictional force FF1. The sliding force F22 between the second guide pin 440 and the second section 722 is directed opposite to a frictional force FF2, in which the supporting force F21 between the second guide pin 440 and the second section 722 and the frictional coefficient between the second guide pin 440 and the second section 722 are considered, and may be greater than the frictional force FF2. For this reason, the first cylindrical cam 410 and the second cylindrical cam 420 may perform linear motions in different directions, and the cylindrical housing 210 may perform a rotational motion in the second circumferential direction W2 (see FIG. 2). The first restoring force F1 and the second restoring force F2 may be reduced due to the characteristic of the spring during the switching from the first state of FIG. 5 to the second state of FIG. 6, but may have a magnitude capable of contributing the movement of the flexible display drivingly connected to the rotation module 20. Hereinafter, for better understanding of the embodiment of the disclosure, it can be said that the first restoring force F1 and the second restoring force F2 are maintained in a threshold range. During the switching from the first state of FIG. 5 to the second state of FIG. 6, the first restoring force F1 and the second restoring force F2 may have substantially the same magnitude and may act in opposite directions. This may contribute to a smooth rotational motion of the cylindrical housing 210 by balancing the force with reference to the second center line C2. According to various embodiments, various elastic members or elastic structures may be used in place of the first spring 451 and/or the second spring 452.

In the second state of FIG. 6, the first guide pin 430 may be positioned at the second groove end 411b of the first guide groove 411, and the second guide pin 440 may be positioned at the second groove end 421b of the second guide groove 421. When the rotation module 20 switches between the first state of FIG. 5 and the second state of FIG. 6, the rotation angle of the cylindrical housing 210 may be substantially determined by the first groove end 411a and the second groove end 411b of the first guide groove 411. When the rotation module 20 is drivingly connected to the flexible display included in the electronic device (e.g., the electronic device 101 of FIG. 1), the moving distance of the flexible display may correspond to the rotation angle of the cylindrical housing 210.

According to an embodiment, when viewed in the development view of FIG. 7, the second section 712 of the first guide groove 411 may extend straight in a direction forming an obtuse angle with the first section 711, and the second section 722 of the second guide groove 421 may extend in a direction forming an obtuse angle with the first section 721. In the case in which the rotation speed of the cylindrical housing 210 does not become zero at the completion of the second state when the rotation module 20 is switched from the first state of FIG. 5 to the second state of FIG. 6, a collision phenomenon may occur in which two relatively moving elements (e.g., the first guide pin 430 and the second groove end 411*b* of the first guide groove 411) strongly interact with each other for a relatively short time. The second state may be completed, for example, when the first guide pin 430 is positioned at the second groove end 411*b* of the first guide groove 411 and the second guide pin 440 is positioned at the second groove end 421*b* of the second guide groove 421. Due to such a collision phenomenon, it may be difficult to provide a user with a smooth sliding motion for the flexible display drivingly connected to the rotation module 20. The impact caused by such a collision phenomenon may damage the rotation module 20 or the driving connection state between the rotation module 20 and the flexible display. According to various embodiments, the second section 612 of the first guide groove 411 and the second section 722 of the second guide groove 421 may be implemented to control the rotation speed of the cylindrical housing 210 when switched from the first state of FIG. 5 to the second state of FIG. 6, which will be described with reference to FIG. 8.

Figure 8:
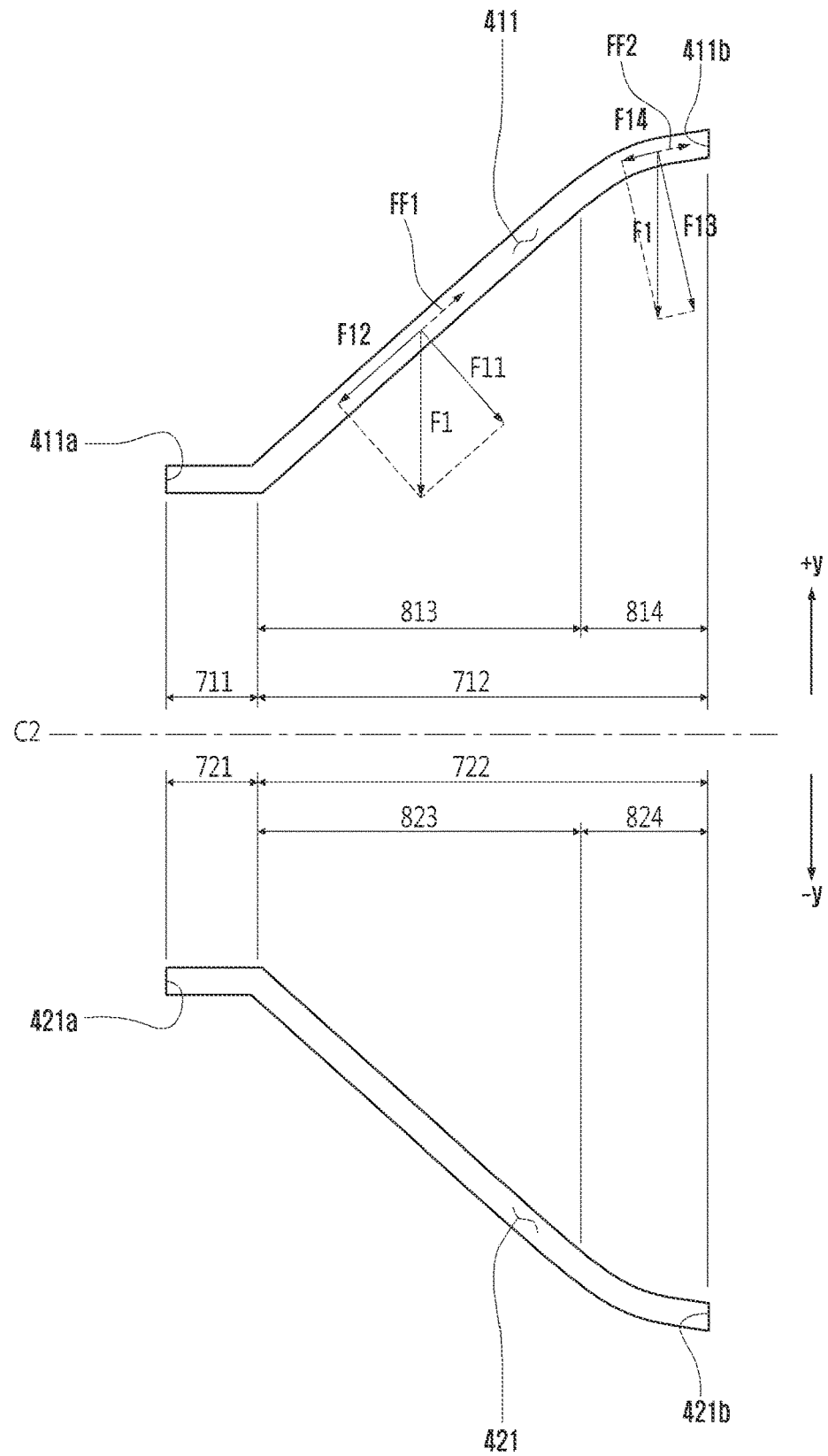
FIG. 8 is a development view in which a first guide groove and a second guide groove are spread out and illustrated in a plane according to an embodiment of the disclosure.

FIG. 8 is a development view in which a first guide groove and a second guide groove are spread out and illustrated in a plane according to an embodiment of the disclosure.

Referring to FIG. 8, a first guide groove 411 may include a first section 711 and a second section 712. According to an embodiment, the second section 712 may include a third section 813 and a fourth section 814. The third section 813 may be positioned between the first section 711 and the fourth section 814. The third section 813 may extend straight in a direction forming an obtuse angle with the first section 711 when viewed in the development view of FIG. 8. The fourth section 814 may have a curved shape having a slope that gradually decreases from the third section 813 toward the second groove end 411*b* when viewed in the development view of FIG. 8. When the first guide pin 430 is positioned in the third section 813, the first restoring force F1 by the first spring 451 may act as a first supporting force (or a first vertical drag force) F11 between the first guide pin 430 and the third section 813 and a first sliding force F12 between the first guide pin 430 and the third section 813. When the first guide pin 430 is positioned in the fourth section 814, the first restoring force F1 by the first spring 451 may act as a second supporting force (or a second vertical drag force) F13 between the first guide pin 430 and the fourth section 814 and a second sliding force F14 between the first guide pin 430 and the fourth section 814. The first sliding force F12 between the first guide pin 430 and the third section 813 is directed opposite to a first frictional force FF1, in which the first supporting force F11 between the first guide pin 430 and the third section 813 and the frictional coefficient between the first guide pin 430 and the third section 813 are considered, and may be greater than the first frictional force FF1. The second sliding force F14 between the first guide pin 430 and the fourth section 814 is directed opposite to a second frictional force FF2, in which the second supporting force F13 between the first guide pin 430 and the fourth section 814 and the frictional coefficient between the first guide pin 430 and the fourth section 814 are considered, and may be greater than the second frictional force FF2. The second sliding force F14 may be smaller than the first sliding force F12. The difference between the second sliding force F14 and the second frictional force FF2 for the fourth section 814 may be smaller than the difference between the first sliding force F12 and the first frictional force FF1 for the third section 813. As the first guide pin 430 approaches the second groove end 411*b* from the fourth section 814, the difference between the second sliding force F14 and the second frictional force FF2 may gradually decrease. The second guide groove 421 may be symmetrical with the first guide groove 411 with respect to the second center line C2 and may include, for example, a first section 721 and a second section 722 including a third section 823 and a fourth section 824. The sliding force between the second guide pin 440 and the second guide groove 421 may be generated in substantially the same manner as the sliding force between the first guide pin 430 and the first guide groove 411. When the rotation module 20 is switched from the first state of FIG. 5 to the second state of FIG. 6, the fourth section 814 of the first guide groove 411 and the fourth section 824 of the second guide groove 421 may gradually reduce the difference between the sliding force and the frictional force, whereby the rotational speed of the cylindrical housing 210 may gradually decrease and may become zero.

As in the embodiment of FIG. 8, the first section 711 and the third section 813 of the first guide groove 411, and the first section 721 and the third section 823 of the second guide groove 421 may not be seamlessly connected. In this case, while the rotation module 20 is switched from the first state of FIG. 5 to the second state of FIG. 6, the rotational speed of the cylindrical housing 210 may increase abruptly due to the first restoring force by the first spring 451 and the second restoring force by the second spring 452. This phenomenon may make it difficult for the flexible display connected to the rotation module 20 to slide smoothly. The impact caused by such a phenomenon may damage the rotation module 20 or the driving connection state between the rotation module 20 and the flexible display. In order to solve this problem, the first section 711 and the third section 813 of the first guide groove 411, and the first section 721 and the third section 823 of the second guide groove 421 may be seamlessly connected.

Figure 9:
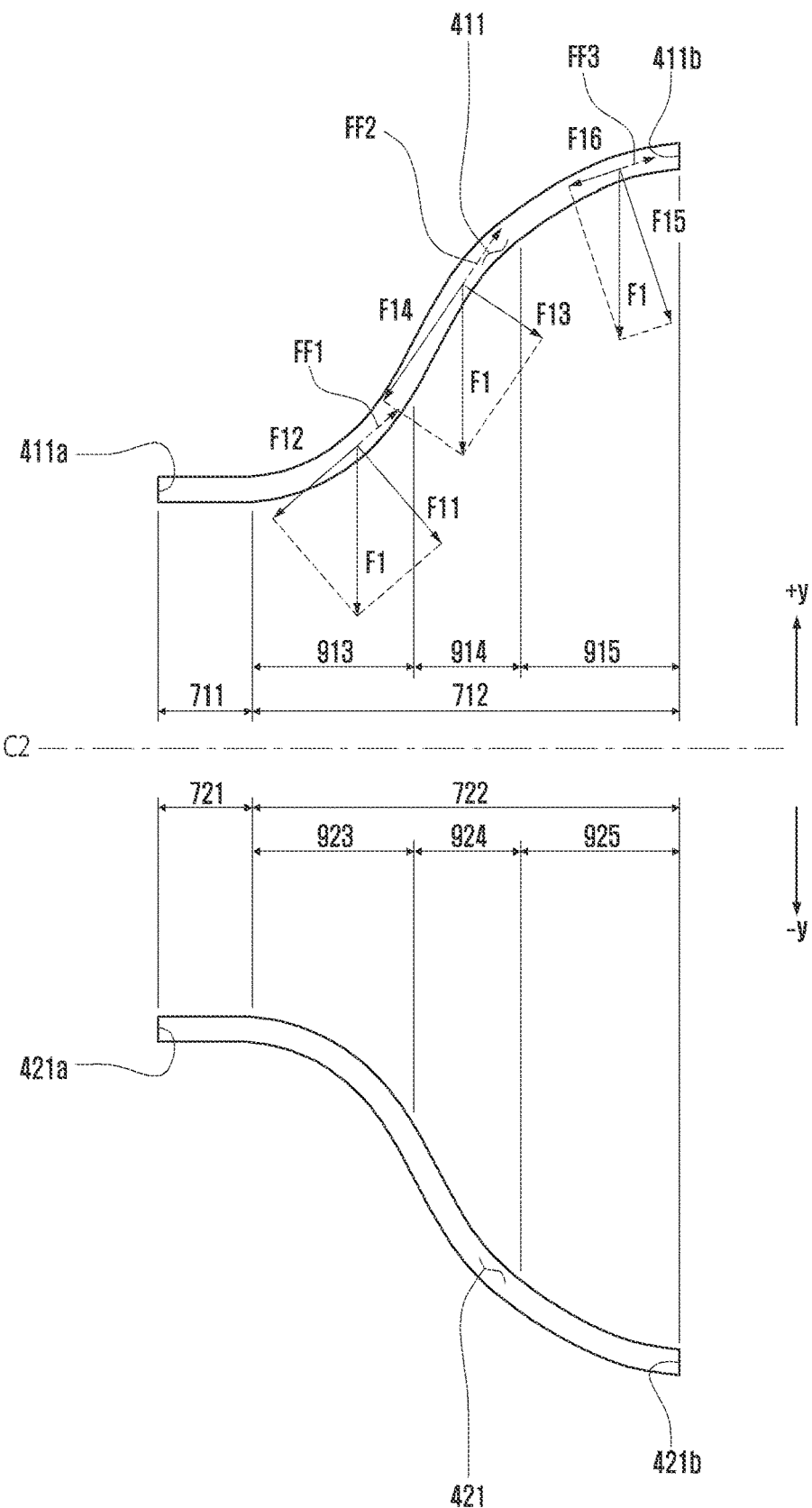
FIG. 9 is a development view in which a first guide groove and a second guide groove are spread out and illustrated in a plane according to an embodiment of the disclosure.

FIG. 9 is a development view in which a first guide groove and a second guide groove are spread out and illustrated in a plane according to an embodiment of the disclosure.

Referring to FIG. 9, a first guide groove 411 may include a first section 711 and a second section 712. According to an embodiment, the second section 712 may include a third section 913, a fourth section 914, and a fifth section 915. The third section 913 may be positioned between the first section 711 and the fourth section 914, and the fourth section 914 may be positioned between the third section 913 and the fifth section 915. The third section 913 may have a curved shape having a slope that gradually increases from the first section 711 toward the fourth section 914 when viewed in the development view of FIG. 9. The fourth section 914 may have a linear shape having a constant slope or a curved shape having a slope that gradually decreases from the third section 913 toward the fifth section 915 when viewed in the development view of FIG. 9. The fifth section 915 may have a curved shape having a slope that gradually decreases from the fourth section 914 toward the second groove end 411*b* when viewed in the development view of FIG. 9. When the first guide pin 430 is positioned in the third section 913, the first restoring force F1 by the first spring 451 may act as a first supporting force (or a first vertical drag force) F11 between the first guide pin 430 and the third section 913 and a first sliding force F12 between the first guide pin 430 and the third section 913. When the first guide pin 430 is positioned in the fourth section 914, the first restoring force F1 by the first spring 451 may act as a second supporting force (or a second vertical drag force) F13 between the first guide pin 430 and the fourth section 914 and a second sliding force F14 between the first guide pin 430 and the fourth section 914. When the first guide pin 430 is positioned in the fifth section 915, the first restoring force F1 by the first spring 451 may act as a third supporting force (or a third vertical drag force) F15 between the first guide pin 430 and the fifth section 915 and a third sliding force F16 between the first guide pin 430 and the fifth section 915. The first sliding force F12 and the third sliding force F16 may be smaller than the second sliding force F14. As the first guide pin 430 approaches the fourth section 914 from the third section 913, the first sliding force F12 may gradually increase. As the first guide pin 430 approaches the fifth section 915 from the fourth section 914, the second sliding force F14 may gradually decrease. As the first guide pin 430 approaches the second groove end 411b from the fifth section 915, the third sliding force F16 may gradually decrease.

The first sliding force F12 between the first guide pin 430 and the third section 913 is directed opposite to a first frictional force FF1, in which the first supporting force F11 between the first guide pin 430 and the third section 913 and the frictional coefficient between the first guide pin 430 and the third section 913 are considered, and may be greater than the first frictional force FF1. As the first guide pin 430 approaches the fourth section 914 from the third section 913, the difference between the first sliding force F12 and the first frictional force FF1 may gradually increase.

The third sliding force F16 between the first guide pin 430 and the fifth section 915 is directed opposite to a third frictional force FF3, in which the third supporting force F15 between the first guide pin 430 and the fifth section 915 and the frictional coefficient between the first guide pin 430 and the fifth section 915 are considered, and may be greater than the third frictional force FF3. As the first guide pin 430 approaches the second groove end 411b from the fifth section 915, the difference between the third sliding force F16 and the third frictional force FF3 may gradually decrease.

The second sliding force F14 between the first guide pin 430 and the fourth section 914 is directed opposite to a second frictional force FF2, in which the second supporting force F13 between the first guide pin 430 and the fourth section 914 and the frictional coefficient between the first guide pin 430 and the fourth section 914 are considered, and may be greater than the second frictional force FF1. When the fourth section 914 has a curved shape having a slope that gradually decreases from the third section 913 toward the fifth section 915 when viewed in the development view of FIG. 9, the difference between the second sliding force F14 and the second frictional force FF2 may gradually decrease as the first guide pin 430 approaches from the fourth section 914 to the fifth section 915. In some embodiments, when the fourth section 914 has a linear shape having a slope that is constant from the third section 913 toward the fifth section 915 when viewed in the development view of FIG. 9, the difference between the second sliding force F14 and the second frictional force FF2 may be constant as the first guide pin 430 approaches from the fourth section 914 to the fifth section 915.

The second guide groove 421 may be symmetrical with the first guide groove 411 with respect to the second center line C2 and may include, for example, a first section 721 and a second section 722, and the second section 722 may include a third section 923, a fourth section 924, and a fifth section 925. The sliding force between the second guide pin 440 and the second guide groove 421 may be generated in substantially the same manner as the sliding force between the first guide pin 430 and the first guide groove 411. When the rotation module 20 is switched from the first state of FIG. 5 to the second state of FIG. 6, the third section 913 of the first guide groove 411 and the third section 923 of the second guide groove 421 may gradually increase the difference between the sliding force and the frictional force, whereby the rotational speed of the cylindrical housing 210 may gradually increase. When the rotation module 20 is switched from the first state of FIG. 5 to the second state of FIG. 6, the fifth section 915 of the first guide groove 411 and the fifth section 925 of the second guide groove 421 may gradually reduce the difference between the sliding force and the frictional force, whereby the rotational speed of the cylindrical housing 210 may gradually decrease and may become zero.

Figure 10:
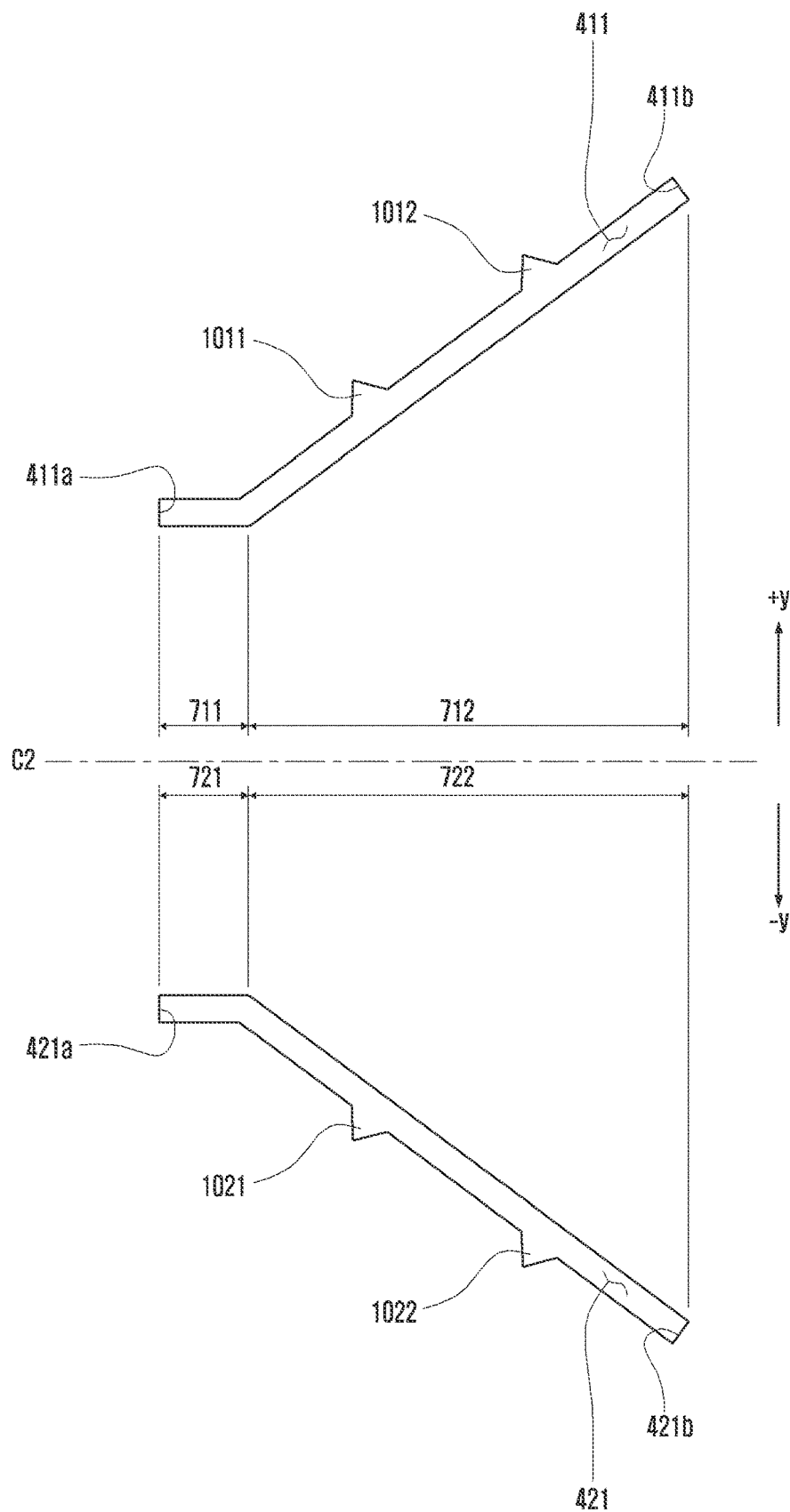
FIG. 10 is a development view in which a first guide groove and a second guide groove are spread out and illustrated in a plane according to an embodiment of the disclosure.

FIG. 10 is a development view in which a first guide groove and a second guide groove are spread and illustrated in a plane according to an embodiment of the disclosure.

Referring to FIG. 10, a first guide groove 411 may include a first section 711 and a second section 712. According to an embodiment, the second section 712 may include a plurality of first recesses 1011 and 1012 recessed in the first cylindrical cam 410 toward the first spring 451 (e.g., in the +y-axis direction). The second guide groove 421 may be symmetrical with the first guide groove 411 with respect to the second center line C2 and may include, for example, a first section 721 and a second section 722. The second section 722 may include a plurality of second recesses 1021 and 1022 recessed in the second cylindrical cam 420 toward the second spring 452 (e.g., in the −y-axis direction). The second recesses 1021 and 1022 may be positioned in a portion substantially symmetrical with the first recesses 1011 and 1012 with respect to the second center line C2. For example, the second recess 1021 may be symmetrical with the first recess 1011 with respect to the second center line C2, and the second recess 1022 may be symmetrical with the first recess 1012 with respect to the second center line C2. When the first guide pin 430 of FIG. 2 is positioned in one of the plurality of first recesses 1011 and 1012 and the second guide pin 440 of FIG. 2 is positioned in one of the plurality of second recesses 1021 and 1022, the rotation module 20 may be in a third state. The third state may refer to the state between the first state of FIG. 5 and the second state of FIG. 6. In the state change of the rotation module 20, due to the plurality of first recesses 1011 and 1012 and the plurality of second recesses 1021 and 1022, the rotation angle of the cylindrical housing 210 of FIG. 2 may be adjusted. When the rotation module 20 is drivingly connected to the flexible display included in the electronic device (e.g., the electronic device 101 of FIG. 1), the moving distance of the flexible display may correspond to the rotation angle of the cylindrical housing 210. The first recesses and the second recesses are not limited to the embodiment of FIG. 10 and may be provided in various numbers, at various positions, and/or in various shapes. For example, there may be two or more first recesses and two or more second recesses, and the intervals of the recesses may be different. As another example, the first recesses and the second recesses may be semicircular, triangular, quadrangular, or polygonal, and the first recesses and the second recesses, which are not symmetrical with each other with respect to the second center line C2 may have different shapes.

Figure 11:
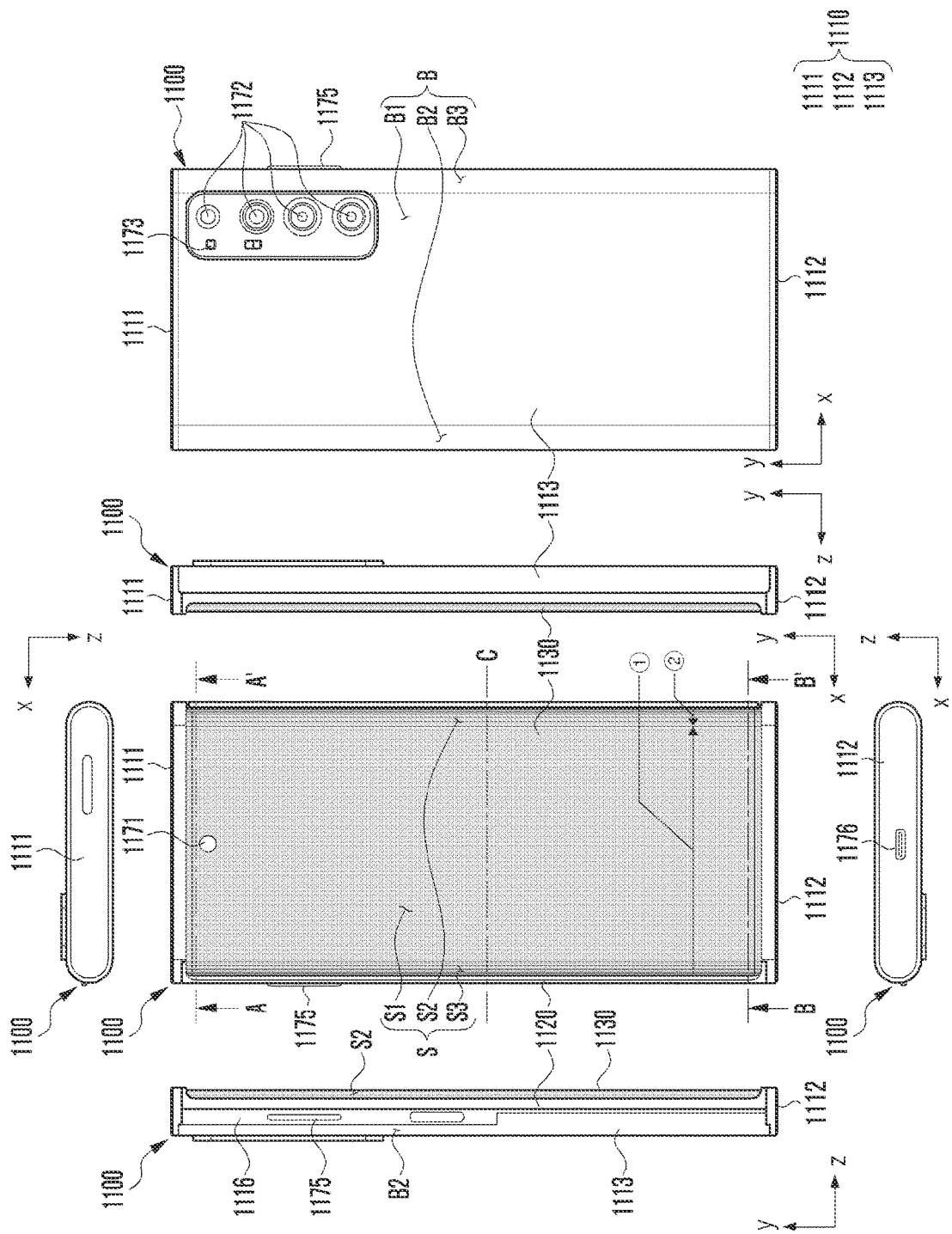
FIG. 11 is a view illustrating an electronic device in a closed state according to an embodiment of the disclosure.

FIG. 11 is a view illustrating an electronic device in a closed state according to an embodiment of the disclosure.

Figure 12:
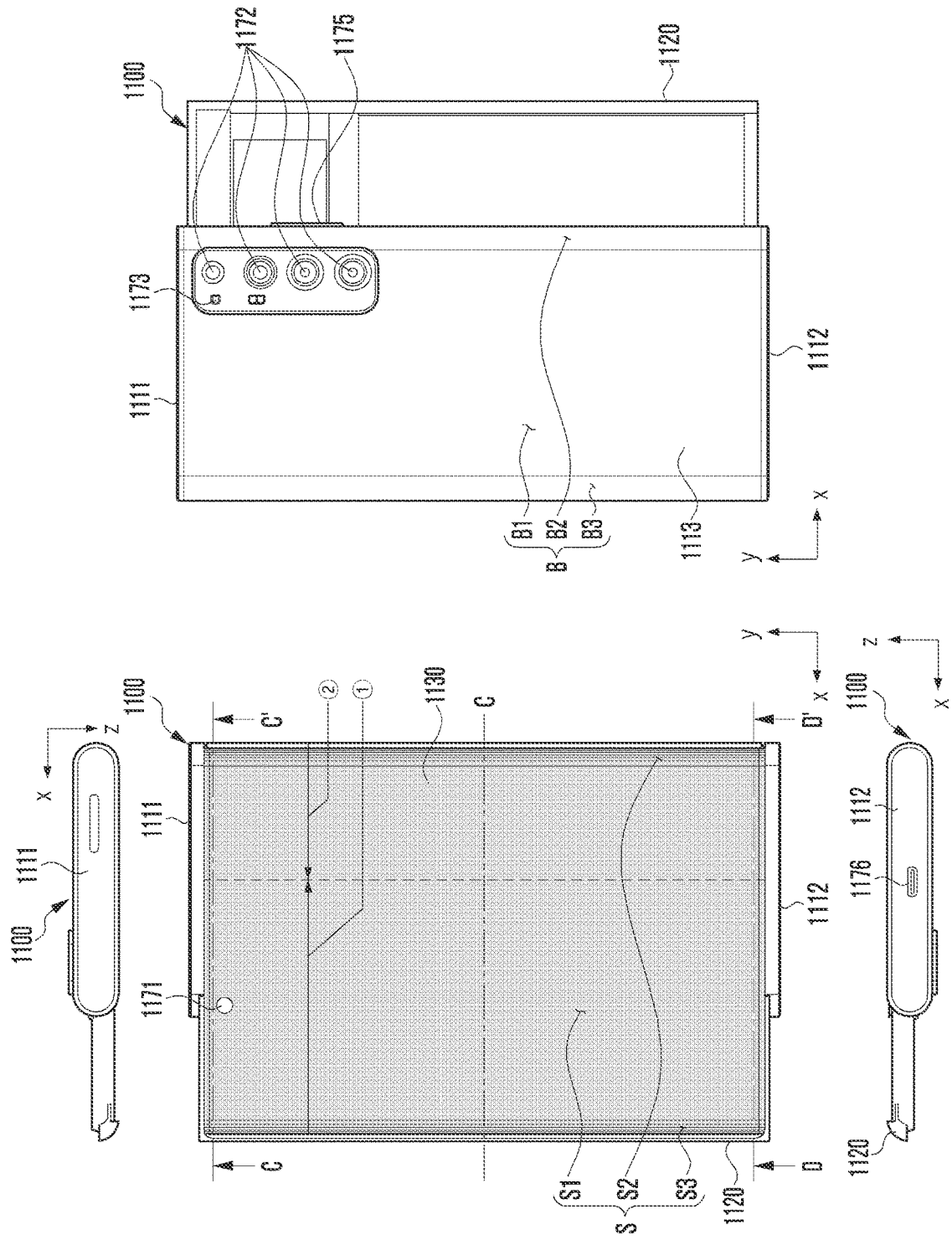
FIG. 12 is a view illustrating an electronic device in an open state according to an embodiment of the disclosure.

FIG. 12 is a view illustrating an electronic device in an open state according to an embodiment of the disclosure.

Referring to FIGS. 11 and 12, in an embodiment, an electronic device 1100 may include a housing 1110, a sliding plate 1120, and a flexible display 1130. The housing (or housing structure) may include, for example, a first side housing unit 1111, a second side housing unit 1112, and a back housing portion (hereinafter, referred to as a back cover) 1113. The first side housing unit 1111 and the second side housing unit 1112 may be positioned opposite to each other to correspond to opposite short edges of the back cover 1113 on the x axis. The first side housing unit 1111 and/or the second side housing unit 1112 may include a metal and/or a polymer. The back cover 1113 may be substantially opaque. The back cover 1113 may be made of, for example, coated or colored glass, ceramic, a polymer, a metal (e.g., aluminum, stainless steel (STS), or magnesium), or a combination of at least two of these materials.

According to an embodiment, the electronic device 1100 may be implemented to be capable of expanding a screen S in a sliding manner. For example, the screen S may be a display area (or an active area) that is visible to the outside of the flexible display 1130. FIG. 11 illustrates the electronic device 1100 in a state in which the screen S is not expanded, and FIG. 12 illustrates the electronic device 1100 in a state in which the screen S is expanded. The state in which the screen S is not expanded is the state in which the sliding plate 1120 for the sliding motion of the flexible display 1130 does not slide out from the housing 1110, which may be referred to as a "closed state." For example, the "slide out" may mean that the sliding plate 1120 at least partially moves in a first direction (e.g., the +x-axis direction) when the electronic device 1100 is switched from the closed state to the open state. The state in which the screen S is expanded is the maximum expansion state in which the screen S is not further expanded due to the slide-out of the sliding plate 1120, which may be referred to as an "open state" below. According to various embodiments, the open state may be defined as the state in which the screen S is expanded compared to the closed state, and the screens S may be provided in various sizes depending on the moving position of the sliding plate 1120. According to various embodiments, the intermediated state may refer to a state between the closed state of FIG. 11 and the open state of FIG. 12. The flexible display 1130 may include a first area ① and the second area ②. The first area ① may be arranged to at least partially overlap the sliding plate 1120. The second area ② may include an expanded portion of the screen S when the electronic device 1100 is switched from the closed state (see FIG. 11) to the open state (see FIG. 12). When the electronic device 1100 is switched from the closed state to the open state, at least a portion of the second area ② is drawn out of the internal space of the electronic device 1100 in a sliding manner, and thus the screen S can be expanded. When the electronic device 1100 is switched from the open state to the closed state, at least a portion of the second area ② is introduced into the internal space of the electronic device 1100 in a sliding manner, and thus the screen S can be contracted. The second area ② is a portion of the flexible display 1130 that is bent when the electronic device 1100 is switched between the open state and the closed state, and may be referred to as, for example, a "bendable area" or a "bendable section." The screen S may include an active area of the flexible display 1130 that is visually exposed to output an image, and the electronic device 1100 may adjust the active area depending on the movement of the sliding plate 1120 or the movement of the flexible display 1130. In the following description, the open state may refer to the state in which the screen S is maximally expanded. In some embodiments, the flexible display 1130, which is disposed in the electronic device 1100 to be able to slide and provides the screen S, may be referred to as a "slide-out display" or an "expandable display." According to various embodiments, the electronic device 1100 including the flexible display 1130 may include the electronic device 101 of FIG. 1.

According to an embodiment, the screen S may include a first flat portion S1, and may further a first curved portion S2 and/or a second curved portion S3, wherein the first curved portion S2 and the second curved portion S3 are positioned opposite to each other on the x axis, with the first flat portion S1 interposed therebetween. For example, the first curved portion S2 and the second curved portion S3 may be substantially symmetrical to each other with the first flat portion S1 interposed therebetween. When the closed state of FIG. 11 is switched to the open state of FIG. 12, the first flat portion S1 can be expanded. A portion of the second area ② providing the first curved portion S2 in the closed state of FIG. 11 is included in the first flat portion S1 expanded when the electronic device is switched from the closed state of FIG. 11 to the open state of FIG. 12, and the first curved portion S2 may be provided as another portion of the second area ② in the open state of FIG. 12.

Referring to the closed state of the electronic device 1100 illustrated in FIG. 11, the electronic device 1100 may include a rear surface B positioned opposite to the screen S. The rear surface B may include a second flat portion B1, and may further include a third curved portion B2 and a fourth curved portion B3, wherein the third curved portion B2 and the fourth curved portion B3 are positioned opposite to each other, with the second flat part B1 interposed therebetween. The second flat portion B1 may be positioned to correspond to the first flat portion S1 of the screen S and may be parallel to the first flat portion S1. The third curved portion B2 may be positioned to correspond to the first curved portion S2 of the screen S and may include a curved surface curved from the second flat portion B1 toward the first curved portion S2. The fourth curved portion B3 may be positioned to correspond to the second curved portion S3 of the screen S and may include a curved surface curved from the second flat portion B1 toward the second curved portion S3. According to an embodiment, when the electronic device 1100 is viewed in the −x-axis direction in the closed state of FIG. 11, a portion 1116 of the support member connected to the housing 1110 may be exposed between the first curved portion S2 and the third curved portion B2 to define a portion of the outer surface of the electronic device 1100. According to some embodiments, the back cover 1113 may be expanded in place of a portion 1116 of the support member. Referring to the closed state of the electronic device 1100 illustrated in FIG. 11, in an embodiment, the first side housing unit 1111 may cover the space between the screen S and the rear surface B at one side, and the second side housing unit 1112 may cover the space between the screen S and the rear surface B at the other side.

According to various embodiments, when the second area ② of the flexible display 1130 is at least partially drawn into the internal space of the housing 1110 (e.g., the closed state), at least a portion of the second area ② may be disposed to be visible from the outside through the back cover 1113. In this case, at least a portion of the back cover 1113 may be made of a transparent material and/or a translucent material.

According to an embodiment, the electronic device 1100 may include a rotation module (e.g., the rotation module 20 in FIG. 2) positioned inside the electronic device 1100 to correspond to the second area ② of the flexible display 1130. The second area ② of the flexible display 1130 may be drivingly connected to the rotation module, and the movement and the movement direction of the second area ② may be guided through the rotation of the rotation module during the switching between the closed state of FIG. 11 and the open state of FIG. 12. The first curved portion S2 of the screen S may be provided by a portion of the second area ② corresponding to the curved surface of the rotation module. The second curved portion S3 of the screen S may be provided to correspond to a curved surface provided on one surface of the sliding plate 1120. The second curved portion S3 may be positioned opposite to the first curved portion S2 in the closed state or the open state of the electronic device 1100 to improve the aesthetics of the screen S. According to some embodiments, the flat portion S1 may be implemented in an expanded shape without the second curved portion S3.

According to an embodiment, the flexible display 1130 may further include a touch-sensitive circuit (e.g., a touch sensor). According to various embodiments (not illustrated), the flexible display 1130 may be coupled to or disposed adjacent to a pressure sensor capable of measuring the intensity (pressure) of a touch, and/or a digitizer configured to detect a magnetic field-type pen input device (e.g., a stylus pen). For example, the digitizer may include a coil member disposed on a dielectric substrate to detect a resonance frequency of an electromagnetic induction scheme applied from a pen input device.

According to an embodiment, the electronic device 1100 may include a first camera module 1171, a second camera module 1172 (e.g., the camera module 180 in FIG. 1), and/or a flash (or a light-emitting module) 1173. The first camera module 1171 or the second camera module 1172 may include one or more lenses, an image sensor, and/or an image signal processor. The flash 1173 may include, for example, a light-emitting diode or a xenon lamp.

According to an embodiment, the first camera module (or a front camera module) 1171 may generate an image signal based on light received through one surface of the electronic device 1100 placed in the direction in which the screen S is oriented. For example, the first camera module 1171 may be positioned inside the electronic device 1100 to be aligned with an opening (e.g., a through hole or a notch) provided in the flexible display 1130. In this case, external light may pass through the opening and a partial area of a transparent cover overlapping the opening and may enter the front camera module 1171. The transparent cover may serve to protect the flexible display 1130 from the outside, and may include a material such as polyimide film or ultra-thin glass (UTG). As another example, the first camera module 1171 may be located inside the electronic device 1100 to correspond to the first side housing unit 1111.

According to some embodiments, the first camera module 1171 may be disposed under at least a portion of the screen S, and may perform a related function (e.g., image capture) in the state in which the position of the first camera module 1171 is not visually distinguished (or exposed). For example, the first camera module 1171 may be positioned on the rear surface of the screen S, or below or beneath the screen S. According to various embodiments, the first camera module 1171 may be positioned in alignment with a recess provided in the rear surface of the flexible display 1130. When viewed from above the screen S (e.g., when viewed in the −z axis direction), the first camera module 1171 may be disposed to overlap at least a portion of the screen S so as to obtain an image of an external subject without being exposed to the outside. In this case, a partial area of the flexible display 1130 that at least partially overlaps the first camera module 1171 may include a pixel structure and/or a wiring structure different from those of other areas. For example, a partial area of the flexible display 1130 that at least partially overlaps the first camera module 1171 may have a pixel density different from that of other areas. A pixel structure and/or a wiring structure provided in an area of the flexible display 1130 that at least partially overlaps the first camera module 1171 may reduce light loss between the outside and the first camera module. According to some embodiments, pixels may not be disposed in a partial area of the flexible display 1130 that at least partially overlaps the first camera module 1171.

According to an embodiment, the second camera modules 1172 and/or the flash 1173 may be positioned on the rear surface B of the electronic device 1100. For example, second camera modules 1172 (e.g., dual cameras or triple cameras) may have different properties (e.g., angle of view) or functions. For example, the second camera modules 1172 may include one or more lenses having different angles of view, and the electronic device 1100 may control the camera modules to change the angles of view of the camera modules based on the user's selection. As another example, the second camera modules 1172 may include at least one of a wide-angle camera, a telephoto camera, a color camera, a monochrome camera, or an infrared (IR) camera (e.g., a time of flight (TOF) camera, or a structured light camera). In various embodiments, the IR camera may be operated as at least part of a sensor module (not illustrated).

According to various embodiments (not illustrated), the electronic device 1100 may include various sensor modules (e.g., the sensor module 176 in FIG. 1). A sensor module may generate electrical signals or data values corresponding to the internal operating states or the external environmental states of the electronic device 1100. The sensor module may include at least one of, for example, a proximity sensor, a gesture sensor, a gyro sensor, an atmospheric pressure sensor, a magnetic sensor, an acceleration sensor, a grip sensor, a color sensor, an infrared (IR) sensor, a biometric sensor (e.g., a fingerprint sensor or an HRM sensor), a temperature sensor, a humidity sensor, or an illuminance sensor. According to an embodiment, the sensor module may be positioned inside the electronic device 1100 to correspond to the first side housing unit 1111. According to another embodiment, the sensor module may include an optical sensor, and may be positioned inside the electronic device 1100 to be aligned with an opening (e.g., a through hole or a notch) provided in the flexible display 1130. In this case, external light may pass through the opening and an area of the transparent cover overlapping the opening, and may enter the optical sensor.

According to some embodiments, the sensor module may be disposed under at least a portion of the screen (e.g., a screen display area or an active area) S of the flexible display 1130, and may perform a related function in the state in which the position of the sensor module is visually distinguished (or exposed). For example, the sensor module may be positioned on the rear surface of the screen S of the flexible display 1130 or below or beneath the screen S of the flexible display 1130. According to various embodiments, the sensor module may be positioned in alignment with a recess provided in the rear surface of the flexible display 1130. When viewed from above the screen S (e.g., when viewed in the −z axis direction), the sensor module may be disposed to overlap at least a portion of the screen S so as to perform a corresponding function without being exposed to the outside. In this case, the partial area of the flexible display 1130 that at least partially overlaps the sensor module may include a pixel structure and/or a wiring structure different from those of other areas. For example, the partial area of the flexible display 1130 that at least partially overlaps the sensor module may have a pixel density different from that of other areas. The pixel structure and/or the wiring structure provided in the area of the flexible display 1130 that is at least partially overlap the sensor module may reduce the loss of various types of signals (e.g., light or ultrasonic waves) related to the sensor module when the signals pass a space between the outside and the sensor module. According to some embodiments, pixels may not be disposed in a partial area of the flexible display 1130 that at least partially overlaps the sensor module.

According to an embodiment, the electronic device 1100 may include a key input device 1175 (e.g., the input module 150 in FIG. 1). The key input device 1174 may be position, for example, on a portion 1116 of a support member that defines a portion of an outer surface of the electronic device 1100. In some embodiments (not illustrated), the key input device may include at least one sensor module.

According to various embodiments, at least one of the above-mentioned components may be omitted from the electronic device 1100 or other components may be additionally included in the electronic device 1100. For example, the electronic device 1100 may include a microphone positioned inside the housing 1110 and a microphone hole provided inside the housing 1110 to correspond to the microphone. According to some embodiments, the electronic device 1100 may include a plurality of microphones capable of detecting the direction of sound. For example, the electronic device 1100 may include a speaker positioned inside the housing 1110 and a speaker hole provided in the housing 1110 to correspond to the microphone. For example, the electronic device 1100 may include a call receiver positioned inside the housing 1110 and a receiver hole provided in the housing 1110 to correspond to the call receiver. In some embodiments, the microphone hole and the speaker hole may be implemented as one hole, or the speaker hole may be omitted as in a piezo speaker. For example, the electronic device 1100 may include a connector (e.g., a USB connector) positioned inside the housing 1110 and a connector hole 1176 provided in the housing 1110 to correspond to the connector. The electronic device 1100 may transmit and/or receive power and/or data to/from an external electronic device electrically connected to the connector through the connector hole 1176.

Figure 13:
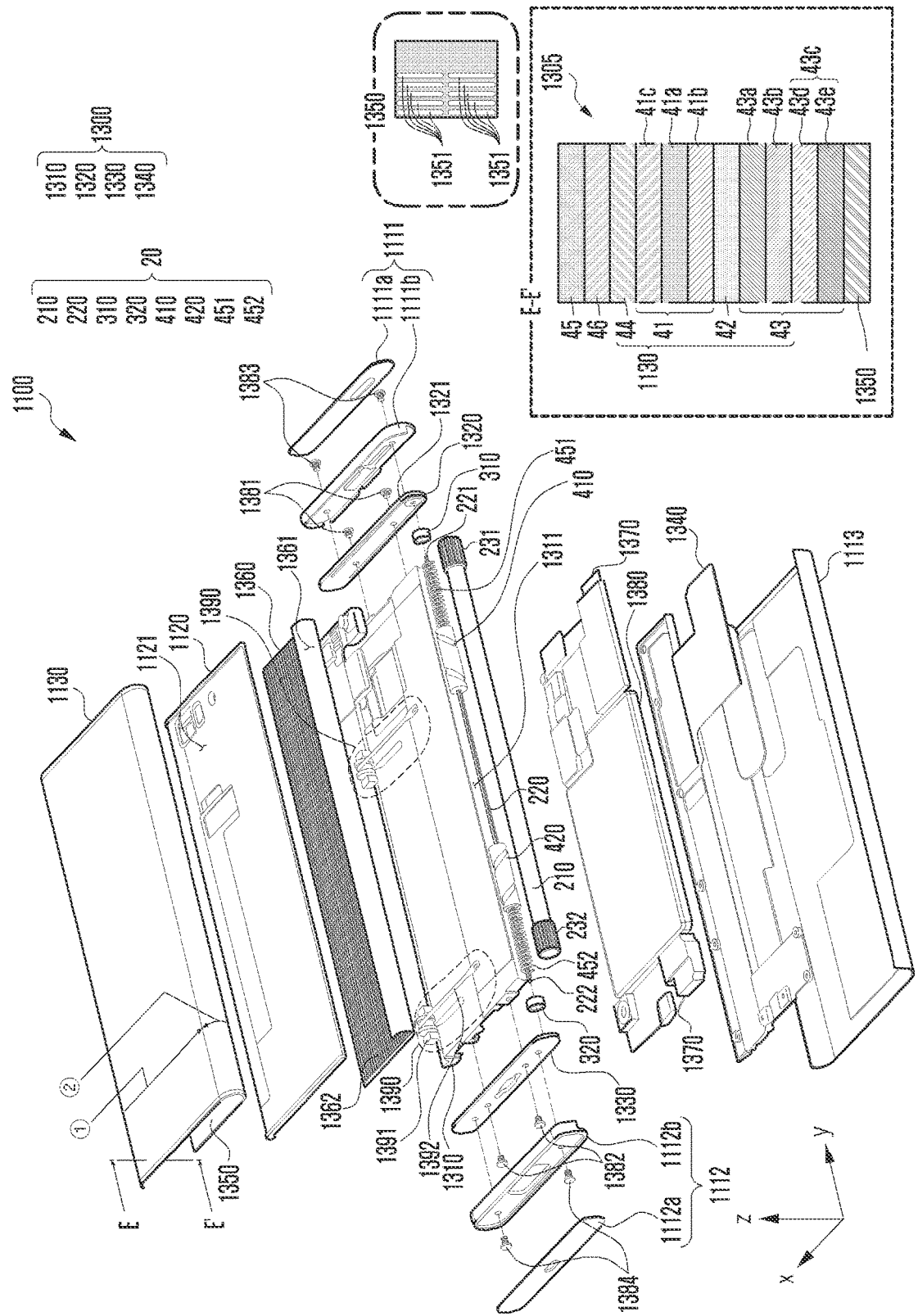
FIG. 13 is an exploded perspective view of the electronic device of FIG. 11 according to an embodiment of the disclosure.

FIG. 13 is an exploded view of an electronic device illustrated in FIG. 11 according to an embodiment of the disclosure.

Referring to FIG. 13, in an embodiment, an electronic device 1100 may include a first side housing unit 1111, a second side housing unit 1112, a back cover 1113, a support member assembly 1300, a sliding plate 1120, a flexible display 1130, a support sheet 1350, a multi-bar structure (or a multi-bar assembly) 1360, a rotation module 20, a printed circuit board 1370, and/or a battery 1380. Redundant descriptions of some of the reference numerals of FIG. 13 will be omitted.

According to an embodiment, the support member assembly (or a support structure) 1300 is a frame structure capable of withstanding a load, and may contribute to durability or rigidity of the electronic device 1100. At least a portion of the support member assembly 1300 may include a non-metal material (e.g., a polymer) and/or a metal material. Elements such as the first side housing unit 1111, the second side housing unit 1112, the back cover 1113, the rotation module 20, the sliding plate 1120, the flexible display 1130, the support sheet 1350, the multi-bar structure 1360, the printed circuit board 1370, or battery 1380 may be disposed on support member assembly 1300.

According to an embodiment, the support member assembly 1300 may include a first support member 1310, a second support member 1320, a third support member 1330, and a fourth support member 1340. The first support member (or the first bracket) 1310 may be, for example, in the form of a plate, and the sliding plate 1120 may be disposed on the support member assembly 1300 to be slidable on one surface of the first support member 1310. The fourth support member (or the fourth bracket) 1340 may be coupled to the other surface of the first support member 1310. A printed circuit board 1370 (e.g., a rigid printed circuit board (RPCB), a flexible PCB (FPCB), or a rigid-flex PCB (RFPCB)) may be positioned between the first support member 1310 and the fourth support member 1340. The fourth support member 1340 may cover and protect the printed circuit board 1370. The fourth support member 1340 may absorb or block electromagnetic waves that may affect the printed circuit board 1370 (e.g., electromagnetic interference (EMI) blocking). The second support member (or the second bracket) 1320 and the third support member (or the third bracket) 1330 may be positioned at opposite sides with the first support member 1310 interposed therebetween. The second support member 1320 may be coupled to one side of the first support member 1310 using bolts 1381 to correspond to the first side housing unit 1111. The third support member 1330 may be coupled to the other side of the first support member 1310 using bolts 1382 to correspond to the second side housing unit 1112. The first side housing unit 1111 may be coupled to the second support member 1320 using bolts 1383. The second side housing unit 1112 may be coupled to the third support member 1330 using bolts 1384.

According to an embodiment, the first side housing unit 1111 may include a first side cover 1111a and a first edge cover 1111b. The first side cover 1111a may define a first side surface of the electronic device 1100 and may be coupled to the first edge cover 1111b. The first edge cover 1111b may define one side edge area of the electronic device 1100 to correspond to the first side surface. The first edge cover 1111b may be coupled to the second support member 1320 using the bolts 1383. The first side cover 1111a may be coupled to the first edge cover 1111b through a fastening method such as snap-fit. The second side housing unit 1112 may include a second side cover 1112a and a second edge cover 1112b. The second side cover 1112a may define a second side surface of the electronic device 1200 and may be coupled to the second edge cover 1112b. The second side surface may face away from the first side surface defined by the first side housing unit 1111. The second edge cover 1112b may define the other side edge area of the electronic device 1100 to correspond to the second side surface. The second edge cover 1112b may be coupled to the third support member 1330 using the bolts 1384. The second side cover 1112a may be coupled to the second edge cover 1112b through a fastening method such as snap-fit.

According to some embodiments, the first side housing unit 1111 and the second support member 1320 may be integrated with each other, and may include the same material. The second side housing unit 1112 and the third support member 1330 may be integrated with each other, and may include the same material.

According to some embodiments, the first edge cover 1111*b* and the second support member 1320 may be integrated with each other, and may include the same material. The second edge cover 1112*b* and the third support member 1330 may be integrated with each other, and may include the same material.

According to an embodiment, the printed circuit board 1370 and/or the battery 1380 may be disposed on or coupled to the first support member 1310 in the internal space of the electronic device 1100. The printed circuit board 1370 and the battery 1380 may not overlap each other when viewed from above the back cover 1113 (e.g., viewed in the +z axis direction). The printed circuit board 1370 may be electrically connected to the flexible display 1130 via, for example, a flexible printed circuit board (FPCB) (not illustrated). A processor (e.g., the processor 120 in FIG. 1), a memory (e.g., the memory 130 in FIG. 1), and/or an interface (e.g., the interface 177 in FIG. 1) may be mounted on the printed circuit board 1370. The processor may include one or more of, for example, a central processing unit, an application processor, a graphics processor, an image signal processor, a sensor hub processor, or a communication processor. The memory may include, for example, a volatile memory or a nonvolatile memory. The interface may include, for example, a high-definition multimedia interface (HDMI), a universal serial bus (USB) interface, an SD card interface, and/or an audio interface. The interface may electrically or physically connect, for example, the electronic device 200 to an external electronic device, and may include a USB connector, an SD card/an MMC connector, or an audio connector. The electronic device 1100 may include various other elements disposed on the printed circuit board 1370 or electrically connected to the printed circuit board 1370. The battery 1380 is a device for supplying power to at least one component of the electronic device 1100, and may include, for example, a non-rechargeable primary battery, a rechargeable secondary battery, or a fuel cell. The battery 1380 may be integrally disposed inside the electronic device 1100, or may be detachably disposed on the electronic device 1100.

According to various embodiments (not illustrated), the electronic device 1100 may include an antenna at least partially positioned between the fourth support member 1340 and the back cover 1113 or between the battery 1380 and the back cover 1113. The antenna may include, for example, a near field communication (NFC) antenna, a wireless charging antenna, and/or a magnetic secure transmission (MST) antenna. The antenna may perform short-range communication with, for example, an external device, or may transmit/receive power required for charging to/from an external device in a wireless manner. In another embodiment, the antenna structure may be provided by at least a portion of the sliding plate 1120, the support member assembly 1300, the first side housing unit 1111, or the second side housing unit 1112.

According to an embodiment, the second support member 1320 and the third support member 1330 may be substantially symmetrical with each other with respect to a center line C (see FIG. 11 or FIG. 12) of the electronic device parallel to a first direction (e.g., +x-axis direction) in which the sliding plate 1120 is capable of sliding out. The center line C of the electronic device 1100 may be, for example, a line serving as a reference for symmetry with respect to the first flat portion 230*a* of the screen S.

According to an embodiment, the flexible display 1130 may include a first area ① and a second area ② extending from the first area ①. The first area ① may be disposed to overlap the sliding plate 1120. The sliding plate 1120 may include a first surface 1121 and a second surface (not illustrated) positioned opposite to the first surface 1121. The first area ① may be coupled to the first surface 1121 of the sliding plate 1120 using an adhesive member (or a bonding member) (not illustrated). The adhesive member may include, for example, a thermally reactive adhesive member, a photoreactive adhesive member, a general adhesive, and/or a double-sided tape. According to some embodiments, the first area ① may be disposed in and fixed to a recess provided in the sliding plate 1120. The sliding plate 1120 serves to support at least a portion of the flexible display 1130, and may be referred to as a "display support structure" in some embodiments.

According to an embodiment, the support sheet 1350 may be disposed on or coupled to the rear surface of the flexible display 1130. The rear surface of the flexible display 1130 may refer to a surface positioned opposite to a surface from which light from a display panel including a plurality of pixels is emitted. The support sheet 1350 may contribute to the durability of the flexible display 1130. The support sheet 1350 may reduce the influence of a load or stress that may occur during switching between the closed state of FIG. 11 and the open state of FIG. 12, on the flexible display 1130. The support sheet 1350 may prevent the flexible display 1130 from being damaged by a force transmitted from the sliding plate 1120 when the sliding plate 1120 is moved.

Referring to FIG. 13, the cross-sectional structure 1305 obtained along line E-E' may include, for example, a flexible display 1130, a transparent cover 45, an optical transparent adhesive member 46, and a support sheet 1350. The flexible display 1130 may be coupled to the transparent cover 45 using an optically transparent adhesive member 46 (e.g., an optically clear adhesive (OCA), an optically clear resin (OCR), or a super view resin (SVR)). The transparent cover 45 (e.g., a window) may cover the flexible display 1130 to protect the flexible display 1130 from the outside. The transparent cover 45 may be implemented in the form of a thin flexible film (e.g., a thin film layer). For example, the transparent cover 45 may include a plastic film (e.g., polyimide film) or thin glass (e.g., ultra-thin glass). According to various embodiments, the transparent cover 45 may include a plurality of layers. For example, the transparent cover 45 may be in the form of a plastic film or a thin glass with various coating layers disposed thereon. For example, the transparent cover 45 may be in the form of a plastic film or a thin film glass with at least one protective layer or coating layer containing a polymer material (e.g., polyester (PET), polyimide (PI), or thermoplastic polyurethane (TPU)).

According to an embodiment, the flexible display 1130 may include a display panel 41, a base film 42, a lower panel 43, or an optical layer 44. The display panel 41 may be positioned between the optical layer 44 and the base film 42. The base film 42 may be positioned between the display panel 41 and the lower panel 43. The optical layer 44 may be positioned between the optically transparent adhesive member 46 and the display panel 41. Various polymer adhesive members (not illustrated) may be disposed between the display panel 41 and the base film 42, between the base film 42 and the lower panel 43, and/or between the display panel 41 and the optical layer 44.

According to an embodiment, the display panel 41 may include a light-emitting layer 41a, a thin film transistor (TFT) film 41b, and/or an encapsulation (e.g., a thin film encapsulation (TFE)) 41c. The light-emitting layer 41a may include, for example, a plurality of pixels implemented by light-emitting elements such as OLEDs or micro-LEDs. The light-emitting layer 41a may be disposed on the TFT film 41b through organic material evaporation. The TFT film 41b may be positioned between the light-emitting layer 41a and the base film 42. The TFT film 41b may refer to a structure in which at least one TFT is disposed on a flexible substrate (e.g., a PI film) through a series of processes such as deposition, patterning, and etching. At least one TFT may control current to a light-emitting element of the light-emitting layer 41a to turn on or off a pixel or to adjust brightness of a pixel. The at least one TFT may be implemented as, for example, an amorphous silicon (a-Si) TFT, a liquid crystalline polymer (LCP) TFT, a low-temperature polycrystalline oxide (LTPO) TFT, or a low-temperature polycrystalline silicon (LTPS) TFT. The display panel 41 may include a storage capacitor, and the storage capacitor may maintain a voltage signal to the pixels, may maintain a voltage applied to the pixels within one frame, or may reduce a change in the gate voltage of the TFT due to leakage during a light emission time. By a routine for controlling at least one TFT (e.g., initialization or data write), the storage capacitor may maintain the voltage applied to the pixels at regular time intervals. According to an embodiment, the display panel 41 may be implemented based on OLEDs, and the encapsulation layer 41c may cover the light-emitting layer 41a. An organic material and an electrode that emit light in an OLED react very sensitively with oxygen and/or moisture, and may lose luminous properties thereof. The encapsulation layer 41c may seal the light-emitting layer 41a such that oxygen and/or moisture do not penetrate into the OLED.

According to an embodiment, the base film 42 may include a flexible film made of a material such as polyimide or polyester (PET). The base film 42 may support and protect the display panel 41. According to some embodiments, the base film 42 may be referred to as a protective film, a back film, or a back plate.

According to an embodiment, the lower panel 43 may include a plurality of layers for various functions. Various polymer adhesive members (not illustrated) may be disposed between the plurality of layers. According to an embodiment, the lower panel 43 may include a light-blocking layer 43a, a buffer layer 43b, or a lower layer 43c. The light-blocking layer 43a may be positioned between the base film 42 and the buffer layer 43b. The buffer layer 43b may be positioned between the light-blocking layer 43a and the lower layer 43c. The light-blocking layer 43a may block at least some of light incident from the outside. For example, the light-blocking layer 43a may include an embossed layer. The embossed layer may be a black layer including an uneven pattern. The buffer layer 43b may alleviate an external impact applied to the flexible display 1130. For example, the buffer layer 43b may include a sponge layer or a cushion layer. The lower layer 43c may diffuse, disperse, or dissipate heat generated from the electronic device 1100 or the flexible display 1130. The lower layer 43c may absorb or block electromagnetic waves. The lower layer 43c may alleviate an external impact applied to the electronic device 1100 or the flexible display 1130. For example, the lower layer 43c may include a composite sheet 43d or a copper sheet 43e. According to an embodiment, the composite sheet 43d may be a sheet obtained by combining layers or sheets having different properties. For example, the composite sheet 43d may include at least one of polyimide and graphite. The composite sheet 43d may also be replaced by a single sheet containing a single material (e.g., polyimide or graphite). The composite sheet 43d may be positioned between the buffer layer 43b and the copper sheet 43e. The copper sheet 43e may be replaced with various other metal sheets. According to various embodiments, at least a portion of the lower layer 43c is a conductive member (e.g., a metal plate), which may help reinforce the rigidity of the electronic device 1100 and may be used in order to block ambient noise and to dissipate heat emitted from surrounding heat-emitting components (e.g., a display-driving circuit (e.g., a DDI)). For example, the conductive layer may include at least one of copper (Cu), aluminum (Al), stainless steel (SUS), or a CLAD (e.g., a lamination member in which SUS and Al are alternately disposed). The lower layer 43c may include various layers for various other functions.

According to various embodiments (not illustrated), at least one additional polymer layer (e.g., a layer including PI, PET, or TPU) may be further disposed on the rear surface of the display panel 41 in addition to the base film 42. According to various embodiments, at least one of the plurality of layers included in the lower panel 43 (e.g., the light-blocking layer 43a, the buffer layer 43b, the composite sheet 43d, and the copper sheet 43e) may be omitted. According to various embodiments, the arrangement order of the plurality of layers included in the lower panel 43 is not limited to the embodiment of FIG. 13, and may be variously changed.

The optical layer 44 may include, for example, a polarizing layer (or a polarizer) or a phase retardation layer (or a phase retarder). The polarization layer and the phase retardation layer may improve outdoor visibility of a screen. According to an embodiment, the optical layer 44 may selectively pass therethrough light generated from a light source of the display panel 41 and vibrating in a predetermined direction. According to some embodiments, a single layer obtained by combining a polarizing layer and a phase retardation layer may be provided, and such a layer may be defined as a "circularly polarizing layer." The optically transparent adhesive member 46 may be positioned between the transparent cover 45 and the optical layer 44. According to various embodiments, the polarizing layer (or circularly polarizing layer) may be omitted, and in this case, a black pixel define layer (PDL) and/or a color filter may be provided in place of the polarizing layer.

According to an embodiment, the electronic device 1100 may include a touch-sensitive circuit (e.g., a touch sensor (not illustrated)). The touch-sensitive circuit may be implemented as a transparent conductive layer (or film) based on various conductive materials such as indium tin oxide (ITO). According to an embodiment, the touch-sensitive circuit may be positioned between the transparent cover 45 and the optical layer 44 (e.g., an add-on type). According to another embodiment, the touch-sensitive circuit may be disposed between the optical layer 44 and the display panel 41 (e.g., an on-cell type). According to another embodiment, the display panel 41 may include a touch-sensitive circuit or a touch-sensitive function (e.g., an in-cell type). According to various embodiments, the display panel 41 may be based on an OLED, and may include an encapsulation layer 41c disposed between the light-emitting layer 41a and the optical layer 44. For example, the encapsulation layer 41c may serve as a pixel protection layer for protecting a plurality of pixels of the light-emitting layer 41a. According to various embodiments (not illustrated), the flexible display 1130 may include a conductive pattern such as a metal mesh (e.g., an aluminum metal mesh) as a touch-sensitive circuit disposed on the encapsulation layer 41c between the encapsulation layer 41c and the optical layer 44. For example, in response to the bending of the flexible display 1130, the metal mesh may have greater durability than a transparent conductive layer implemented using ITO. According to various embodiments, the flexible display 1130 may further include a pressure sensor (not illustrated) capable of measuring the intensity (pressure) of a touch.

According to various embodiments, a plurality of layers included in the display panel 41 or the lower panel 43, or a laminating structure or laminating order thereof may vary. According to various embodiments, the flexible display 1130 may be implemented by omitting some of the components or adding other components according to the form of provision thereof or the trend of convergence.

According to an embodiment, the support sheet 1350 may be attached to the rear surface of the lower panel 43 to cover at least a portion of the lower panel 43 of the flexible display 1130. The support sheet 1350 may be made of various metallic materials and/or non-metal materials (e.g., polymers). According to an embodiment, the support sheet 1350 may include stainless steel. According to another embodiment, the support sheet 1350 may include engineering plastic. According to some embodiments, the support sheet 1350 may be implemented integrally with the flexible display 1130.

According to an embodiment, the support sheet 1350 may include a lattice structure that at least partially overlaps a portion in which the flexible display 1130 is disposed in a bent form (e.g., the second area ②, or the second curved part S3 in FIG. 11 or 12). The lattice structure may include, for example, a plurality of openings (or slits) 1351. For example, the plurality of openings 1351 may be provided periodically, may have substantially the same shape, and may be repeatedly arranged at regular intervals. The lattice structure may contribute to the flexibility of the second area ②, and the second area ② may be more flexible than the first area ① due to the lattice structure. The lattice structure is not limited to the embodiment illustrated in FIG. 13, and may be implemented in various other forms. According to various embodiments, the support sheet 1350 may include a recess pattern (not illustrated) including a plurality of recesses in place of the lattice structure. According to various embodiments, the lattice structure or recess pattern contributing to the flexibility of the flexible display 1130 may extend to at least a part of the flat portion S1 in FIG. 11 or FIG. 12. According to various embodiments, the support sheet 1350 including a lattice structure or a recess pattern, or a conductive member corresponding thereto, may be configured in a plurality of layers.

According to an embodiment, the support sheet 1350 may substantially prevent elements positioned inside the electronic device 1100 (e.g., the multi-bar structure 1360) from being visible through the flexible display 1130. For example, the lattice structure of the support sheet 1350 corresponding to the second area ② includes a plurality of openings 1351, but the multi-bar structure 1360 is capable of transmitting light at a level that makes the multi-bar structure 450 substantially invisible through the flexible display 1130. According to various embodiments, the lattice structure of the support sheet 1350 corresponding to the second area ② includes a plurality of openings 1351, but is capable of preventing a phenomenon in which a plurality of bars of the multi-bar structure 1360 is visible as protruding through the flexible display 1130.

According to an embodiment, the multi-bar structure 1360 may include a third surface 1361 facing the support sheet 1350, and a fourth surface 1362 positioned opposite to the third surface 1361. When the state of the electronic device 1100 changes, the multi-bar structure 1360 may move together with the sliding plate 1120 and the flexible display 1130. The state change of the electronic device 1100 may include, for example, switching between the closed state and the open state, switching between the closed state and the intermediate state, or switching between the intermediate state and the open state. For example, the multi-bar structure 1360 may be coupled to the support sheet 1350, and an adhesive material may be positioned between the third surface 1361 and the support sheet 1350. For example, the multi-bar structure 1360 may be connected to the sliding plate 1120. The fourth surface 1362 of the multi-bar structure 1360 may take a form in which a plurality of bars (not illustrated) are arranged to extend in the direction of the rotation axis of the rotation module 20 (e.g., the y-axis direction). The multi-bar structure 1360 may have flexibility due to, for example, portions having a relatively thin thickness between the plurality of bars. According to some embodiments, the multi-bar structure 1360 may be implemented without portions connecting the plurality of bars, and the plurality of bars may be attached to the support sheet 1350 using an adhesive material. According to some embodiments, the support sheet 1350 and multiple bars may be implemented as an integral structure. In various embodiments, the multi-bar structure 1360 may also be referred to in various other terms such as a "flexible track." In the closed state of FIG. 11 or the open state of FIG. 12, at least a portion of the multi-bar structure 1360 may be positioned to overlap the screen S (see FIG. 11 or FIG. 12) and may support the second area ② of the flexible display 1130 such that the second area ② is maintained in a shape smoothly connected to the first area ① of the flexible display 1130 without being lifted. The multi-bar structure 1360 is capable of contributing to the function of enabling the second area ② to move while maintaining the shape smoothly connected to the first area ① without being lifted during the switching between the closed state of FIG. 11 and the open state of FIG. 12. In some embodiments, the electronic device 1100 may include various other types of display support structures capable of supporting the flexible display 1130 in place of the multi-bar structure 1360.

According to an embodiment, the second support member 1320 may include a first guide rail 1321. The third support member 1330 may include a second guide rail (not illustrated). One side edge of the sliding plate 1120 and one side edge of the multi-bar structure 1360 may be inserted into the first guide rail 1321, the other side edge of the sliding plate 1120 and the other side edge of the multi-bar structure 1360 may be inserted into the second guide rail. The sliding plate 1120 and the multi-bar structure 1360 may be moved while being guided by the first guide rail 1321 and the second guide rail.

According to an embodiment, the rotation module 20 may include a cylindrical housing 210, a shaft 220, a first bearing 310, a second bearing 320, a first cylindrical cam 410, a second cylindrical cam 420, a first guide pin 430 (see FIG. 2), a second guide pin 440 (see FIG. 2), a first spring 451, and a second spring 452. One end 221 of the shaft 220 may be inserted into a recess or a through hole provided in the second support member 1320 and may be immovably fixed to the second support member 1320. The other end 222 of the shaft 220 may be inserted into a recess or a through hole provided in the third support member 1330 and may be immovably fixed to the third support member 1330. The cylindrical housing 210 may be supported by the first bearing 310 and the second bearing 320 to be capable of performing a rotational motion using the shaft 220 as a rotation axis. The first support member 1310 may include a surface 1311 facing the cylindrical housing 210 of the rotation module 20, and the surface 1311 may include a curved surface corresponding to the cylindrical housing 210 and may be positioned to be spaced apart from the cylindrical housing 210.

According to an embodiment, the cylindrical housing 210 may be drivingly connected to the flexible display 1130. For example, the plurality of bars disposed on the fourth surface 1362 of the multi-bar structure 1360 may provide a gear structure, and may be drivingly connected to the first circular gear 231 and the second circular gear 232 of the cylindrical housing 210. The engaged state of the multi-bar structure 1360 with the first circular gear 231 and the second circular gear 232 of the cylindrical housing 210 makes it possible to reduce transmission loss between the movement of the flexible display 1130 connected to the multi-bar structure 1360 and the rotational motion of the cylindrical housing 210. When the closed state of FIG. 11 is switched to the open state of FIG. 12, the rotational motion of the cylindrical housing 210 may be converted into the movement of the flexible display 1130. When the open state of FIG. 12 is switched to the closed state of FIG. 11, the movement of the flexible display 1130 may be converted into the rotational motion of the cylindrical housing 210.

In the state in which the screen is expanded (e.g., the open state of FIG. 12), a non-smooth screen may be provided due to lifting due to elasticity of the flexible display 1130 and/or the support sheet 1350. According to various embodiments, in order to prevent this problem, one or more tensioning devices (or tensioning structures) 1390 may be provided for the flexible display 1130 and/or the support sheet 1350. The tensioning devices 1390 may contribute to a smooth slide operation while maintaining the tension applied to the flexible display 1130 and the support sheet 1350. The tensioning devices 1390 may each include, for example, a pulley 1391 and a belt 1392. The pulley 1391 may be rotatably positioned on the first support member 1310 (or the support member assembly 1300) at the side opposite to the rotation module 20. The rotation axis of the pulley 1391 may be parallel to the rotation axis (e.g., the shaft 220) of the rotation module 20. The belt 1392 may be drivingly connected to the pulley 1391. One end of the belt 1392 may be connected to the sliding plate 1120, and the other end of the belt 1392 may be connected to the support sheet 1350. The belt 1392 may include, for example, a wire-type belt or a chain-type belt. The pulley 1391 drivingly connected to the belt 1392 may guide the movement and movement direction of the belt 1392. The tensioning devices 1390 are not limited to the embodiment of FIG. 13 and various numbers of tensioning devices 1390 may be provided at various other positions. The tensioning devices 1390 are not limited to the embodiment of FIG. 13 and may be implemented in various other forms. For example, the tensioning devices 1390 may apply a tension to the flexible display 1130 and the support sheet 1350 using an elastic member such as a spring. When the tension applied by the tensioning devices 1390 is in the threshold range, the second area ②of the flexible display 1130 can be maintained in a shape smoothly connected to the first area ① without lifting. When the tension applied by the tensioning devices 1390 is in a threshold range, the second area ② can be moved while maintaining the state of being smoothly connected to the first area ① during the switching between the closed state of FIG. 11 and the open state of FIG. 12. When the tension applied by the tensioning devices 1390 is in the threshold range, the slide operation can be smoothly implemented during the switching between the closed state of FIG. 11 and the open state of FIG. 12.

For example, the tension applied by the tensioning devices 1390 may be below the threshold range. In this case, due to the elasticity of the flexible display 1130 and/or the elasticity of the support sheet 1350, the second area ② may lift or may not smoothly connected to the first area ①.

As another example, the tension applied by the tensioning devices 1390 may be greater than the threshold range. In this case, the second area ② may be smoothly connected to the first area ① without lifting, but it may be difficult to smoothly perform the slide operation during the switching between the closed state of FIG. 11 and the open state of FIG. 12. When the tension applied to the support sheet 1350 coupled to the flexible display 1130 is greater than the threshold range, the load applied to the rotation axis of the pulley 1391 or the rotation axis of the rotation module 20 may exceed a threshold value, thereby increasing resistance to rotation of the pulley 1391 or rotation of the rotation module 20, which may make a smooth and gentle slide operation difficult.

According to various embodiments, a curved member (not illustrated) including a curved portion, which comes into contact with the belt 1392, may be disposed in place of the pulley 1391. For example, during the switching between the closed state of FIG. 11 and the open state of FIG. 12, the belt 1392 may be slidably moved relative to the curved portion of the curved member. According to various embodiments, in order to reduce friction between the curved portion of the curved member and the belt 1392, a lubricant may be disposed between the curved portion and the belt 1392, or the surface of the curved portion or the surface of the belt 1392 may be coated with a lubricant. According to various embodiments, the curved member may be a part of the support member assembly 1300 (e.g., the first support member 1310) or may be a separate structure coupled to the support member assembly 1300. According to some embodiments, the pulley 1391 may be defined as a curved member implemented to be rotatable based on friction with the belt 1392.

Figure 14:
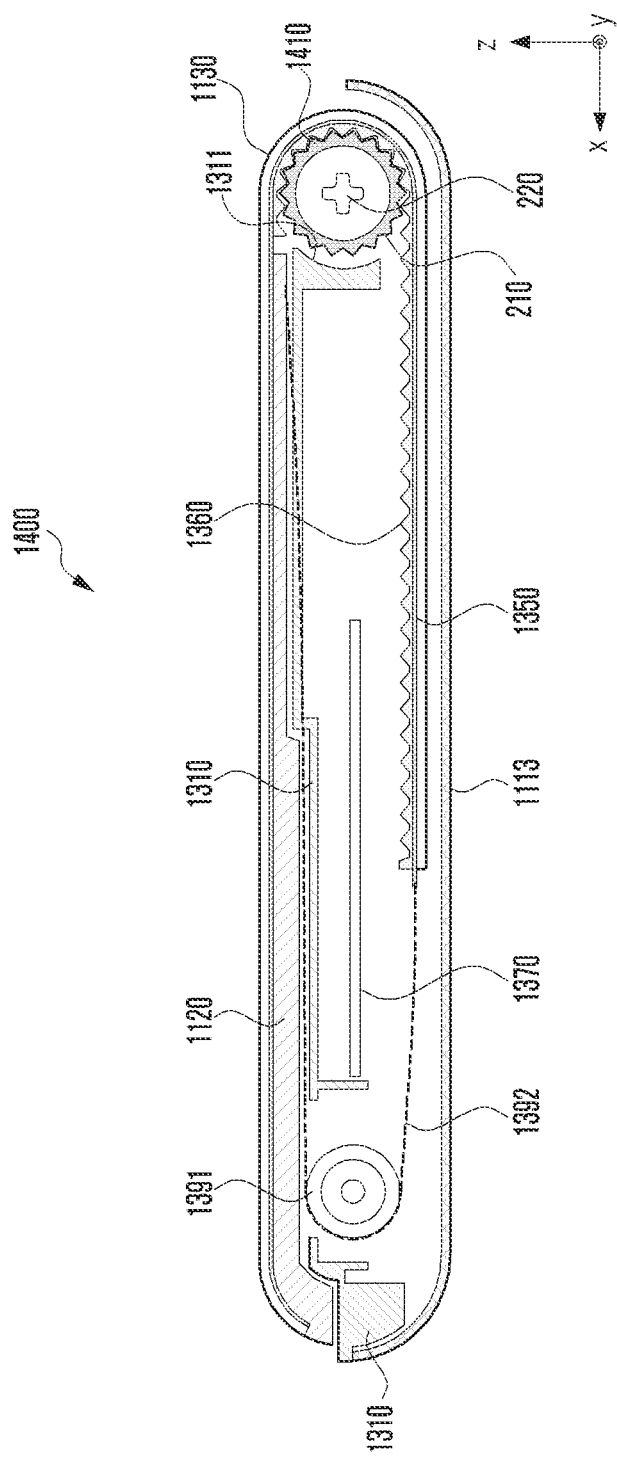
FIG. 14 illustrates a cross-sectional structure of a part of an electronic device taken along line A-A' or line B-B' in FIG. 11 according to an embodiment of the disclosure.

FIG. 14 illustrates a cross-sectional structure of a part of an electronic device taken along line A-A' or line B-B' in FIG. 11 according to an embodiment of the disclosure.

Figure 15:
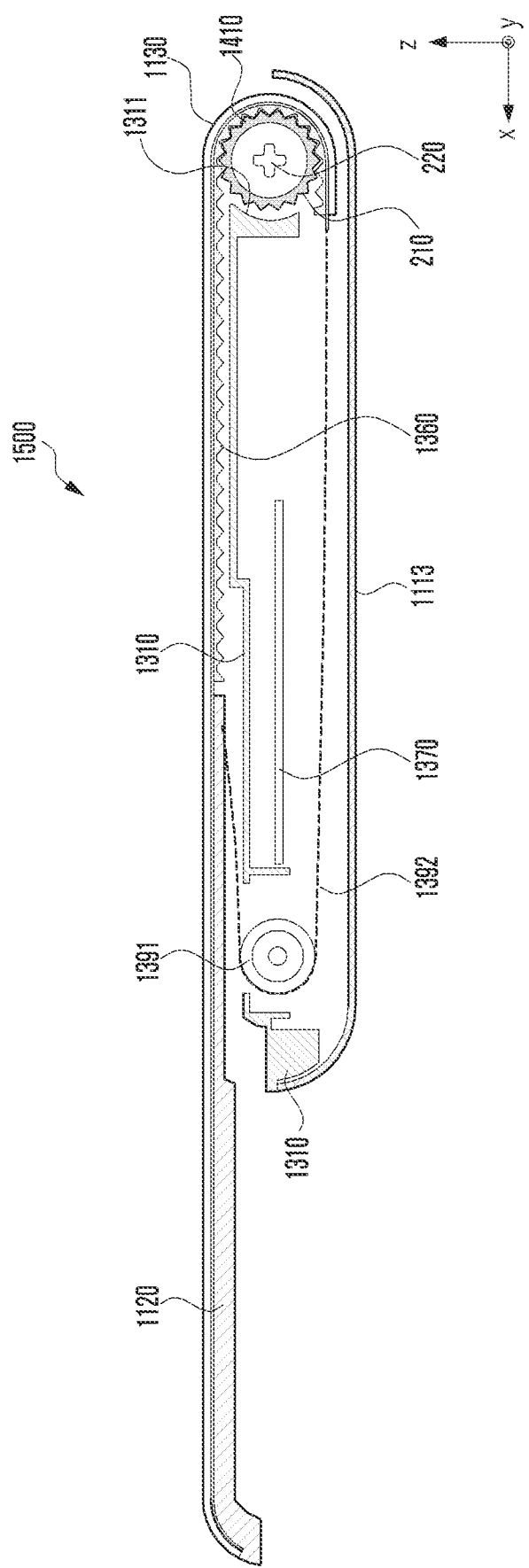
FIG. 15 illustrates a cross-sectional structure of a part of an electronic device taken along line C-C' or line D-D' in FIG. 12 according to an embodiment of the disclosure.

FIG. 15 illustrates a cross-sectional structure of a part of an electronic device taken along line C-C' or line D-D' in FIG. 12 according to an embodiment of the disclosure.

Figure 16A:
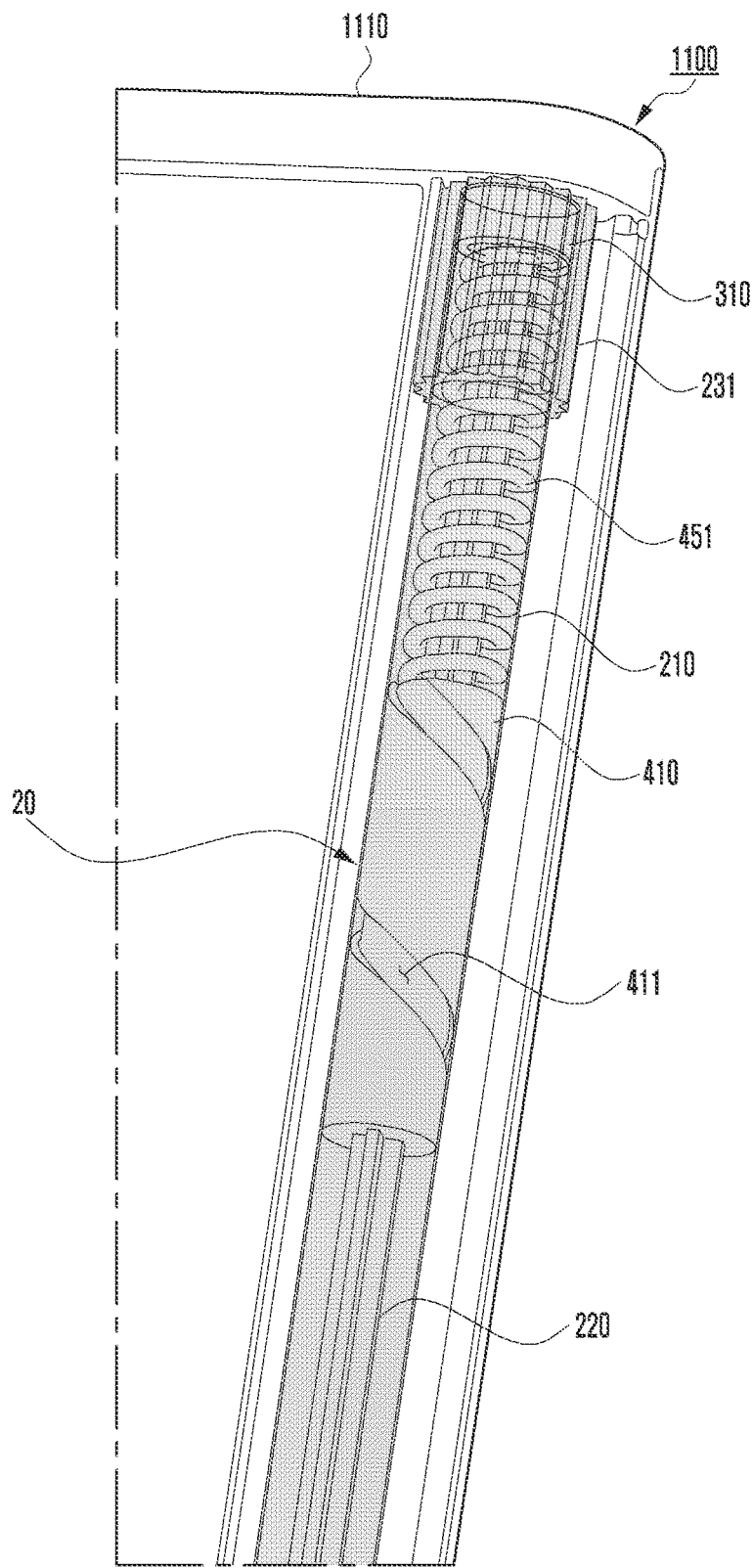
FIGS. 16A and 16B illustrate a first state of a rotation module when an electronic device is in the closed state according to various embodiments of the disclosure.
Figure 16B:
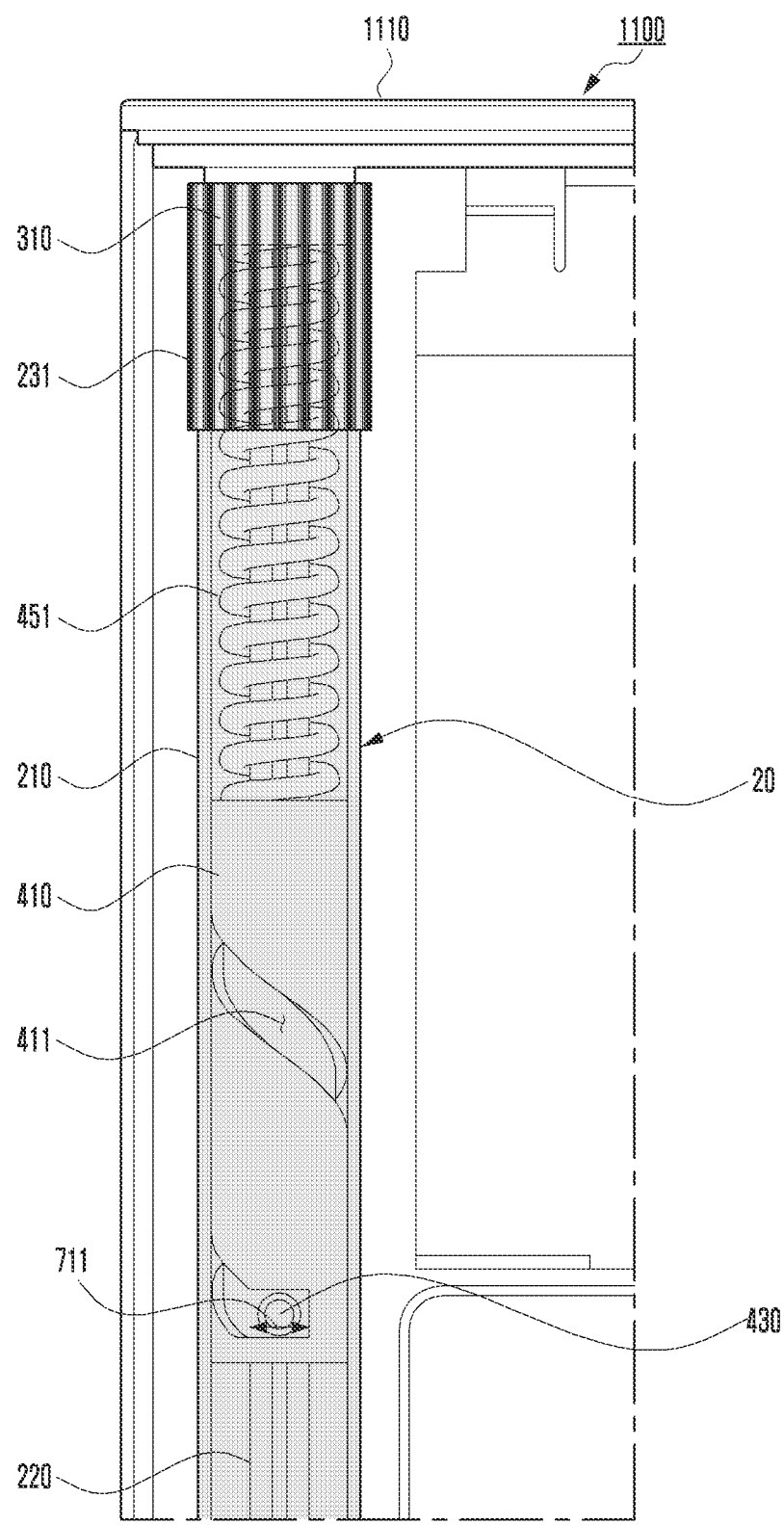

FIGS. 16A and 16B illustrate a first state of a rotation module when an electronic device is in a closed state according to various embodiments of the disclosure. For example, FIG. 16A illustrates the first state of the rotation module 20 when viewed from above the screen S (e.g., in the −z axis direction) when the electronic device 1100 is in the closed state, and FIG. 16B illustrates the first state of the rotation module 20 when viewed from above the rear surface B (or the back cover 1113) (e.g., in the z-axis direction) when the electronic device 1100 is in the closed state.

Figure 17:
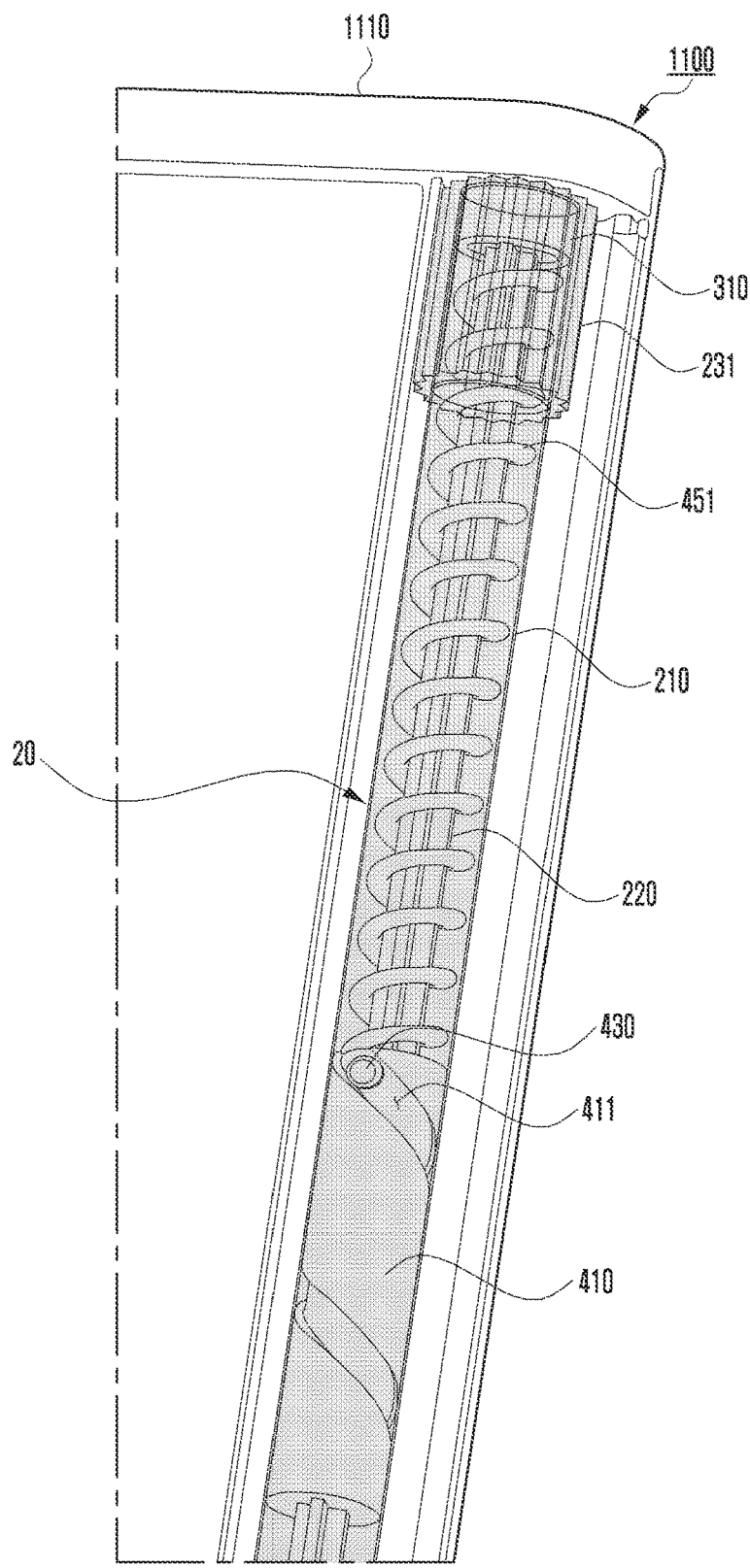
FIG. 17 illustrates a second state of a rotation module when an electronic device is in an open state according to an embodiment of the disclosure.

FIG. 17 illustrates a second state of a rotation module when an electronic device is in an open state according to an embodiment of the disclosure.

Referring to FIGS. 14 and 15, in an embodiment, an electronic device 1100 may include a first support member 1310, a sliding plate 1120, a flexible display 1130, a support sheet 1350, a multi-bar structure 1360, a back cover 1113, a cylindrical housing 210, a shaft 220, a pulley 1391, a belt 1392, or a printed circuit board 1370. The first support member 1310 may include a surface 1311 facing the cylindrical housing 210 of the rotation module 20, and the surface 1311 may include a curved surface corresponding to the cylindrical housing 210 and may be positioned to be spaced apart from the cylindrical housing 210. The cylindrical housing 210 may include a circular gear 1410. When the cross-sectional structure 1400 of FIG. 14 corresponds to that taken along line A-A' or the cross-sectional structure 1500 of FIG. 15 corresponds to that taken along line C-C', the circular gear 1410 may be the first circular gear 231 of FIG. 13. When the cross-sectional structure 1400 of FIG. 14 corresponds to that taken along line B-B' or the cross-sectional structure 1500 of FIG. 15 corresponds to that taken along line D-D', the circular gear 1410 may be the second circular gear 232 of FIG. 13.

According to an embodiment, the closed state of the electronic device 1100 illustrated in FIG. 14 may correspond to the first state of the rotation module 20 illustrated in FIG. 5, FIG. 16A, or FIG. 16B. The open state of the electronic device 1100 illustrated in FIG. 15 may correspond to the second state of the rotation module 20 illustrated in FIG. 6 or FIG. 17.

For example, the operation in which the electronic device 1100 is switched from the closed state to the open state will be described with reference to FIGS. 5, 6, 14, 15, 16A, 16B, and 17. When an external force is applied to the flexible display 1130 or the sliding plate 1120 coupled to the flexible display 1130, the cylindrical housing 210 may perform a rotational motion about the shaft 220, the first guide pin 430 may leave the first section 711 to enter the second section 712, and the second guide pin 440 may leave the first section 721 to enter the second section 722. Due to the first restoring force F1 by the first spring 451 and the second restoring force F2 by the second spring 452, the rotation module 20 may be switched from the first state to the second state, even without further external force. When the rotation module 20 is switched from the first state to the second state, the rotational motion of the cylindrical housing 210 is converted into the movement of the flexible display 1130 due to the engagement state between the gears, and the electronic device 1100 may be switched from the closed state to the open state.

For example, the operation in which the electronic device 1100 is switched from the closed state to the open state will be described with reference to FIGS. 5, 6, 14, 15, 16A, 16B, and 17. When an external force is applied to the flexible display 1130 or the sliding plate 1120 coupled to the flexible display 1130, due to the engagement state between the gear structure (e.g., the multi-bar structure 1360 in FIG. 13) coupled to the flexible display 1130 and the gears (e.g., the first circular gear 231 and the second circular gear 232 in FIG. 4 of the rotation module 20), the movement of the flexible display 1130 may be converted into the rotational motion of the cylindrical housing 210, and the electronic device 1100 may be switched from the open state to the closed state. In the closed state of the electronic device 1100, the first guide pin 430 may be positioned in the first section 711 of the first guide groove 411, the second guide pin 440 may be positioned in the first section 721 of the second guide groove 421, and the first spring 451 and the second spring 452 may be in the compressed state.

Figure 18:
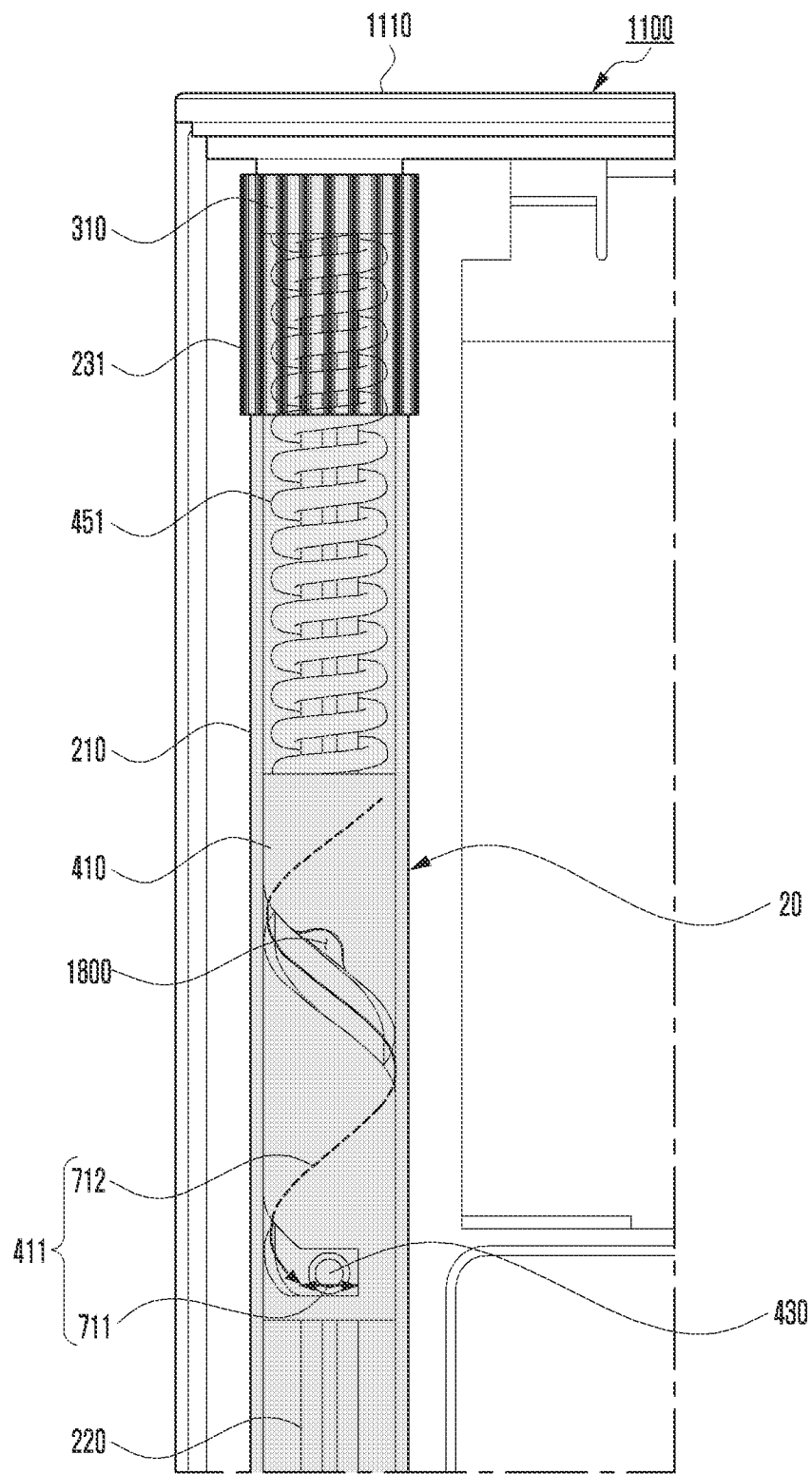
FIG. 18 illustrates a first state of the rotation module when an electronic device is in the closed state according to an embodiment of the disclosure.

FIG. 18 illustrates a first state of a rotation module when an electronic device is in a closed state according to an embodiment of the disclosure.

Figure 19A:
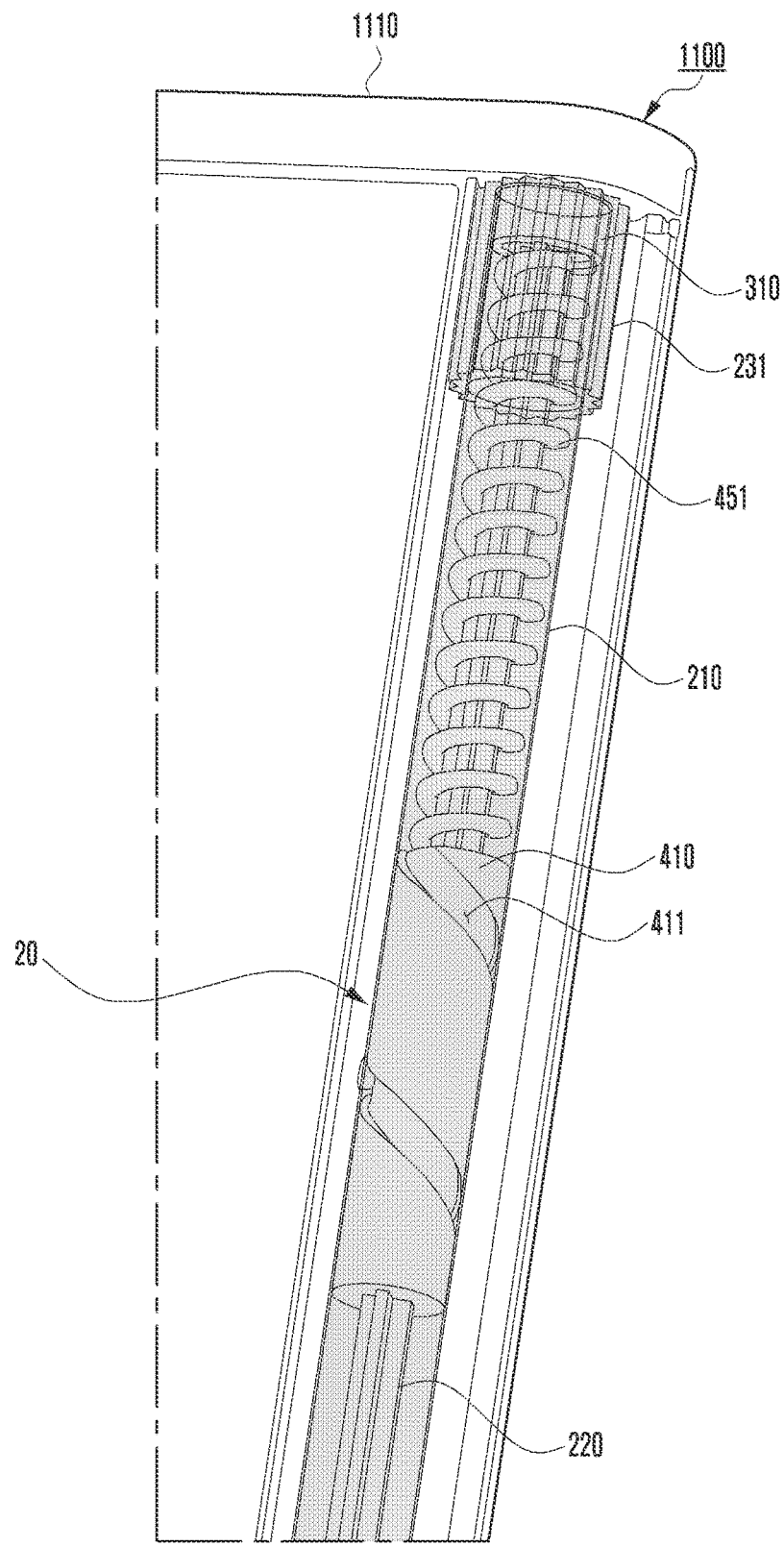
FIGS. 19A and 19B illustrate a third state of a rotation module when an electronic device is in an intermediate state according to various embodiments of the disclosure.
Figure 19B:
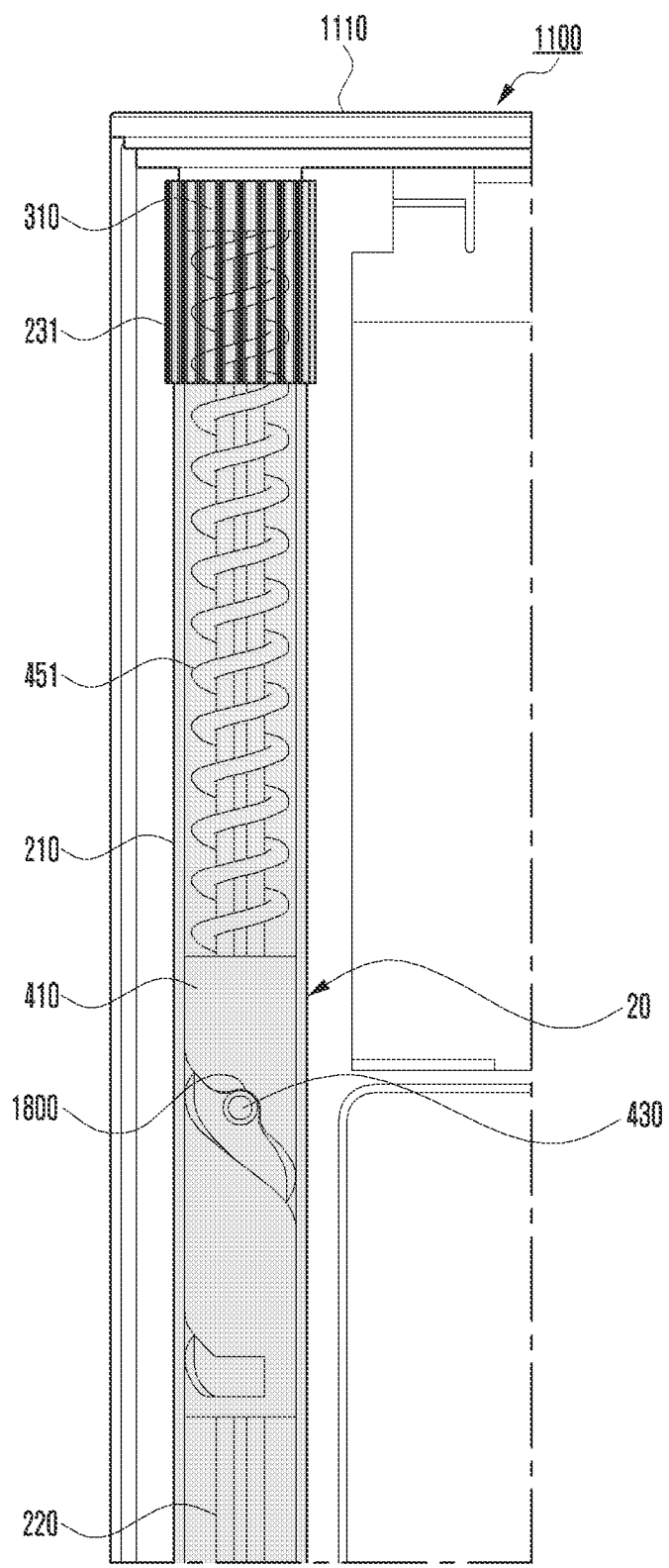

FIGS. 19A and 19B illustrate a third state of a rotation module when an electronic device is in an intermediate state according to various embodiments of the disclosure.

Referring to FIG. 18, for example, a first guide groove 411 provided in a first cylindrical cam 410 may include a first section 711 and a second section 712. According to an embodiment, the second section 712 may include a first recess 1800 (e.g., the first recess 1011 or 1012 in FIG. 10). The second guide groove 421 provided in the second cylindrical cam 420 of FIG. 13 may include a second recess (e.g., the second recess 1021 or 1022 in FIG. 10) provided in substantially the same manner as the first recess 1800 of FIG. 18. When the first guide pin 430 is positioned in the first recess 1800 of the first guide groove 411 and the second guide pin 440 (see FIG. 2) is positioned in the second recess of the second guide groove 421, the third state of the rotation module 20 and the intermediate state of the electronic device 1100 illustrated in FIG. 19A or 19B may be maintained. The third state of the rotation module 20 may indicate the state between the first state (see FIG. 5, FIG. 16A, or FIG. 16B) and the second state (see FIG. 6 or FIG. 17).

For example, the operation in which the electronic device 1100 is switched from the intermediate state of FIG. 19A or 19B to the open state of FIG. 17 will be described as follows. When an external force (e.g., an external force in the x-axis direction of FIG. 11) is applied to the flexible display 1130 or the sliding plate 1120 coupled to the flexible display 1130, the cylindrical housing 210 may perform a rotational motion about the shaft 220, the first guide pin 430 may leave the first recess 1800, and the second guide pin 440 may leave the second recess. Due to the first restoring force by the first spring 451 and the second restoring force by the second spring 452, the rotation module 20 may be switched from the third state to the second state, even without further external force. When the rotation module 20 is switched from the third state to the second state, due to the engagement state between the gear structure (e.g., the multi-bar structure 1360 in FIG. 13) coupled to the flexible display 1130 and gears (e.g., the circular gears of rotation module 20 (e.g., the first circular gear 231 and the second circular gear 232 in FIG. 4)), the rotational motion of the cylindrical housing 210 may be converted into the movement of the flexible display 1130, and the electronic device 1100 may be switched from the intermediate state to the open state.

For example, the operation in which the electronic device 1100 is switched from the intermediate state of FIG. 19A or FIG. 19B to the closed state of FIG. 18 will be described as follows. When an external force (e.g., an external force in the −x-axis direction in FIG. 11) is applied to the flexible display 1130 or the sliding plate 1120 coupled to the flexible display 1130, due to the engagement state between the gear structure (e.g., the multi-bar structure 1360 in FIG. 13) coupled to the flexible display 1130 and the gears (e.g., the first circular gear 231 and the second circular gear 232 in FIG. 4 of the rotation module 20), the movement of the flexible display 1130 may be converted into the rotational motion of the cylindrical housing 210, and the electronic device 1100 may be switched from the intermediate state to the closed state. In the closed state of the electronic device 1100, the first guide pin 430 may be positioned in the first section 711 of the first guide groove 411, the second guide pin 440 may be positioned in the first section 721 of the second guide groove 421, and the first state of the rotation module 20 may be maintained.

Figure 20:
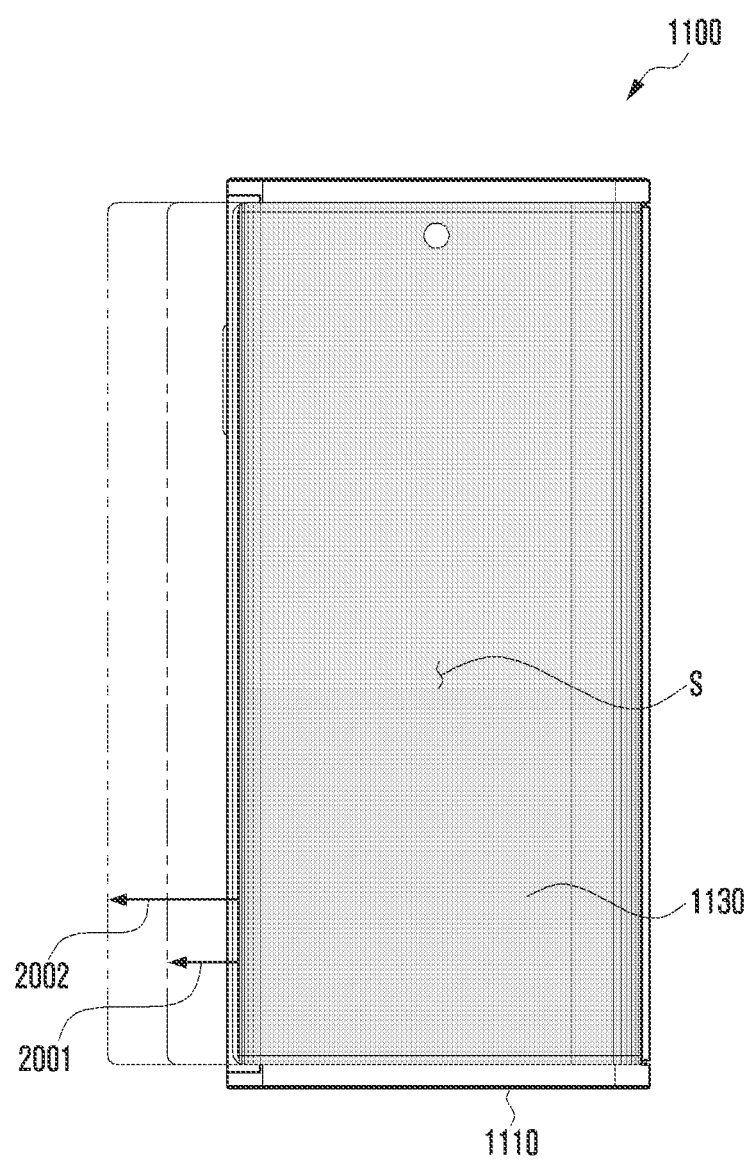
FIG. 20 is a plan view of an electronic device according to an embodiment of the disclosure.

FIG. 20 is a plan view of an electronic device according to an embodiment of the disclosure.

Referring to FIG. 20, as in an embodiment of FIG. 10, a second section 712 of a first guide groove 411 may include a plurality of first recesses 1011 and 1012, and a second section 722 of a second guide groove 421 may include a plurality of second recesses 1021 and 1022. When the first guide pin 430 is positioned in one of the plurality of first recesses 1011 and 1012 and the second guide pin 440 is positioned in one of the plurality of second recesses 1021 and 1022, the rotation module 20 may be in a third state. Depending on which one of the plurality of first recesses 1011 and 1012 the first guide pin 430 is positioned in and which one of the plurality of second recesses 1021 and 1022 the first guide pin 430 is positioned in, the third state and the intermediate state corresponding to the same may be various as indicated by reference numeral "2001" or reference numeral "2002" indicated in FIG. 20. For example, when the first guide pin 430 is positioned in the first recess 1011 and the second guide pin 440 is positioned in the second recess 1021, the screen S of the electronic device 1100 may be in the intermediate state in which the screen S is expanded by a length corresponding to that indicated by the length corresponding to that indicated by reference numeral "2001." As another example, when the first guide pin 430 is positioned in the first recess 1012 and the second guide pin 440 is positioned in the second recess 1022, the screen S of the electronic device 1100 may be in the intermediate state in which the screen S is expanded by a length corresponding to that indicated by the length corresponding to that indicated by reference numeral "2002." In the intermediate state of the electronic device 1100, the size of the screen S may vary based on recesses in which the first guide pin 430 and the second guide pin 440 are positioned.

FIGS. 21A, 21B, 22A, and 22B are perspective views of an electronic device according to various embodiments of the disclosure.

Figure 21A:
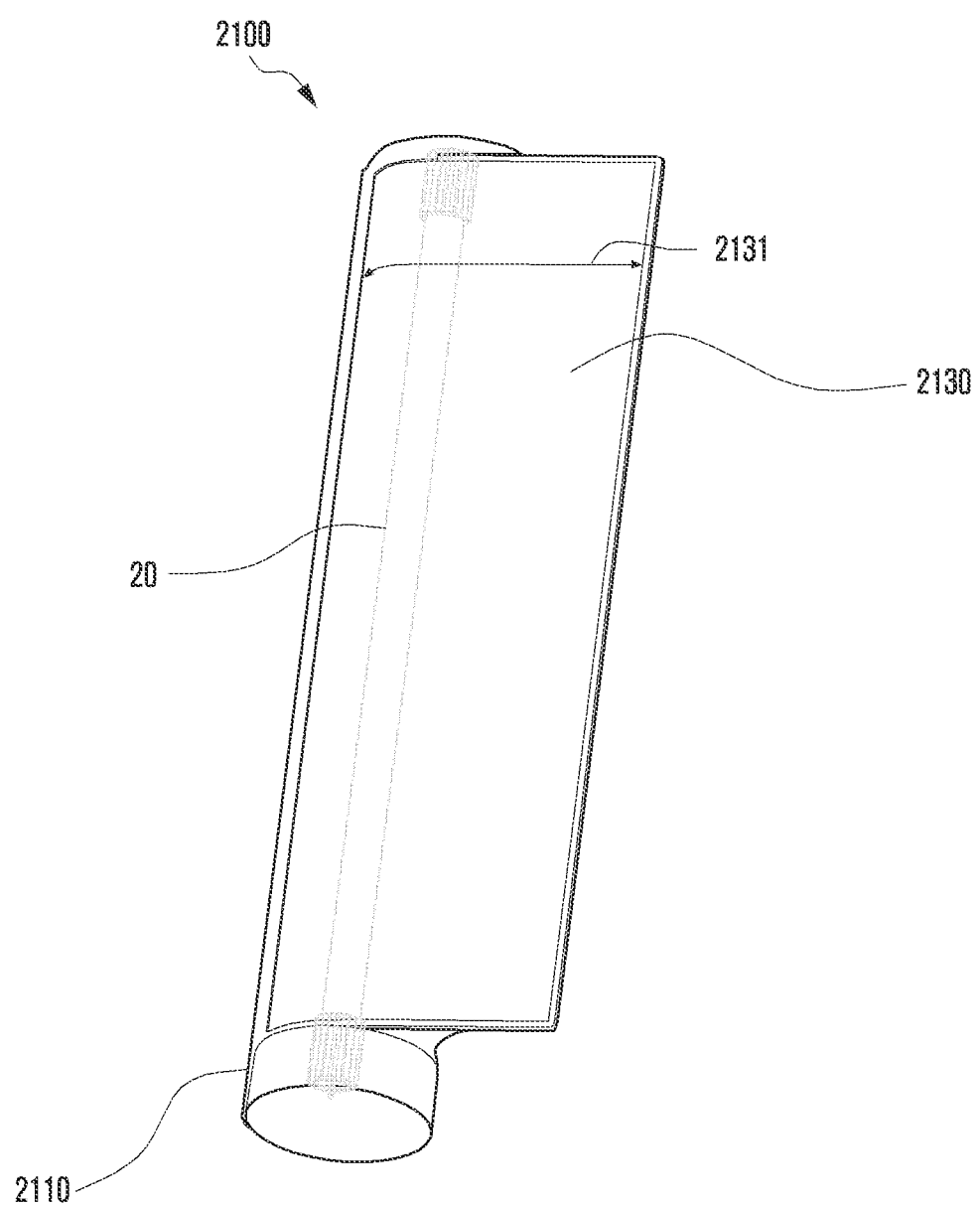
FIGS. 21A, 21B, 22A, and 22B are perspective views of an electronic device according to various embodiments of the disclosure.
Figure 21B:
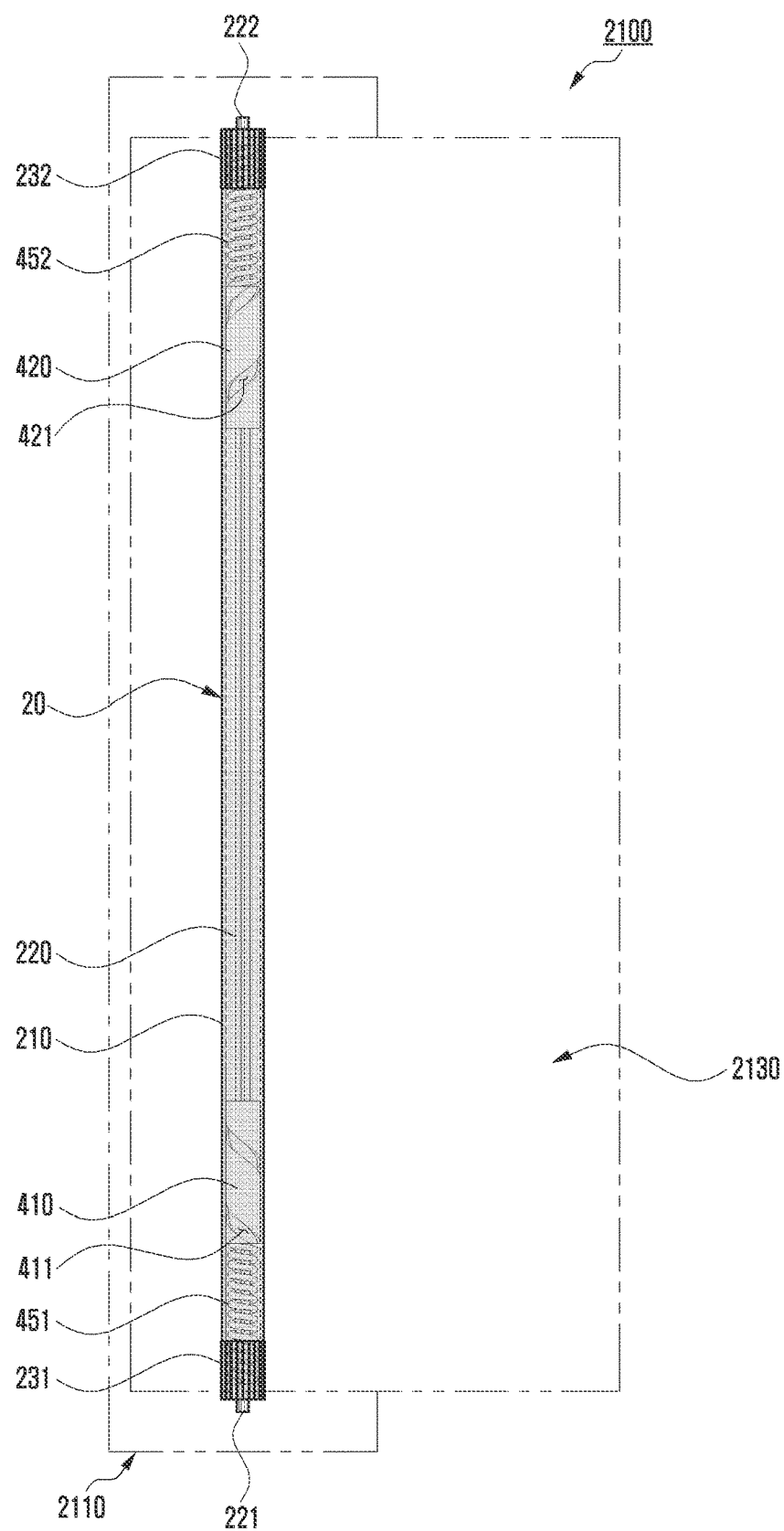
Figure 23:
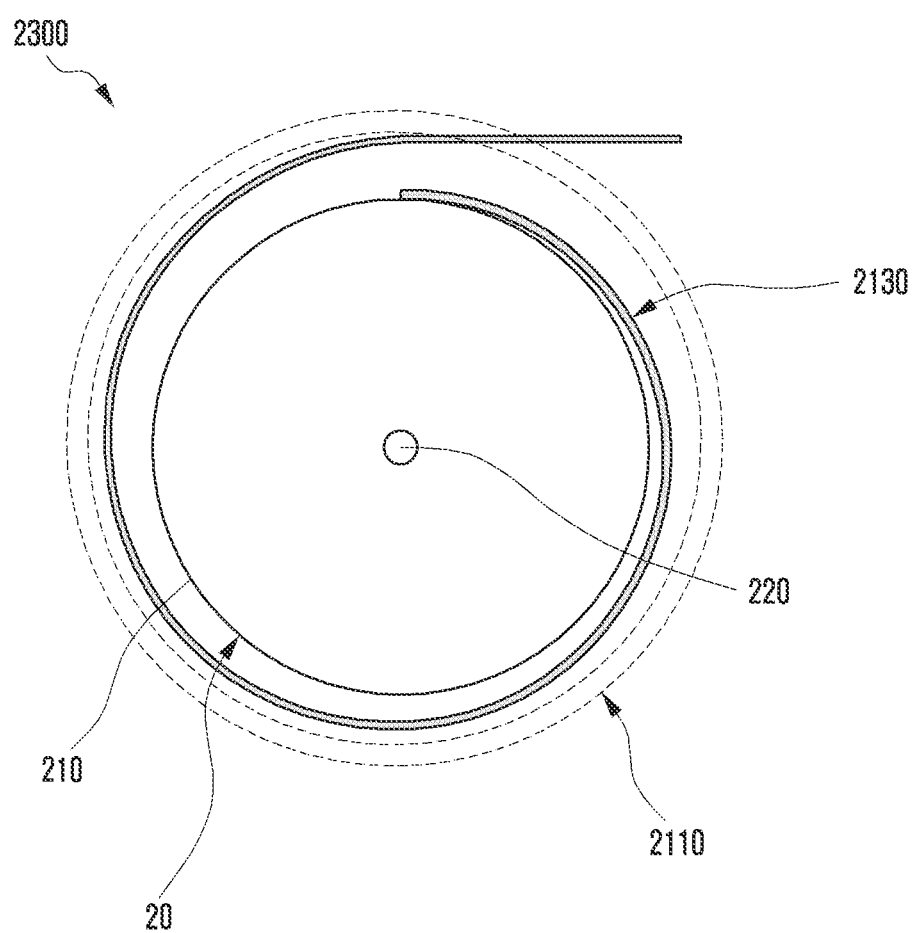
FIG. 23 illustrates a schematic cross-sectional structure of an electronic device in a screen-contracted state illustrated in FIG. 21A or FIG. 21B according to an embodiment of the disclosure.

FIG. 23 illustrates a schematic cross-sectional structure of an electronic device in a screen-contracted state illustrated in FIG. 21A or FIG. 21B according to an embodiment of the disclosure.

Figure 22A:
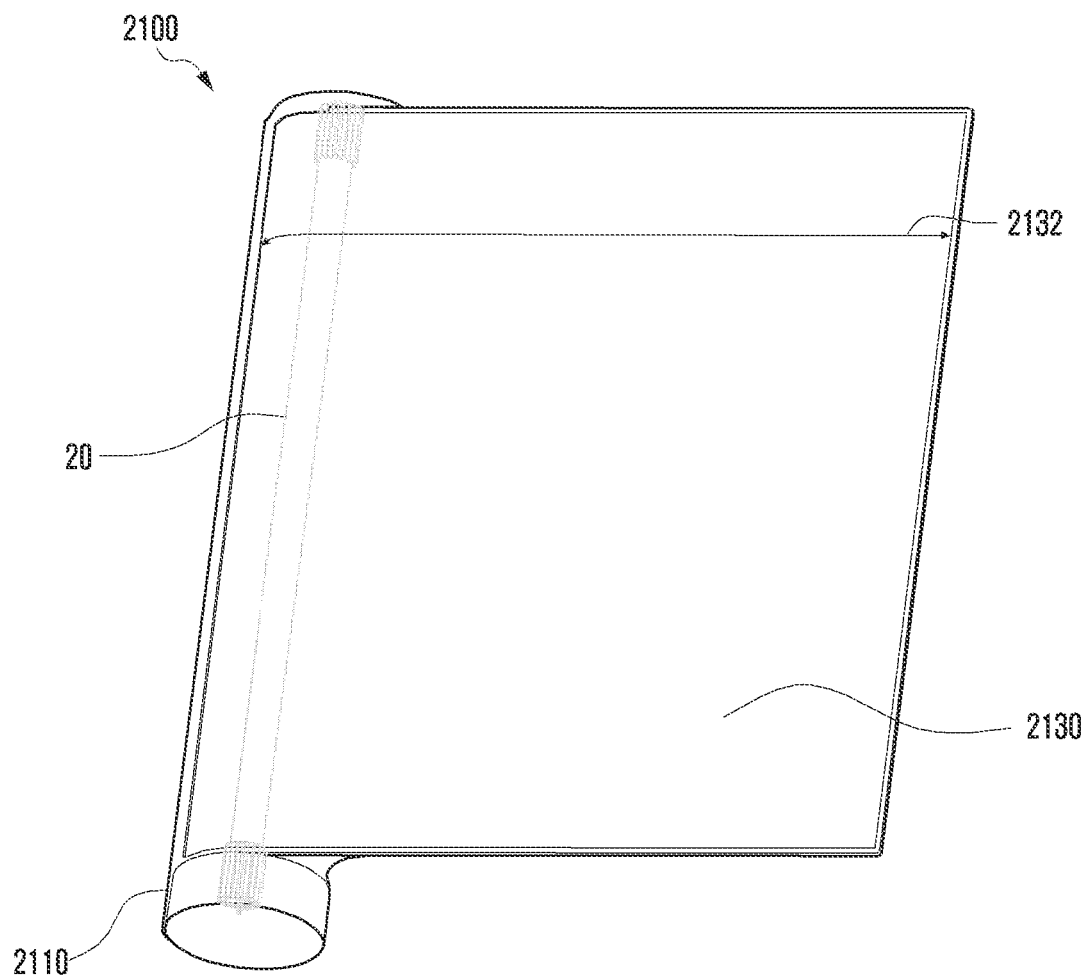
Figure 22B:
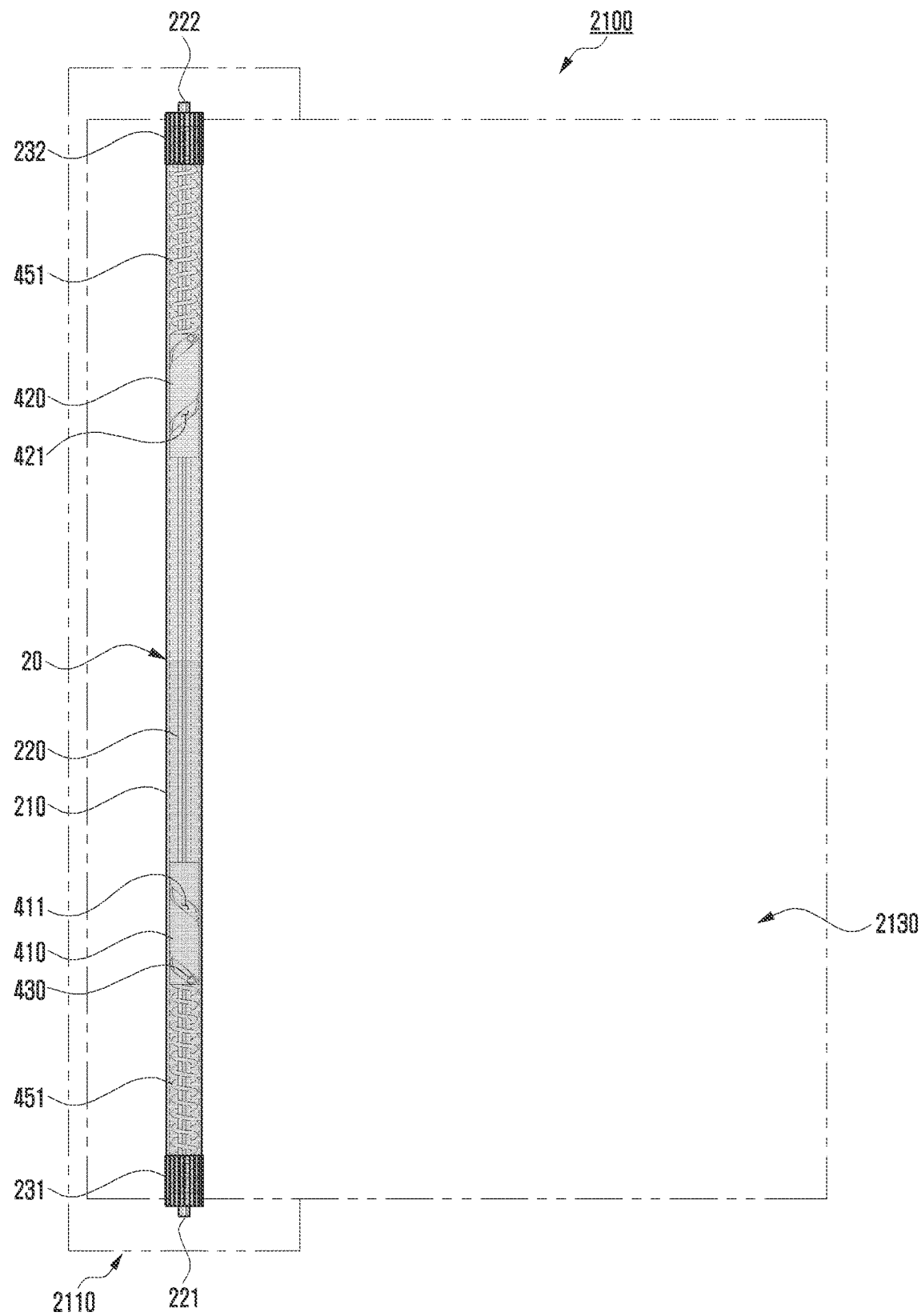
Figure 24:
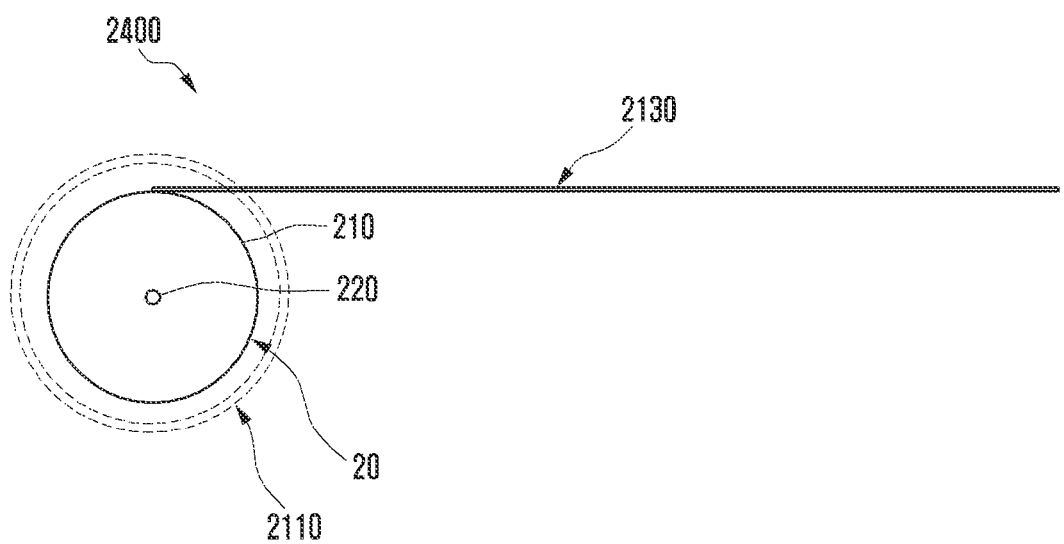
FIG. 24 illustrates a schematic cross-sectional structure of an electronic device in a screen expanded state illustrated in FIG. 22A or 22B according to an embodiment of the disclosure.

FIG. 24 illustrates a schematic cross-sectional structure of an electronic device in a screen-expanded state illustrated in FIG. 22A or FIG. 22B according to an embodiment of the disclosure.

Referring to FIGS. 21A, 21B, 22A, and 22B, in an embodiment, an electronic device 2100 may include a housing 2110, a flexible display 2130, and a rotation module 20. The screen-contracted state illustrated in FIG. 21A or FIG. 21B may be, for example, the state in which the flexible display 2130 is maximally drawn into the internal space of the housing 2110. The screen-expanded state illustrated in FIG. 22A or FIG. 22B may be, for example, the state in which the flexible display 2130 is maximally drawn out of the housing 2110. Although not illustrated, the electronic device 2100 may be in the intermediate state between the screen-contracted state of FIG. 21A or FIG. 21B and the screen-expanded state of FIG. 22A or FIG. 22B. The screen in the intermediate state (not illustrated) may have a size larger than that of the screen 2131 in the contracted state and smaller than that of the screen 2132 in the expanded state. In the screen-contracted state or the intermediate state, the flexible display 2130 may be disposed on the rotation module 20 in a bent state or a rolled state in the internal space of the electronic device 2100. In an embodiment, the flexible display 2130 may be referred to as a rollable display. Some embodiments may be construed that the rotation module 20 includes that flexible display 2130. The rotation module 20 may include a cylindrical housing 210, a shaft 220, a first cylindrical cam 410 including a first guide groove 411, a second cylindrical cam 420 including a second guide groove 421, a first guide pin 430, a second guide pin 440, a first spring 451, a second spring 452, a first bearing 310 (see FIG. 4), a second bearing 320 (see FIG. 4), a first circular gear 231, and/or a second circular gear 232.

Referring to FIGS. 4, 21A, 21B, 22A, and 22B, in an embodiment, one end 221 and another end 222 of a shaft 220 included in a rotation module 20 may be coupled to a support structure (e.g., a support structure 500 in FIG. 5) inside a housing 2110 or an electronic device 2100. The cylindrical housing 210 of the rotation module 20 may be drivingly connected to the flexible display 2130.

For example, the electronic device 2100 may include a support sheet (e.g., the support sheet 1350 in FIG. 13) disposed on or coupled to the rear surface of the flexible display 2130. According to various embodiments, the display assembly including the flexible display 2130 and the support sheet may include the cross-sectional structure 1305 illustrated in FIG. 13. The driving connection state between the flexible display 2130 and the rotation module 20 may refer to the state in which the support sheet and the cylindrical housing 210 of the rotation module 20 are substantially connected to each other. The support sheet may contribute to the durability of the flexible display 2130. The support sheet may reduce the influence of a load or stress that may occur during switching between the screen-contracted state and the screen-expanded state, on the flexible display 2130.

According to various embodiments, a gear structure (e.g., the multi-bar structure 1360 in FIG. 13) coupled to the flexible display 2130 may be included. The gear structure may be in the state of being engaged with circular gears (e.g., the first circular gear 231 and the second circular gear 232 in FIG. 2) of the rotation module 20. Due to the engagement state between the gear structure and the circular gears, a driving connection state in which a motion or force can be transmitted while reducing loss may be provided between the flexible display 2130 and the rotation module 20.

For example, with reference to FIGS. 5, 6, 21A, 21B, 22A, and 22B, an operation in which the electronic device 2100 is switched from the screen-contracted state to the screen-expanded state will be described as follows. When an external force is applied to the flexible display 2130 or the support member (not illustrated) coupled to the flexible display 2130 to support the sliding with respect to the housing 2110, the cylindrical housing 210 may perform a rotational motion about the shaft 220, the first guide pin 430 may leave the first section 711 to enter the second section 712, and the second guide pin 440 may leave the first section 721 to enter the second section 722. Due to the first restoring force F1 by the first spring 451 and the second restoring force F2 by the second spring 452, the rotation module 20 may be switched from the first state of FIG. 5 to the second state of FIG. 6, even without further external force. When the rotation module 20 is switched from the first state to the second state, due to the engagement state between the gear structure (e.g., the multi-bar structure 1360 in FIG. 13) coupled to the flexible display 2130 and gears (e.g., the circular gears of rotation module 20 (e.g., the first circular gear 231 and the second circular gear 232 in FIG. 4)), the rotational motion of the cylindrical housing 210 may be converted into the movement of the flexible display 2130, and the electronic device 2100 may be switched from the screen-contracted state to the screen-expanded state.

For example, with reference to FIGS. 5, 6, 21A, 21B, 22A, and 22B, an operation in which the electronic device 2100 is switched from the screen-expanded state to the screen-contracted state will be described as follows. When an external force is applied to the flexible display 2130 or the support member (not illustrated) coupled to the flexible display 2130 to support sliding with respect to the housing 2110, due to the engagement state between the gear structure (e.g., the multi-bar structure 1360 in FIG. 13) coupled to the flexible display 2130 and the gears (e.g., the first circular gear 231 and the second circular gear 232 in FIG. 4 of the rotation module 20), the movement of the flexible display 2130 may be converted into the rotational motion of the cylindrical housing 210, and the electronic device 2100 may be switched from the screen-expanded state to the screen-contracted state. When the electronic device 2100 is switched from the screen-expanded state to the screen-contracted state, at least a portion of the flexible display 2130 may be drawn into the internal space of the housing 2110 while being rolled around the cylindrical housing 210 that performs a rotational motion. When at least a portion of the flexible display 2130 is drawn into the internal space of the housing 2110 in the state of being rolled around the cylindrical housing 210, the rotation module 20 may be in the first state of FIG. 5. In the screen-contracted state of the electronic device 2100, the first guide pin 430 may be positioned in the first section 711 of the first guide groove 411, the second guide pin 440 may be positioned in the first section 721 of the second guide groove 421, and the compressed state of the first spring 451 and the compressed state of the second spring 452 may be maintained. According to some embodiments, the flexible display 2130 may be implemented not to be exposed to the outside in the screen-contracted state of the electronic device 2100 and the first state of the rotation module 20.

According to another embodiment, the rotation module 20 may be implemented such that the rotation module 20 in the second state of FIG. 6 when the electronic device 2100 is in the screen-contracted state of illustrated in FIGS. 21A, 21B, and 23 (depicting a schematic cross-sectional structure 2300), and that the rotation module 20 is in the first state of FIG. 5 when the electronic device 2100 is in the screen-expanded state illustrated in FIGS. 22A, 22B, and 24 (depicting a schematic cross-sectional structure 2400). For example, referring to FIGS. 5, 6, 21A, 21B, 22A, 22B, 23, and 24, due to the first restoring force of the first spring 451 to restore to the non-compressed state and the second restoring force of the second spring 452 to restore to the non-compressed state, the rotation module 20 may be switched from the first state to the second state. When the rotation module 20 is switched from the first state to the second state, the cylindrical housing 210 may perform a rotational motion about the shaft 220. Due to the rotational motion of the cylindrical housing 210, at least a portion of the flexible display 2130 may be drawn into the internal space of the housing 2110 while being rolled around the cylindrical housing 210, which performs the rotational motion. As a result, the electronic device 2100 may be switched from the screen-expanded state to the screen-contracted state.

According to some embodiments, the cylindrical housing 210 of the rotation module 20 may be drivingly connected to the flexible display 2130 without the first circular gear 231 and the second circular gear 232 of FIG. 13. For example, the flexible display 2130 or the support sheet (e.g., the support sheet 1350 in FIG. 13) may be coupled to the cylindrical housing 210. In this case, the multi-bar structure 1360 of FIG. 13 may be omitted.

According to an embodiment of the disclosure, an electronic device (e.g., the electronic device 1100 in FIG. 11 or the electronic device 2100 in FIG. 21A) may include a housing (e.g., the housing 1110 in FIG. 11 or the housing 2110 in FIG. 21A). The electronic device may include a flexible display (e.g., the flexible display 1130 in FIG. 11 or the flexible display 2130 in FIG. 21A) that is capable of being at least partially drawn out of the internal space of the housing. The electronic device may include a rotation module (e.g., the rotation module 20 in FIG. 2) for moving the flexible display. The rotation module may include a shaft (e.g., the shaft 220 in FIG. 3) including one end (e.g., the one end 221 in FIG. 3) and the other end (e.g., the other end 222 in FIG. 3) coupled to support members (e.g., the support structures 500 in FIG. 5) included in the electronic device. The rotation module may include a cylindrical housing (e.g., the cylindrical housing 210 in FIG. 2) drivingly connected to the flexible display. The cylindrical housing may be capable of performing a rotational motion about the shaft. The rotation module may include a pair of cylindrical cams (e.g., the first cylindrical cam 410 and the second cylindrical cam 420 in FIG. 2) positioned to be symmetrical to each other with respect to the center of the shaft. The pair of cylindrical cams may be penetrated by the shaft and accommodated in the cylindrical housing, and may be capable of performing a linear motion on the shaft. The rotation module may include a pair of guide pins (e.g., the first guide pin 430 or the second guide pin 440 in FIG. 2). The pair of respective guide pins may be positioned to correspond to a pair of respective guide grooves (e.g., the first guide groove 411 or the second guide groove 421 in FIG. 2), which are provided in respective cylindrical surfaces of the pair of cylindrical cams and are symmetrical to each other with respect to the center of the shaft. The rotation module may include a pair of springs (e.g., the first spring 451 or the second spring 452 in FIG. 2) symmetrical to each other with respect to the center of the shaft. The pair of respective springs may be accommodated in the cylindrical housing, and may elastically support the pair of respective cylindrical cams.

According to an embodiment of the disclosure, due to interaction between the pair of guide pins (e.g., the first guide pin 430 or the second guide pin 440 in FIG. 2) and the pair of guide grooves (e.g., the first guide groove 411 or the second guide groove 421 in FIG. 2), there may be a conversion between the rotational motion of the cylindrical housing (e.g., the cylindrical housing 210 in FIG. 2) and the linear motion of the pair of cylindrical cams (e.g., the first cylindrical cam 410 or the second cylindrical cam 420 in FIG. 2).

According to an embodiment of the disclosure, the rotation module (e.g., rotation module 20 in FIG. 2) may further include a pair of bearings (e.g., the first bearing 310 or the second bearing 320 of FIG. 2) positioned between the cylindrical housing (e.g., cylindrical housing 210 in FIG. 2) and the shaft (e.g., shaft 220 in FIG. 2). The pair of respective springs (e.g., the first spring 451 or the second spring 452 in FIG. 2) may be positioned between the pair of respective cylindrical cams (e.g., the first cylindrical cam 410 or the second cylindrical cam 420 in FIG. 2) and the pair of respective bearings.

According to an embodiment of the disclosure, the pair of respective guide pins (e.g., the first guide pin 430 or the second guide pin 440 of FIG. 2) may be coupled to a pair of respective holes (e.g., the first fastening hole 216 or the second fastening hole 217 of FIG. 3) provided in the cylindrical housing (e.g., the cylindrical housing 210 in FIG. 2) in a bolted manner.

According to an embodiment of the disclosure, each of the pair of guide grooves (e.g., the first guide groove 411 or the second guide groove 421 in FIG. 5) may include a first section (e.g., the first section 711 or 721) extending in a circumferential direction along each of the cylindrical surfaces of the pair of cylindrical cams and a second section (e.g., the second section 712 or 722 in FIG. 5) extending helically along each of the cylindrical surface from the first section.

According to an embodiment of the disclosure, the second sections (e.g., the second section 712 or 722 in FIG. 5) may have a substantially linear shape when each of the pair of guide grooves is spread out and illustrated in a plane (see FIG. 7).

According to an embodiment of the disclosure, the second sections (e.g., the second section 712 or 722 in FIG. 5) may include a curved shape having a slope that gradually increases or gradually decreases when each of the pair of guide groove is spread out and illustrated in a plane (see FIG. 8 or FIG. 9).

According to an embodiment of the disclosure, the second sections (e.g., the second section 712 or 722 in FIG. 5) may include one or more recesses (e.g., the plurality of first recesses 1011 and 1012 or the plurality of second recesses 1021 or 1022 in FIG. 10) in forms of being recessed toward the pair of respective springs from the pair of respective cylindrical cams.

According to an embodiment of the disclosure, the rotation module (e.g., the rotation module 20 in FIG. 2) may further include at least one circular gear (e.g., the first circular gear 231 or the second circular gear 232 of FIG. 3) provided on the cylindrical outer surface (e.g., the cylindrical outer surface 215 in FIG. 3) of the cylindrical housing (e.g., the cylindrical housing 210 in FIG. 2). The circular gear may be engaged with a gear structure proposed on the rear surface of the flexible display (e.g., the flexible display 1130 in FIG. 13). According to an embodiment, the gear structure may include a multi-bar structure (e.g., the multi-bar structure 1360 in FIG. 13).

According to an embodiment of the disclosure, at least a portion of the flexible display (e.g., the flexible display 2130 in FIG. 21A) may be disposed in a state of being rolled around the cylindrical housing (e.g., the cylindrical housing 210) when positioned in the internal space of the electronic device (e.g., the electronic device 2100 in FIG. 21A).

According to an embodiment of the disclosure, the electronic device (e.g., the electronic device 1100 in FIG. 13) may further include a sliding plate (e.g., the sliding plate 1120 in FIG. 13) that is capable of sliding out with respect to the housing (e.g., the housing 1110 in FIG. 11). The flexible display (e.g., the flexible display 1130 in FIG. 11, FIG. 12, or FIG. 13) may include a first area (e.g., the first area ① in FIG. 11, FIG. 12, or FIG. 13) disposed to at least partially overlap the sliding plate. The flexible display may include a second area (e.g., the second area ② in FIG. 11, FIG. 12, or FIG. 13) extending from the first area. The second area may be drivingly connected to the cylindrical housing.

According to an embodiment of the disclosure, the electronic device (e.g., the electronic device 1100 in FIG. 13) may further include a tensioning device (e.g., the tensioning device 1390 in FIG. 13). The tensioning device may be connected to the second area (e.g., the second area ② in FIG. 13) and may apply a tension to the flexible display.

According to an embodiment of the disclosure, the tensioning device (e.g., tensioning device 1390 in FIG. 13) may further include a curved member (e.g., the pulley 1391 in FIG. 13) positioned in the internal space of the housing (e.g., the housing 1110 in FIG. 11) to be spaced apart from the shaft (e.g., shaft 220 in FIG. 14 or 15). The tensioning device may include a belt (e.g., the belt 1392 in FIG. 13). The belt is may be positioned in the internal space of the housing to correspond to the curved member, wherein one end of the belt may be connected to the sliding plate (e.g., the sliding plate 1120 in FIG. 14 or FIG. 15) and the other end may be connected to the flexible display (e.g., the flexible display 1130 in FIG. 14 or FIG. 15).

According to an embodiment of the disclosure, the rotation module (e.g., the rotation module 20 in FIG. 2) may include a shaft (e.g., the shaft 220 in FIG. 2), a cylindrical housing (e.g., the cylindrical housing 210 in FIG. 2) configured to be capable of performing a rotational motion about the shaft, a cylindrical cam (e.g., the first cylindrical cam 410 or the second cylindrical cam 420 in FIG. 2) penetrated by the shaft, accommodated in the cylindrical housing, and configured to be capable of performing a linear motion on the shaft, a guide pin (e.g., the first guide pin 430 or the second guide pin 440 in FIG. 2) configured to be coupled to the cylindrical housing and configured to correspond to a guide groove (e.g., the first guide groove 411 or the second guide groove 421 in FIG. 2) provided in the cylindrical surface of the cylindrical cam, and a spring (e.g., the first spring 451 or the second spring 452 in FIG. 2) accommodated in the cylindrical housing and configured to elastically support the cylindrical cam. Due to the interaction between the guide pin and the guide groove, there may be a conversion between the rotational motion of the cylindrical housing and the linear motion of the cylindrical cam.

According to an embodiment of the disclosure, a bearing (e.g., the first bearing 310 or the second bearing 320 in FIG. 2) positioned between the cylindrical housing and the shaft may be further included, wherein the spring may be positioned between the cylindrical cam and the bearing.

According to an embodiment of the disclosure, the guide pin may be coupled to a hole (e.g., the first fastening hole 216 or the second fastening hole 217 of FIG. 3) provided in the cylindrical housing in a bolted manner.

According to an embodiment of the disclosure, the guide groove may include a first section (e.g., the first section 711 or 721 in FIG. 5) extending in the circumferential direction along the cylindrical surface of the cylindrical cam and a second section (e.g., the second section 712 or 722 in FIG. 5) extending spirally along the cylindrical surface from the first section.

According to an embodiment of the disclosure, the second section may include a curved shape having a slope that gradually increases or gradually decreases when the guide groove is spread out and illustrated in a plane.

According to an embodiment of the disclosure, the second section may include at least one recess (e.g., the plurality of first recesses 1011 and 1012 or the plurality of second recesses 1021 and 1022 in FIG. 10) recessed from the cylindrical cam toward the spring.

While the disclosure has been shown and described with reference to various embodiments thereof, it will be understood by those skilled in the art that various changes in form and details may be made therein without departing from the spirit and scope of the disclosure as defined by the appended claims and their equivalents.

The invention claimed is:

1. An electronic device comprising:
a housing;
a flexible display configured to be at least partially drawn out of an internal space of the housing; and
a rotation module configured to move the flexible display, wherein the rotation module comprises:
  a shaft comprising one end and another end each coupled to a support member included in the electronic device,
  a cylindrical housing drivingly connected to the flexible display and configured to be capable of performing a rotational motion about the shaft,
  a pair of cylindrical cams penetrated by the shaft and accommodated in the cylindrical housing, wherein the pair of cylindrical cams are configured to be capable of performing a linear motion on the shaft and positioned to be symmetrical to each other with respect to a center of the shaft,
  a pair of guide pins coupled to the cylindrical housing and configured to correspond to a pair of guide grooves, respectively, which are provided in cylindrical surfaces of the pair of cylindrical cams, respectively, wherein the pair of guide grooves are symmetrical to each other with respect to the center of the shaft, and
  a pair of springs accommodated in the cylindrical housing and configured to elastically support the pair of cylindrical cams, respectively, wherein the pair of springs are symmetrical to each other with respect to the center of the shaft.

2. The electronic device of claim 1, wherein, due to interaction between the pair of guide pins and the pair of guide grooves, there is a conversion between the rotational motion of the cylindrical housing and the linear motion of the pair of cylindrical cams.

3. The electronic device of claim 1,
wherein the rotation module further comprises a pair of bearings positioned between the cylindrical housing and the shaft, and
wherein the pair of respective springs are positioned between the pair of respective cylindrical cams and the pair of respective bearings.

4. The electronic device of claim 1, wherein the pair of guide pins are coupled to a pair of respective holes, which are provided in the cylindrical housing, in a bolted manner.

5. The electronic device of claim 1, wherein each of the pair of guide grooves comprises:
  a first section extending in a circumferential direction along the cylindrical surface of each of the pair of cylindrical cams; and
  a second section extending helically along the cylindrical surface from the first section.

6. The electronic device of claim 5, wherein the second section has a substantially linear shape when each of the pair of guide grooves is spread out and illustrated in a plane.

7. The electronic device of claim 5, wherein the second section comprises a curved shape having a slope that gradually increases or gradually decreases when each of the pair of guide grooves is spread out and illustrated in a plane.

8. The electronic device of claim 5, wherein the second section comprises at least one recess that is recessed from each of the pair of cylindrical cams toward each of the pair of springs.

9. The electronic device of claim 1,
wherein the rotation module further comprises at least one circular gear provided on a cylindrical outer surface of the cylindrical housing, and
wherein the circular gear is engaged with a gear structure positioned on a rear surface of the flexible display.

10. The electronic device of claim 9, wherein the gear structure comprises a multi-bar structure.

11. The electronic device of claim 1, wherein at least a portion of the flexible display is disposed in a rolled state in the cylindrical housing when positioned in an internal space of the electronic device.

12. The electronic device of claim 1, further comprising a sliding plate configured to be capable of sliding out with respect to the housing,
wherein the flexible display comprises:
  a first area disposed to at least partially overlap the sliding plate, and
  a second area extending from the first area and drivingly connected to the cylindrical housing.

13. The electronic device of claim 12, further comprising a tensioning device connected to the second area and configured to apply a tension to the flexible display.

14. The electronic device of claim 13, wherein the tensioning device further comprises:
  a curved member positioned in the internal space of the housing to be spaced apart from the shaft; and
  a belt positioned in the internal space of the housing to correspond to the curved member, wherein one end of the belt is connected to the sliding plate and another end of the belt is connected to the flexible display.

15. A rotation module comprising:
a shaft;
cylindrical housing configured to be capable of performing a rotational motion about the shaft;
a cylindrical cam penetrated by the shaft and accommodated in the cylindrical housing, wherein the cylindrical cam is configured to be capable of performing a linear motion on the shaft;
a guide pin coupled to the cylindrical housing and configured to correspond to a guide groove provided in a cylindrical surface of the cylindrical cam; and
a spring accommodated in the cylindrical housing and configured to elastically support the cylindrical cam,
wherein due to interaction between the guide pin and the guide groove, there is a conversion between the rotational motion of the cylindrical housing and the linear motion of the cylindrical cam.

16. The rotation module of claim 15, further comprising a bearing positioned between the cylindrical housing and the shaft,
wherein the spring is positioned between the cylindrical cam and the bearing.

17. The rotation module of claim 15, wherein the guide pin is coupled to a hole provided in the cylindrical housing in a bolted manner.

18. The rotation module of claim 15, wherein the guide groove comprises:
  a first section extending in a circumferential direction along the cylindrical surface of the cylindrical cam; and
  a second section extending helically along the cylindrical surface from the first section.

19. The rotation module of claim 18, wherein the second section comprises a curved shape having a slope that gradually increases or gradually decreases when the guide groove is spread out and illustrated in a plane.

20. The rotation module of claim 18, wherein the second section comprises at least one recess in a form of a recess recessed from the cylindrical cam toward the spring.

21. The rotation module of claim 20, further comprising:
a flexible display drivingly connected to the cylindrical housing of the rotation module,
wherein the second section comprises a plurality of recesses, and
wherein each of the plurality of recesses corresponds to a different amount of extension of the flexible display moved by the rotation module.

22. The rotation module of claim 21, wherein the flexible display further comprises:
a support sheet disposed on or coupled to a rear surface of the flexible display.

23. The rotation module of claim 18, wherein the guide groove facilitates control of a rotational speed of the cylindrical housing by the rotation module.

\* \* \* \* \*